(12) United States Patent
Uberti et al.

(10) Patent No.: US 11,802,922 B2
(45) Date of Patent: Oct. 31, 2023

(54) CIRCUIT FOR REDUCING AN OFFSET COMPONENT OF A PLURALITY OF VERTICAL HALL ELEMENTS ARRANGED IN ONE OR MORE CIRCLES

(71) Applicant: Allegro MicroSystems, LLC, Manchester, NH (US)

(72) Inventors: Bruno Luis Uberti, Ciudad Autonoma de Buenos Aires (AR); Gerardo A. Monreal, Buenos Aires (AR); Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 416 days.

(21) Appl. No.: 17/147,819

(22) Filed: Jan. 13, 2021

(65) Prior Publication Data
US 2022/0221533 A1 Jul. 14, 2022

(51) Int. Cl.
*G01R 33/07* (2006.01)
*H10N 50/80* (2023.01)

(52) U.S. Cl.
CPC ............ *G01R 33/077* (2013.01); *H10N 50/80* (2023.02)

(58) Field of Classification Search
CPC ............................. G01R 33/077; H01N 50/80
See application file for complete search history.

(56) References Cited

U.S. PATENT DOCUMENTS

| | | |
|---|---|---|
| 4,668,914 A | 5/1987 | Kersten et al. |
| 4,761,569 A | 8/1988 | Higgs |
| 4,829,352 A | 5/1989 | Popovic et al. |
| 5,541,506 A | 7/1996 | Kawakita et al. |
| 5,572,058 A | 11/1996 | Biard |
| 5,604,433 A | 2/1997 | Theus et al. |
| 5,612,618 A | 3/1997 | Arakawa |
| 5,619,137 A | 4/1997 | Vig et al. |
| 5,621,319 A | 4/1997 | Bilotti et al. |
| 5,657,189 A | 8/1997 | Sandhu |
| 5,694,038 A | 12/1997 | Moody et al. |
| 5,831,513 A | 11/1998 | Lue |
| 5,844,411 A | 12/1998 | Vogt |
| 5,942,895 A | 8/1999 | Popovic et al. |
| 6,064,199 A | 5/2000 | Walter et al. |
| 6,064,202 A | 5/2000 | Steiner et al. |

(Continued)

FOREIGN PATENT DOCUMENTS

| | | |
|---|---|---|
| CN | 101995558 A | 3/2011 |
| CN | 102171588 A | 8/2011 |

(Continued)

OTHER PUBLICATIONS

Response to European Official Communication dated Jul. 25, 2022 for European Application No. 21212617.1; Response Filed Jan. 18, 2023; 106 Pages.

(Continued)

*Primary Examiner* — Reena Aurora
(74) *Attorney, Agent, or Firm* — DALY, CROWLEY, MOFFORD & DURKEE, LLP

(57) ABSTRACT

A magnetic field sensor can be are based upon three element vertical Hall element building blocks, e.g., three element or six element vertical Hall element arrangements, all arranged in a circle. In some embodiments, the circle of vertical Hall elements can be arranged as a CVH sensing element.

34 Claims, 27 Drawing Sheets

(56) References Cited

U.S. PATENT DOCUMENTS

| | | | |
|---|---|---|---|
| 6,073,043 A | 6/2000 | Schneider | |
| 6,091,239 A | 7/2000 | Vig et al. | |
| 6,100,680 A | 8/2000 | Vig et al. | |
| 6,166,535 A | 12/2000 | Irle et al. | |
| 6,232,768 B1 | 5/2001 | Moody et al. | |
| 6,236,199 B1 | 5/2001 | Irle et al. | |
| 6,265,864 B1 | 7/2001 | De Winter et al. | |
| 6,288,533 B1 | 9/2001 | Haeberli et al. | |
| 6,297,627 B1 | 10/2001 | Towne et al. | |
| 6,356,741 B1 | 3/2002 | Bilotti et al. | |
| 6,525,531 B2 | 2/2003 | Forrest et al. | |
| 6,542,068 B1 | 4/2003 | Drapp et al. | |
| 6,545,462 B2 | 4/2003 | Schott et al. | |
| 6,622,012 B2 | 9/2003 | Bilotti et al. | |
| 6,768,301 B1 | 7/2004 | Hohe et al. | |
| 6,969,988 B2 | 11/2005 | Kakuta et al. | |
| 7,030,606 B2 | 4/2006 | Kato et al. | |
| 7,038,448 B2 | 5/2006 | Schott et al. | |
| 7,053,674 B1 | 5/2006 | Romero et al. | |
| 7,085,119 B2 | 8/2006 | Bilotti et al. | |
| 7,119,538 B2 | 10/2006 | Blossfeld | |
| 7,159,556 B2 | 1/2007 | Yoshihara | |
| 7,235,968 B2 | 6/2007 | Popovic et al. | |
| 7,259,556 B2 | 8/2007 | Popovic et al. | |
| 7,307,824 B2 | 12/2007 | Bilotti et al. | |
| 7,362,094 B2 | 4/2008 | Voisine et al. | |
| 7,425,821 B2 | 9/2008 | Monreal et al. | |
| 7,518,414 B2 | 4/2009 | Romero et al. | |
| 7,605,647 B1 | 10/2009 | Romero et al. | |
| 7,714,570 B2 | 5/2010 | Thomas et al. | |
| 7,746,065 B2 | 6/2010 | Pastre et al. | |
| 7,759,929 B2 | 7/2010 | Forsyth | |
| 7,797,604 B2 | 9/2010 | Lee et al. | |
| 7,872,322 B2 | 1/2011 | Schott et al. | |
| 7,911,203 B2 | 3/2011 | Thomas et al. | |
| 7,965,076 B2 | 6/2011 | Schott | |
| 7,990,209 B2 | 8/2011 | Romero | |
| 7,994,774 B2 | 8/2011 | Thomas et al. | |
| 8,324,891 B2 | 12/2012 | Kejik et al. | |
| 8,416,014 B2 | 4/2013 | Romero | |
| 8,564,285 B2 | 10/2013 | Romero et al. | |
| 8,624,587 B2 | 1/2014 | Popovic et al. | |
| 8,749,005 B1 | 6/2014 | Foletto et al. | |
| 8,786,279 B2 | 7/2014 | Petrie | |
| 8,860,410 B2 | 10/2014 | Petrie | |
| 8,890,518 B2 | 11/2014 | Daubert | |
| 8,896,303 B2 | 11/2014 | Ausserlechner et al. | |
| 8,922,206 B2 | 12/2014 | Friedrich et al. | |
| 8,922,207 B2 | 12/2014 | Ausserlechner | |
| 8,937,797 B2 | 1/2015 | Pirchio et al. | |
| 8,963,540 B2 | 2/2015 | Reymond et al. | |
| 8,981,504 B2 | 3/2015 | Motz et al. | |
| 8,988,072 B2 | 3/2015 | Ausserlechner | |
| 9,007,060 B2 | 4/2015 | Ausserlechner | |
| 9,024,622 B2 | 5/2015 | Hohe et al. | |
| 9,046,383 B2 | 6/2015 | Friedrich et al. | |
| 9,062,990 B2 | 6/2015 | Petrie | |
| 9,099,638 B2 | 8/2015 | Wang et al. | |
| 9,182,250 B2 | 11/2015 | Petrie | |
| 9,182,456 B2 | 11/2015 | Shoemaker et al. | |
| 9,252,355 B2 | 2/2016 | Vanderhaegen et al. | |
| 9,274,183 B2 | 3/2016 | Ausserlechner | |
| 9,285,439 B2 | 3/2016 | Motz et al. | |
| 9,312,472 B2 | 4/2016 | Ausserlechner et al. | |
| 9,377,285 B2 | 6/2016 | Romero et al. | |
| 9,389,060 B2 | 7/2016 | Romero et al. | |
| 9,400,164 B2 | 7/2016 | Daubert et al. | |
| 9,411,023 B2 | 8/2016 | Friedrich et al. | |
| 9,423,471 B2 | 8/2016 | Ausserlechner et al. | |
| 9,425,386 B2 | 8/2016 | Ausserlechner | |
| 9,547,048 B2 | 1/2017 | Romero | |
| 9,735,345 B2* | 8/2017 | Kosier | G01R 33/077 |
| 9,739,847 B1 | 8/2017 | Alpago et al. | |
| 9,739,848 B1 | 8/2017 | Alpago et al. | |
| 9,753,097 B2 | 9/2017 | Romero | |
| 10,386,427 B1* | 8/2019 | Friedrich | G01R 33/077 |
| 2002/0114269 A1 | 8/2002 | Onggosanusi et al. | |
| 2005/0264348 A1 | 12/2005 | Bilotti et al. | |
| 2006/0011999 A1 | 1/2006 | Schott et al. | |
| 2006/0125531 A1 | 6/2006 | Romero et al. | |
| 2007/0105244 A1 | 5/2007 | Okita | |
| 2008/0094055 A1 | 4/2008 | Monreal et al. | |
| 2008/0100285 A1 | 5/2008 | Matsumoto et al. | |
| 2009/0001965 A1 | 1/2009 | Ausserlechner et al. | |
| 2009/0121707 A1 | 5/2009 | Schott | |
| 2009/0174395 A1 | 7/2009 | Thomas et al. | |
| 2010/0026282 A1 | 2/2010 | Kaita et al. | |
| 2010/0133632 A1 | 6/2010 | Schott | |
| 2010/0156397 A1 | 6/2010 | Yabusaki et al. | |
| 2010/0164491 A1 | 7/2010 | Kejik et al. | |
| 2010/0181993 A1 | 7/2010 | Fernandez et al. | |
| 2010/0321105 A1 | 12/2010 | Romero | |
| 2011/0018533 A1 | 1/2011 | Cesaretti et al. | |
| 2011/0101975 A1 | 5/2011 | Popovic et al. | |
| 2011/0221518 A1 | 9/2011 | Romero | |
| 2011/0248708 A1 | 10/2011 | Thomas et al. | |
| 2011/0298447 A1 | 12/2011 | Foletto et al. | |
| 2012/0016614 A1 | 1/2012 | Hohe et al. | |
| 2012/0025817 A1 | 2/2012 | Romero et al. | |
| 2012/0217955 A1 | 8/2012 | Petrie | |
| 2012/0218018 A1 | 8/2012 | Petrie | |
| 2012/0286776 A1 | 11/2012 | Ausserlechner et al. | |
| 2012/0299588 A1 | 11/2012 | Petrie | |
| 2012/0313635 A1 | 12/2012 | Daubert | |
| 2013/0015853 A1 | 1/2013 | Raz et al. | |
| 2013/0021026 A1 | 1/2013 | Ausserlechner | |
| 2013/0021027 A1 | 1/2013 | Ausserlechner | |
| 2013/0057257 A1 | 3/2013 | Friedrich et al. | |
| 2013/0179115 A1 | 7/2013 | Friedrich et al. | |
| 2013/0214774 A1 | 8/2013 | Cesaretti et al. | |
| 2013/0214775 A1 | 8/2013 | Ausserlechner et al. | |
| 2013/0238278 A1 | 9/2013 | Shoemaker et al. | |
| 2013/0242447 A1 | 9/2013 | Pirchio et al. | |
| 2013/0265037 A1 | 10/2013 | Friedrich et al. | |
| 2013/0293220 A1 | 11/2013 | Metivier et al. | |
| 2013/0342194 A1 | 12/2013 | Motz et al. | |
| 2013/0342195 A1 | 12/2013 | Ausserlechner | |
| 2014/0009144 A1 | 1/2014 | Romero | |
| 2014/0028304 A1 | 1/2014 | Ausserlechner | |
| 2014/0070796 A1 | 3/2014 | Reymond et al. | |
| 2014/0175584 A1 | 6/2014 | Foletto et al. | |
| 2014/0176125 A1 | 6/2014 | Friedrich et al. | |
| 2014/0176126 A1 | 6/2014 | Friedrich et al. | |
| 2014/0210023 A1 | 7/2014 | Wang et al. | |
| 2014/0210461 A1 | 7/2014 | Ausserlechner | |
| 2014/0225597 A1 | 8/2014 | Romero et al. | |
| 2014/0225598 A1 | 8/2014 | Romero et al. | |
| 2014/0264667 A1 | 9/2014 | Wang et al. | |
| 2014/0347044 A1 | 11/2014 | Monreal et al. | |
| 2015/0022188 A1 | 1/2015 | Daubert et al. | |
| 2015/0070002 A1 | 3/2015 | Schott | |
| 2015/0137805 A1 | 5/2015 | Motz et al. | |
| 2015/0153425 A1 | 6/2015 | Ausserlechner | |
| 2015/0168508 A1 | 6/2015 | Ausserlechner | |
| 2015/0176963 A1 | 6/2015 | Diaconu et al. | |
| 2015/0176964 A1 | 6/2015 | Uberti et al. | |
| 2015/0198677 A1 | 7/2015 | Romero | |
| 2015/0207061 A1 | 7/2015 | Ausserlechner | |
| 2015/0301149 A1 | 10/2015 | Cesaretti et al. | |
| 2015/0316623 A1 | 11/2015 | Romero | |
| 2015/0338473 A1 | 11/2015 | Diaconu | |
| 2015/0346289 A1 | 12/2015 | Ausserlechner | |
| 2015/0354985 A1 | 12/2015 | Judkins, III et al. | |
| 2015/0369881 A1 | 12/2015 | Ausserlechner | |
| 2016/0097826 A1 | 4/2016 | Ausserlechner | |
| 2016/0139214 A1 | 5/2016 | Ausserlechner | |
| 2016/0146905 A1 | 5/2016 | Diaconu | |

FOREIGN PATENT DOCUMENTS

| | | |
|---|---|---|
| CN | 102193073 A | 9/2011 |
| DE | 10 2005 014 509 B4 | 10/2006 |
| DE | 10 2006 037 226 A1 | 2/2008 |
| DE | 10 2007 036 984 A1 | 1/2009 |

(56) References Cited

FOREIGN PATENT DOCUMENTS

| DE | 10 2010 010 560 B3 | 9/2011 |
|---|---|---|
| EP | 0 631 416 B1 | 12/1994 |
| EP | 0 875 733 B1 | 11/1998 |
| EP | 0 916 074 B1 | 5/1999 |
| EP | 2 000 814 A2 | 12/2008 |
| JP | 58-055688 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| JP | 2011516873 A | 5/2011 |
| JP | 2013-024871 | 2/2013 |
| TW | 200643376 | 12/2006 |
| WO | WO 1998/010302 | 3/1998 |
| WO | WO 1998/054547 | 12/1998 |
| WO | WO 2000/002266 | 1/2000 |
| WO | WO 2003/036732 A2 | 5/2003 |
| WO | WO 2003/036733 A2 | 5/2003 |
| WO | WO 2004/025742 A1 | 3/2004 |
| WO | WO 2005/029106 A1 | 3/2005 |
| WO | WO 2006/056289 A1 | 6/2006 |
| WO | WO 2006/074989 A1 | 7/2006 |
| WO | WO 2008 145662 A1 | 12/2008 |
| WO | WO 2009/124969 A1 | 10/2009 |

OTHER PUBLICATIONS

Korean Notice of Allowance wih Allowed Claims dated Jul. 23, 2021 for Application No. 10-2016-7019746; 16 Pages.
Extended European Search Report dated May 6, 2022 for European Application No. 21212617.1; 11 Pages.
Allegro Microsystems, Inc.; "27701-AN datasheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; 40 pages.
Allegro Microsystems, Inc.; "A3212 datasheet: Micropower, Ultra-Sensitive Hall-Effect Switch;" published Sep. 22, 2004; 12 pages.
Allegro Microsystems, Inc.; "3235 datasheet 27633A, Dual-Output Hall-Effect Switch;" http://www.datasheetcatalog.org/datasheets/90/205047_DS.pdf; downloaded Sep. 29, 2010; 6 pages.
Allegro Microsystems, Inc.; "A3425 datasheet: Dual, Chopper-Stabilized, Ultra-Sensitive Bipolar Hall-Effect Switch;" published Jun. 28, 2002; 10 pages.
Allegro Microsystems, Inc.; "A1140/41/42/43 datasheet: Sensitive Two-Wire Chopper-Stabilized Unipolar Hall-Effect Switches;" published Sep. 9, 2004; 10 pages.
Allegro Microsystems, Inc.; "A1174 datasheet: Ultrasensitive Hall Effect Latch with Internally or Externally Controlled Sample and Sleep Periods for Track Ball and Scroll Wheel Applications;" published Jul. 25, 2008; 13 pages.
Allegro Microsystems, Inc.; "A1230 datasheet: Ultra-Sensitive Dual-Channel Quadrature Hall-Effect Bipolar Switch;" published Mar. 26, 2010; 16 pages.
Allegro Microsystems, Inc.; "A1351 datasheet: High Precision Linear Hall Effect Sensor with a Push/Pull, Pulse Width Modulated Output;" published Mar. 7, 2008; 23 pages.
Allegro Microsystems, Inc.; "A1354 datasheet; High Precision 2-Wire Linear Hall Effect Sensor IC with a Pulse Width Modulated Output;" 22 pages.
Allegro Microsystems, Inc.; "A1356 datasheet; High Precision Linear Hall-Effect Sensor with an Open Drain Pulse Width Modulated Output;" 20 pages.
Allegro Microsystems, Inc.; "A1360, A1361 and A1362 datasheet: Low-Noise Programmable Linear Hall Effect Sensors with Adjustable Bandwidth (50 kHz Maximum) and Analog Output;" published Mar. 18, 2008; 25 pages.
Allegro Microsystems, Inc.; "ATS675LSE datasheet: Self-Calibrating TPOS Speed Sensor Optimized for Automotive Cam Sensing Applications;" published Jul. 11, 2008; 13 pages.

Atherton et al.; "Sensor Signal Conditioning—an IC Designer's Perspective;" IEEE Electro International; Apr. 26-28, 1991; 6 pages.
Austria Microsystems; "AS5040 datasheet; 10-Bit Programmable Magnetic Rotary Encoder;" Revision 1.1; Jan. 2004; 20 pages.
Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; 4 pages.
Banjevic; "High Bandwidth CMOS Magnetic Sensors Based on the Miniaturized Circular Vertical Hall Device;" Ecole Polytechnique Federale DeLausanne; These N 5114; Jan. 2011; 153 pages.
Baschirotto et al.; "Development and Analysis of a PCB Vector 2-D Magnetic Field Sensor System for Electronic Compasses;" IEEE Sensors Journal, vol. 6, No. 2; Apr. 2006; 7 pages.
Blanchard et al.; "Cylindrical Hall Device;" International Electron Devices Meeting; Dec. 8-11, 1996; 4 pages.
Burger et al.; "New fully integrated 3-D silicon Hall sensor for precise angular-position measurements;" Sensors and Actuators, A 67; May 1998; 5 pages.
Drljaca, et al.; "Nonlinear Effects in Magnetic Angular Position Sensor With Integrated Flux Concentrator;" Proc. $23^{rd}$ International Conference on Microelectronics (MIEL 2002); vol. 1; NIS; Yugoslavia; May 12-15, 2002; 4 pages.
Dwyer; Allegro Microsystems, Inc.; "AN296061 Data Sheet: Ring Magnet Speed Sensing for Electronic Power Steering;" published Jul. 21, 2009; 4 pages.
Freitas et al.; "Giant magnetoresistive sensors for rotational speed control;" Jorunal of Applied Physics, vol. 85, No. 8; Apr. 15, 1999; 3 pages.
Gerhauser; "Intelligente 3D-Magnetfeld Sensorik;" Fraunhofer-Institut for Integrierte Schaltungen IIS; www.iis.fraunhofer.de/asic/analog; Oct. 2009; 12 pages.
Gilbert; "Technical Advances in Hall-Effect Sensing;" Allegro Microsystems, Inc. Product Description; May 10, 2008; 7 pages.
Häberli et al.; "Contactless Angle Measurements by CMOS Magnetic Sensor with on Chip Read-Out Circuit;" The $8^{th}$ International Conference on Solid-State Sensors and Actuators and Eurosensors IX; Jun. 25-29, 1995; 4 pages.
Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; 6 pages.
Heidari et al. "Analysis and Modeling of Four-Folded Vertical Hall Devices in Current Domain" IEEE, Jun. 2014, 4 pages.
Hiligsmann et al.; "Monolithic 360 Degrees Rotary Position Sensor IC;" 2004 IEEE Proceedings of Sensors, vol. 3; Oct. 24-27, 2004; 6 pages.
Kaufmann et al.; "Novel Coupling Concept for Five-Contact Vertical Hall Devices;" 16th International Solid-State Sensors, Actuators and Microsystems (Transducers) Conference; Jun. 5-9, 2011; 4 pages.
Kejik et al.; "Circular Hall Transducer for Angular Position Sensing;" International Solid-State Sensors, Actuators and Microsystems Conference; Transducers; Jun. 2007; 4 pages.
Kejik, et al.; "Purely CMOS Angular Position Sensor Based on a New Hall Microchip;" $34^{the}$ Annual Conference of IEEE Industrial Electronics; IECON; Nov. 10-13, 2008; 5 pages.
Kejik,.et al.; "Ultra Low-Power Angular Position Sensor for High-Speed Portable Applications;" 2009 IEEE Sensors Conference; Oct. 25-28, 2009; 4 pages.
Lozanova et al. "A novel coupling of three-contact parallel-field hall devices for offset compensation", Science Direct, EUROSENSORS 2014, the XXVIII edition of the conference series, 2014, 4 pages.
Lou Law; "Angle Position Sensing with 2-Axis Hall ICs;" Sensors Magazine, vol. 20, No. 3; Mar. 2003; 7 pages.
Masson et al.; "Multiturn and high precision through-shaft magnetic sensors;" Sensor + Text Conference; Proceedings II; May 2009; 6 pages.
Melexis MLX 90324; ""Under-the-Hood" Triaxis Rotary Position feat. SENT Protocol;" 3901090324 Data Sheet; Dec. 2008; 40 pages.
Melexis Microelectronic Integrated Systems; MLX90333; "Triaxis 3D-Joystick Position Sensor;" Data Sheet; Mar. 2009; 43 pages.

(56) References Cited

OTHER PUBLICATIONS

MEMSIC Corporation; MMC312xMQ; "Tri-axis Magnetic Sensor, with I²C Interface;" Aug. 14, 2008; 9 pages.
MEMSIC Corporation; MMC314xMS; "Ultra Small 3-axis Magnetic Sensor, with I²C Interface;" Mar. 31, 2010; 8 pages.
MEMSIC Corporation; AN-00MM-001; "Magnetometer Fundamentals;" Jun. 2008; 6 pages.
MEMSIC Corporation; AN-00MM-002; "Magnetometer Soldering Methodology;" Jun. 2008; 2 pages.
MEMSIC Corporation; AN-00MM-003; "Magnetic Sensor Calibration;" Mar. 2008; 5 pages.
MEMSIC Corporation; AN-00MM-004; "Electronic Tilt Compensation;" Mar. 2008; 5 pages.
MEMSIC Corporation; AN-00MM-005; "Magnetic Sensor Placement Guidelines;" Oct. 2008; 2 pages.
Metz et al.; "Contactless Angle Measurement Using Four Hall Devices on Single Chip;"; International Conference on Solid State Sensors and Actuators; Transducers; vol. 1; Jun. 16-19, 1997; 4 pages.
Micronas GmbH; "HAL® 3625 Programmable Direct Angle Sensor;" Product Information; Sep. 2009; 2 pages.
Munter; "A Low-offset Spinning-currect Hall Plate;" Sensors and Actuators, vol. A21-A23; Jan. 1990; 4 pages.
Novotechnik Siedle Group; "How New Angular Positioning Sensor Technology Opens a Broad Range of New Applications;" Vert-X Technology; Dec. 2001; 5 pages.
Paranjape et al.; "A CMOS-compatible 2-D vertical Hall Magnetic field sensor using active carrier confinement and post-process micromachining;" The 8$^{th}$ International Conference on Solid-State Sensors and Acutators, Physical vol. 53, Issues 1-3; May 1996; 6 pages.
Paun et al. "Offset and Drift Analysis of the Hall Effect Sensors. The Geometrical Parameters Influence" Digest Journal of Nanomaterials and Biostructures, vol. 7, No. 3, Jul.-Sep. 2012, 9 pages.
Petoussis et al.; "A Novel Hall Effect Sensor Using Elaborate Offset Cancellation Method;" Sensors & Transducers Journal, vol. 100, Issue 1; Jan. 2009; 7 pages.
Popovic; "Not-plate-like Hall Magnetic sensors and their applications;" Sensors and Actuators A: Physical, vol. 85, Issues 1-3; Sep. 23, 1999; 9 pages.
Remond, et al.; "True 2D CMOS Integrated Hall Sensor;" 2007 IEEE Sensors Conference; Oct. 28-31, 2007;4 pages.
Roumenin; "Magnetic sensors continue to advance towards perfection;" Sensors and Actuators A: Physical, vol. 46-47, Issues 1-3; Jan.-Feb. 1995; 7 pages.
Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; 4 pages.
Sander et al. "Fully Symmetric Vertical Hall Devices in CMOS Technology", IEEE, Sep. 2013, 4 pages,
Schneider et al.; "Temperature Calibration of CMOS Magnetic Vector Probe for Contactless Angle Measurement System;" International Electron Devices Meeting; Dec. 8-11, 1996; 4 pages.
Schurig et al.; "CMOS Integrated Vertical Hall Sensor with Low Offset;" 16$^{th}$ European Conference on Solid-State Transducers; Sep. 15-18, 2002; 4 pages.
SENSIMA technology sa; "CVHD: a new concept of Angular Position Sensor;" Slide Presentation for Allegro Microsystems; Mar. 2009; 17 pages.
Sentron; AN-101; "Angular position sensing wit 2-Axis Hall IC 2SA-10;" Feb. 12, 2004; http://www.diegm.uniud.it/petrella/Azionamenti%20Eletrrici%20II/Sensori%20e%20trasduttori/Data%20Sheet%20-%202SA-10.pdf; 7 pages.
Van der Meer; et al; "CMOS quad spinning-current Hall-sensor system for compass application;" IEEE Proceedings of Sensors, vol. 3; Oct. 24-27, 2004; 4 pages.
Vogelgesang et al.; Robert Bosch GmbH; "GMR sensors in automotive application;" CS-SNS/ECS Slides Presentation; Mar. 2, 2005; 16 pages.
Voider; "The CORDIC Trigonometric Computing Technique;" The Institute of Radio Engineers, Inc.; IRE Transactions on Electronic Computers, vol. EC, Issue 3; Sep. 1959; 5 pages.
Xu et al. "A Low-offset Vertical Hall Device With a Couple of Three-contact Vertical Hall Elements" IEEE, 2016, 3 pages.
Office Action dated Jun. 3, 2013 for U.S. Appl. No. 13/035,257; 10 pages.
Response to Office Action filed on Aug. 20, 2013 for U.S. Appl. No. 13/035,257; 13 pages.
Final Office Action dated Oct. 30, 2013 for U.S. Appl. No. 13/035,257; 19 pages.
Response to Final Office Action filed on Jan. 29, 2014 for U.S. Appl. No. 13/035,257; 23 pages.
Notice of Allowance dated Mar. 14, 2014; for U.S. Appl. No. 13/035,257; 7 pages.
Search Report and Written Opinion dated May 7, 2012 for PCT Pat. App. No. PCT/US2012/024426; 14 pages.
PCT International Preliminary Report on Patentability and Written Opinion of the ISA dated Sep. 6, 2013 for PCT Pat. App. No. PCT/US2012/024426; 11 pages.
Office Action dated Oct. 9, 2013 for U.S. Appl. No. 13/113,603; 21 pages.
Response to Office Action filed on Feb. 10, 2014 for U.S. Appl. No. 13/113,603; 20 pages.
Notice of Allowance dated Jun. 11, 2014; from U.S. Appl. No. 13/113,603; 9 pages.
Search Report and Written Opinion dated Nov. 28, 2012 for PCT Pat. App. No. PCT/US2012/034892; 13 pages.
PCT International Preliminary Report on Patentability and Written Opinion dated Dec. 5, 2013; PCT Application No. PCT/US2012/034892; 10 pages.
Invitation to pay fees and Partial Search Report dated Feb. 6, 2013 for PCT Pat. App. No. PCT/US2012/052639; 7 pages.
Search Report and Written Opinion dated May 21, 2013 for PCT Pat. App. No. PCT/US2012/052639; 25 pages.
PCT International Preliminary Report on Patentability and Written Opinion of the ISA dated Apr. 10, 2014; for PCT Pat. App. No. PCT/US2012/052639; 19 pages.
Taiwan Office Action with English translation dated Feb. 18, 2014 for Taiwan Application No. 101132371, 12 pages.
Office Action/Restriction Requirement dated Nov. 20, 2013; for U.S. Appl. No. 13/035,243; 6 pages.
Response and Preliminary Amendment filed Jan. 20, 2014; to Office Action/Restriction Requirement dated Nov. 20, 2013; for U.S. Appl. No. 13/035,243; 12 pages.
Office Action dated Jul. 18, 2014 for U.S. Appl. No. 13/035,243, filed Feb. 25, 2011; 25 pages.
Response filed Dec. 4, 2014; to Office Action dated Jul. 18, 2014; for U.S. Appl. No. 13/035,243; 20 pages.
Notice of Allowance dated Feb. 23, 2015; for U.S. Appl. No. 13/035,243; 8 pages.
PCT Search Report and Written Opinion of the ISA; dated Jul. 2, 2012; for PCT Pat. App. No. PCT/US2012/024424; 14 pages.
PCT International Preliminary Report on Patentability and Written Opinion of the ISA; dated Sep. 6, 2013; for PCT Pat. App. No. PCT/US2012/024424; 11 pages.
Notice of Allowance dated Jul. 9, 2015; for U.S. Appl. No. 14/717,448; 19 pages.
Office Action dated Mar. 10, 2016 for U.S. Appl. No. 14/155,047; 20 pages.
Response to Office Action Filed on Jun. 1, 2016 for U.S. Appl. No. 14/155,047; 19 pages.
Notice of Allowance dated Sep. 2, 2016 for U.S. Appl. No. 14/155,047; 17 pages.
PCT Search Report and Written Opinion of the ISA dated Mar. 19, 2015; for PCT Pat. App. No. PCT/US2014/072042; 21 pages.
PCT International Preliminary Report on Patentability dated Jul. 28, 2016 for PCT Application No. PCT/US2014/072042; 17 pages.
Korean Office Action with English translation dated Oct. 5, 2020 for Korean Application No. 10-2016-7019746; 14 pages.
Korean Response to Office Action with English translation dated Nov. 11, 2020 for Korean Application No. 10-2016-7019746; 69 pages.

(56) References Cited

OTHER PUBLICATIONS

Korean Office Action with English translation dated Mar. 8, 2021 for Korean Application No. 10-2016-7019746; 6 pages.
Korean Response to Office Action with English translation dated Mar. 24, 2021 for Korean Application No. 10-2016-7019746; 15 pages.
Japanese Office Action with English Translation dated Sep. 26, 2018 for Japanese Application No. 2016-563878; 4 pages.
Response to Japanese Office Action with English Translation filed Dec. 19, 2018 for Japanese Application No. 2016-563878; 20 pages.
Japanese Decision to Grant dated Mar. 28, 2019 for Japanese Application No. 2016-563878; 5 pages.
European Communication Pursuant to Rules 161(1) and 162 EPC dated Aug. 17, 2016 for European Application No. 14825568.0; 2 pages.
Response to European Communication Pursuant to Rules 161(1) and 162 EPC filed on Feb. 23, 2017 for European Application No. 14825568.0; 25 pages.
Intention of Grant dated Jul. 26, 2017 for European Application No. 14825568.0; 7 pages.

\* cited by examiner

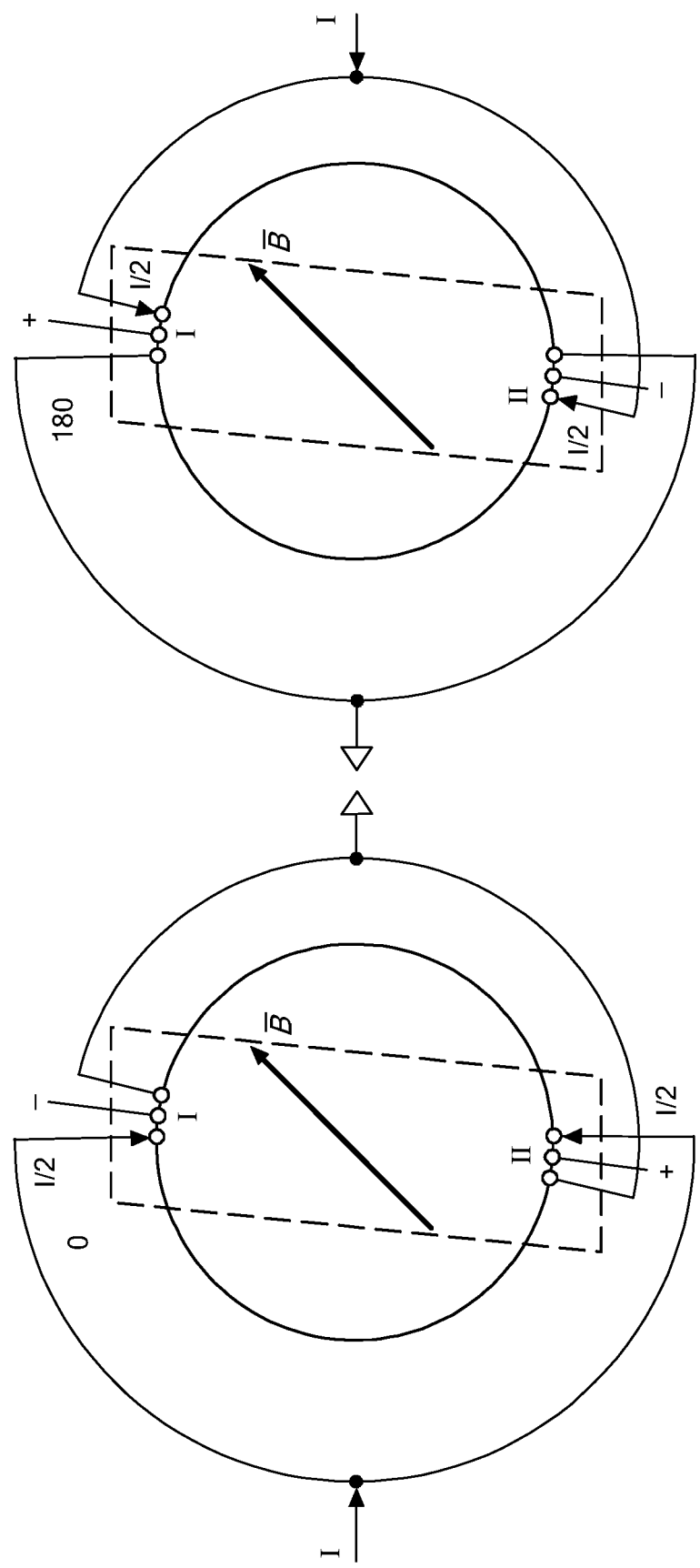

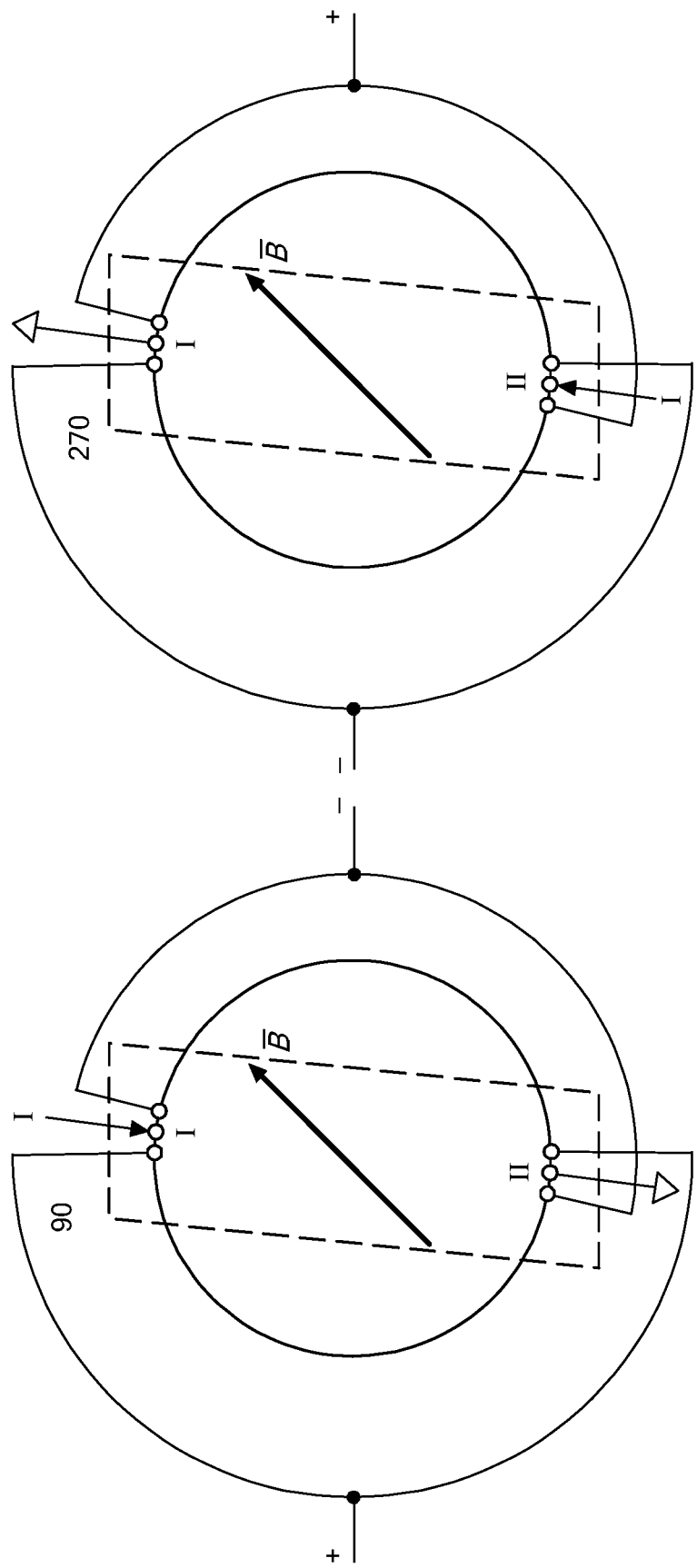

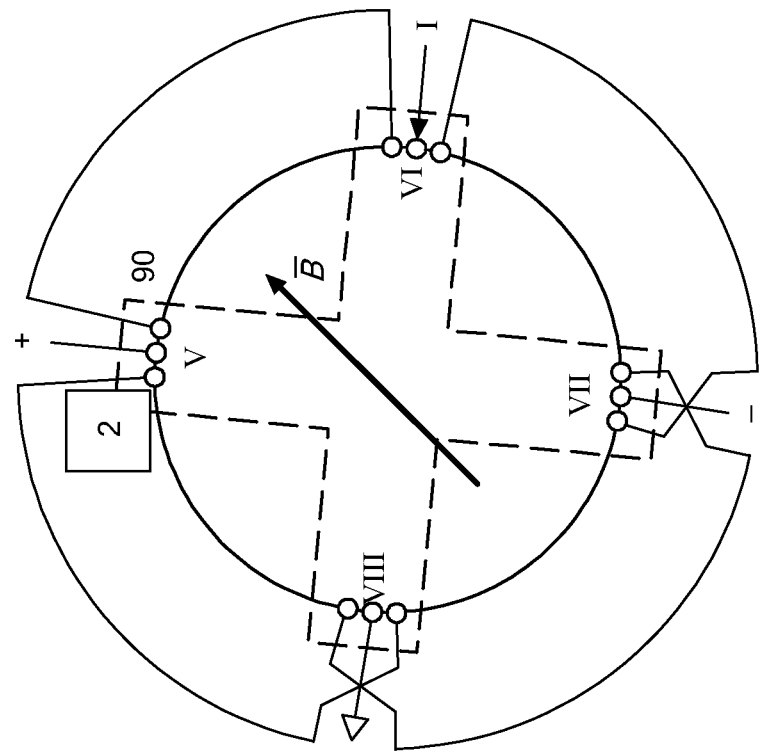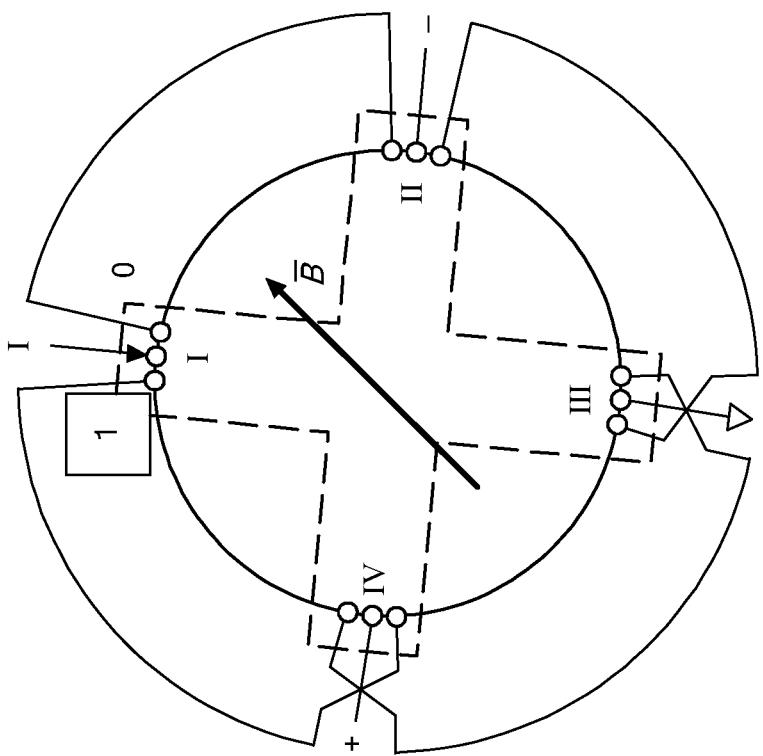
FIG. 25

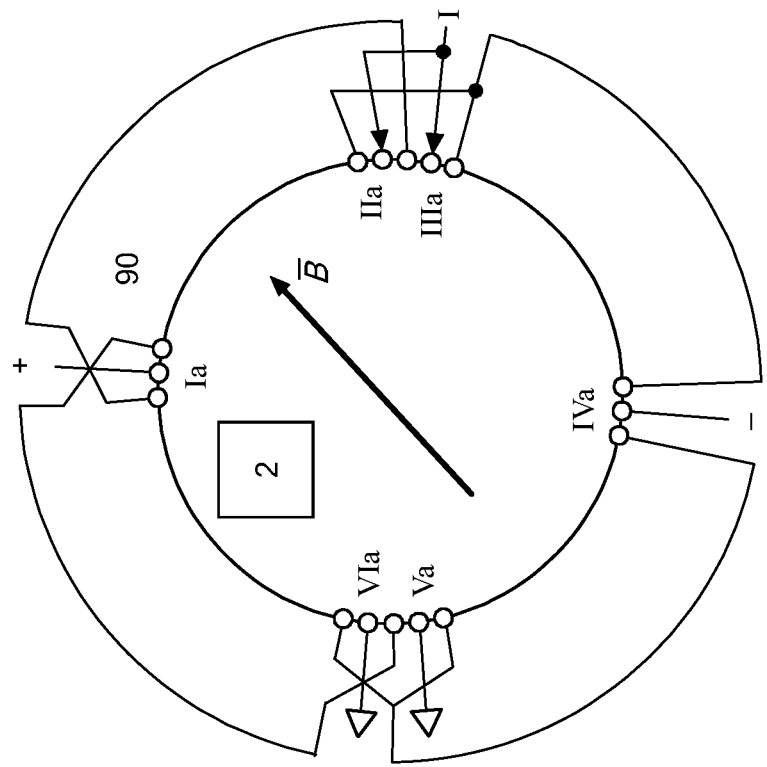
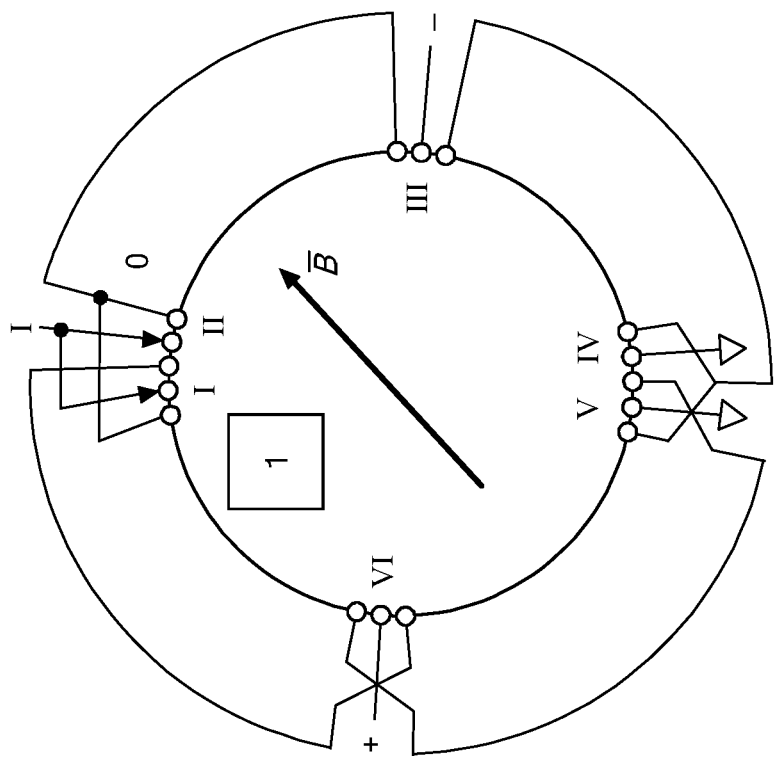
FIG. 26

CIRCUIT FOR REDUCING AN OFFSET COMPONENT OF A PLURALITY OF VERTICAL HALL ELEMENTS ARRANGED IN ONE OR MORE CIRCLES

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors, and, more particularly, to a magnetic field sensor having a plurality of vertical Hall elements that are combined in ways that reduce an offset component.

BACKGROUND

Magnetic field sensing elements can be used in a variety of applications. In one application, a magnetic field sensing element can be used to detect a direction of a magnetic field, i.e., an angle of the direction of the magnetic field.

Planar Hall elements and vertical Hall elements are known types of magnetic field sensing elements. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical Hall elements, is known and described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant and diffusion region in a substrate. The common implant and diffusion region can be a common epi (epitaxial) region (e.g., layer) upon a substrate, bounded by semiconductor isolation structures. The CVH sensing element can be used to sense a direction (i.e., an angle) of a magnetic field in a plane of the substrate.

Various parameters characterize the performance of magnetic field sensing elements and magnetic field sensors that use magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

The above-described CVH sensing element is operable, with associated circuits, to provide an output signal representative of an angle of a direction of a magnetic field. Therefore, as described below, if a magnet is disposed upon or otherwise coupled to a so-called "target object," for example, a camshaft in an engine, the CVH sensing element can be used to provide an output signal representative of an angle of rotation of the target object.

The CVH sensing element is but one element that can provide an output signal representative of an angle of a magnetic field, i.e., an angle sensor. For example, an angle sensor can be provided from a plurality of separate vertical Hall elements or a plurality of magnetoresistance elements arranged in a circle. Collectively, magnetic field sensing element(s) that generate an output signal related to an angle of a magnetic field are referred to herein "angle sensing elements."

More parameters can characterize the performance of angle sensing element(s), e.g., a CVH sensing element. One such parameter is an angular accuracy of the output signal generated by the angle sensing element(s). Angular accuracy can have both an average angle error that is the same at all magnetic field pointing angles, and also an angle error that is different at different magnetic field angles (i.e. a nonlinearity error). Another parameter is the speed with which the angle sensing element(s) can convey the angle of the magnetic field. It will be understood that the speed is particularly important for applications in which the angle of the magnetic field may be rapidly changing.

It is known that some parameters that can characterize an angle sensing element tend to change with temperature.

When an angle sensor uses a plurality of magnetic sensing elements, e.g., as used in a CVH sensing element or in separate magnetic field sensing elements, different offset voltages of the different magnetic field sensing elements can reduce an accuracy of an angle sensed by and angle sensor.

It would be desirable to provide circuits and techniques that can process output signals from a CVH sensing element or from separate magnetic field sensing elements and that can provide an improved measurement of angle at a relatively high speed.

SUMMARY

The present invention provides circuits and techniques that can process output signals from a CVH sensing element or from separate magnetic field sensing elements and that can provide an improved measurement of angle at a relatively high speed.

In accordance with an example useful for understanding an aspect of the present invention, a magnetic field sensor can include a semiconductor substrate and a plurality of electrical contacts arranged upon a circle over the semiconductor substrate. The magnetic field sensor can also include a sequence switches circuit electrically coupled to the plurality of electrical contacts and disposed over the semiconductor substrate and a current switches circuit electrically coupled to the plurality of electrical contacts and disposed over the semiconductor substrate. The sequence switches circuit and/or the current switches circuit can be operable to select a first group of electrical contacts and a second group of electrical contacts, the selected first and second groups of electrical contacts each having three and only three proximate electrical contacts, respectively, wherein the three proximate electrical contacts of the first and second groups of electrical contacts each have respective outer electrical contacts and a respective center electrical contact between the outer electrical contacts resulting in first and second center electrical contacts, wherein the first and second center electrical contacts are within a first quadrant of the circle, wherein the sequence switches circuit or the current switches circuit is operable to couple one of the outer electrical contact of the first group of electrical contacts to one and only one of the outer electrical contacts of the second group of electrical contacts, resulting in a first coupled pair of outer electrical contacts.

In accordance with another example useful for understanding another aspect of the present invention, a magnetic field sensor can include a semiconductor substrate and a plurality of electrical contacts arranged upon a circle over the semiconductor substrate. The magnetic field sensor can also include a sequence switches circuit electrically coupled to the plurality of electrical contacts and disposed over the semiconductor substrate and a current switches circuit electrically coupled to the plurality of electrical contacts and disposed over the semiconductor substrate. The sequence switches circuit and/or the current switches circuit are operable to select a first, second, third, fourth, fifth, and sixth groups of electrical contacts, the first, second, third, fourth, fifth, and sixth groups of electrical contacts each having three and only three proximate electrical contacts, respectively, wherein the three proximate electrical contacts of the first, second, third, fourth, fifth, and sixth groups of electrical contacts each have respective outer electrical contacts and a respective center electrical contact between the outer electrical contacts resulting in first, second, third, fourth, fifth, and sixth center electrical contacts, wherein one outer electrical contact of each of the first, second, and third groups of electrical contacts are coupled together, and wherein another one outer electrical contact of each of the first and second groups of electrical contacts are coupled together and also to an outer electrical contact of the sixth group of electrical contacts.

BRIEF DESCRIPTION OF THE DRAWINGS

The foregoing features of the invention, as well as the invention itself may be more fully understood from the following detailed description of the drawings, in which:

FIGS. 15-15C show another four coupling arrangements (phases) of a CVH sensing element as in FIG. 1 (or otherwise separate elements as in FIG. 1A) having two groups of three (or one group of six) electrical contacts similar to the arrangement of FIG. 6;

FIG. 25 shows a coupling arrangement (phase) of two CVH sensing elements as in FIG. 1 (or otherwise separate elements as in FIG. 1A), each having four groups of three (or two groups of six) electrical contacts similar to the arrangements of arrangement of FIG. 9; and FIG. 26 shows a coupling arrangement (phase) of two CVH sensing elements as in FIG. 1 (or otherwise separate elements as in FIG. 1A), each having five groups of electrical contacts similar to the arrangement of FIG. 9.

DETAILED DESCRIPTION

Figure 1:
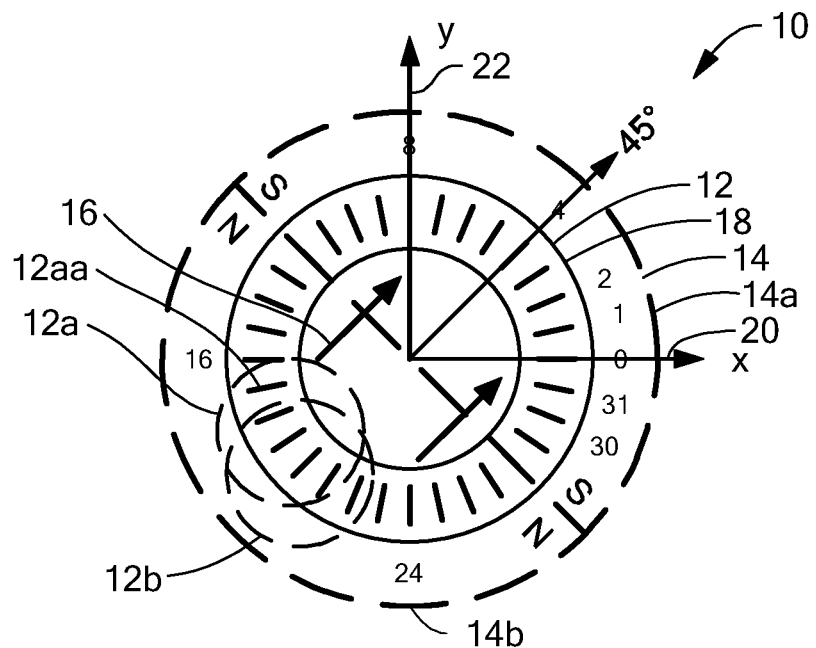
FIG. 1 is a pictorial showing a circular vertical Hall (CVH) sensing element having a plurality of vertical Hall elements arranged in a circle over a common implant region upon a substrate, and a two pole magnet disposed close to the CVH sensing element.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe an assembly that uses one or more magnetic field sensing elements in combination with an electronic circuit, all disposed upon a common substrate, e.g., a semiconductor substrate. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "magnetic field signal" is used to describe any circuit signal that results from a magnetic field experienced by a magnetic field sensing element.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/−ten degrees.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be analog or digital.

As used herein, the term "module" can be used to describe a "processor." However, the term "module" is used more generally to describe any circuit that can transform an input signal into an output signal that is different than the input signal.

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks (e.g. processors or modules), it will be understood that the analog blocks can be replaced by digital blocks (e.g. processors or modules) that perform the same or similar functions and the digital blocks can be replaced by analog blocks that perform the same or similar functions. Analog-to-digital or digital-to-analog conversions may not be explicitly shown in the figures, but should be understood.

In particular, it should be understood that a so-called comparator can be comprised of an analog comparator having a two state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "amplifier" is used to describe a circuit element with a gain greater than one, less than one, or equal to one.

Referring to FIG. 1, a circular vertical Hall (CVH) element 12 includes a circular implant and diffusion region 18 in a substrate (not shown). The CVH sensing element 12 has a plurality of vertical Hall elements, of which a vertical Hall element 12a is but one example. In some embodiments, the common implant and diffusion region 18 can be characterized as a common epitaxial region upon a substrate, bounded by semiconductor isolation structures.

Each vertical Hall element has a plurality of Hall element contacts (e.g., four or five contacts), e.g., 12aa. Each vertical Hall element contact can be comprised of a metal contact over a contact diffusion region (a pickup) diffused into the common implant and diffusion region 18.

A particular vertical Hall element (e.g., 12a) within the CVH sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., 32 or 64. However, it will also be understood that a next vertical Hall element can be shifted by more than one contact from the prior vertical Hall element, in which case, there are fewer vertical Hall elements than there are vertical Hall element contacts in the CVH sensing element.

As shown, a center of a vertical Hall element 0 can be positioned along an x-axis 20 and a center of vertical Hall element 8 can be positioned along a y-axis 22. In the exemplary CVH sensing element 12, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 14 having a north side 14b and a south side 14a can be disposed over the CVH 12. The circular magnet 14 tends to generate a magnetic field 16 having a direction from the north side 14b to the south side 14a, here shown to be pointed to a direction of about forty-five degrees relative to x-axis 20.

In some applications, the circular magnet 14 is mechanically coupled to a rotating target object, for example, an automobile steering shaft of an automobile camshaft, and is subject to rotation relative to the CVH sensing element 12. With this arrangement, the CVH sensing element 12, in combination with an electronic circuit described below, can generate a signal related to the angle of rotation of the magnet 14, i.e., an angle of rotation of the target object to which the magnet is coupled.

Figure 1A:
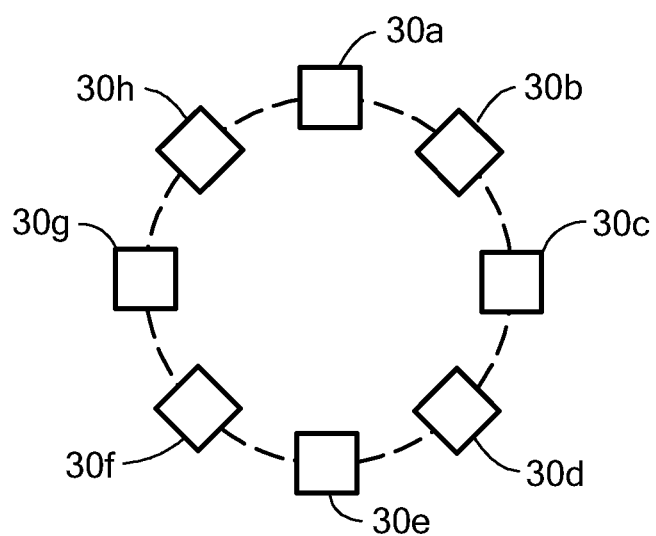
FIG. 1A is pictorial showing a plurality of magnetic field sensing elements.

Referring now to FIG. 1A, a plurality of magnetic field sensing elements 30a-30h, in a general case, can be any type of magnetic field sensing elements. The magnetic field sensing elements 30a-30h can be, for example, separate vertical Hall elements or separate magnetoresistance elements, each having an axis of maximum response parallel to a surface of a substrate 34. These magnetic field sensing elements can be coupled to an electronic circuit the same as or similar to an electronic circuit described below in conjunction with FIG. 3. There can also be a magnet the same as or similar to the magnet 14 of FIG. 1 disposed proximate to the magnetic field sensing elements 30a-30h.

Figure 2:
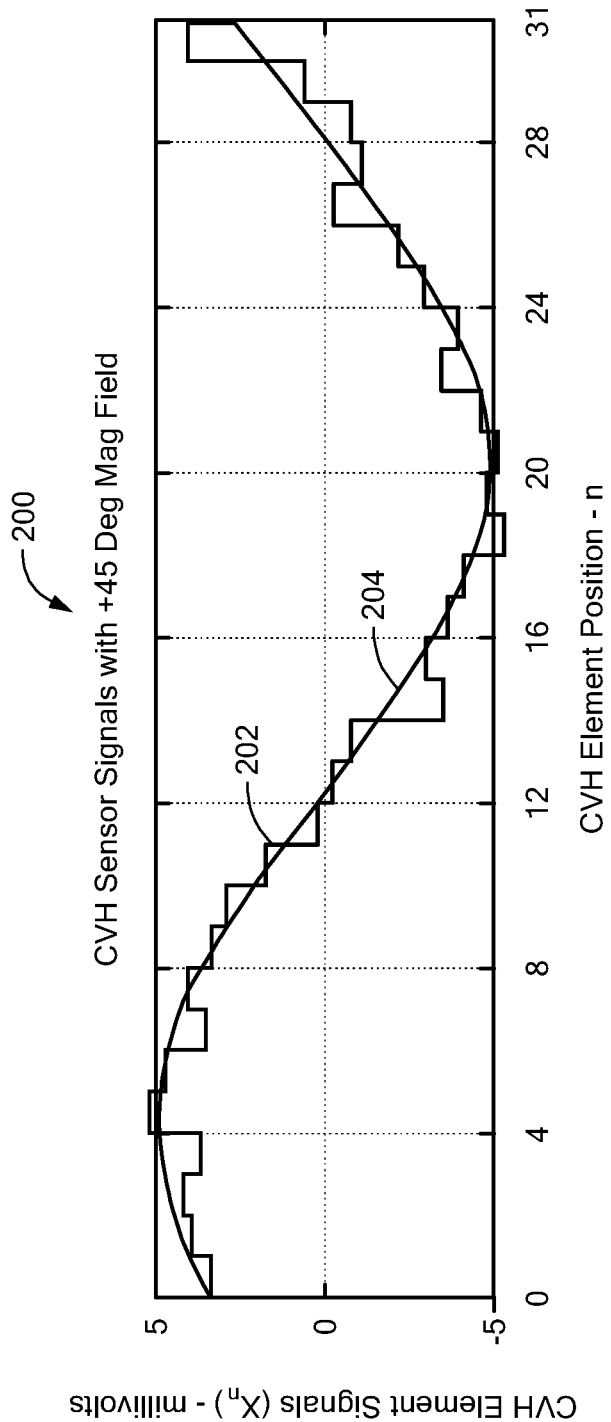
FIG. 2 is a graph showing an output signal as may be generated by the CVH sensing element of FIG. 1 or by the plurality of magnetic field sensing elements of FIG. 1A.

Referring now to FIG. 2, a graph 200 has a horizontal axis with a scale in units of CVH vertical Hall element position, n, around a CVH sensing element, for example, the CVH sensing element 12 of FIG. 1. The graph 200 also has a vertical axis with a scale in amplitude in units of millivolts. The vertical axis is representative of output signal levels from the plurality of vertical Hall elements of the CVH sensing element taken sequentially, one at a time, about the ring of contacts of the CVH sensing element.

The graph 200 includes a signal 202 representative of output signal levels from the plurality of vertical Hall elements of the CVH taken with the magnetic field of FIG. 1 pointing in a direction of forty-five degrees.

Referring briefly to FIG. 1, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts. In other embodiments, there are sixty-four vertical Hall element contacts and a corresponding sixty-four vertical Hall elements.

In FIG. 2, for the magnetic field 16 pointing at positive forty-five degrees, a maximum positive signal is achieved from a vertical Hall element centered at position 4, which is aligned with the magnetic field 16 of FIG. 1, such that a line drawn between the vertical Hall element contacts (e.g., five contacts) of the vertical Hall element at position 4 is perpendicular to the magnetic field. A maximum negative signal is achieved from a vertical Hall element centered at position 20, which is also aligned with the magnetic field 16 of FIG. 1, such that a line drawn between the vertical Hall element contacts (e.g., five contacts) of the vertical Hall element at position 20 is also perpendicular to the magnetic field.

A sine wave 204 is provided to more clearly show ideal behavior of the signal 202. The signal 202 has variations due to vertical Hall element offsets, which tend to cause corresponding variations of output signals causing them to be too high or too low relative to the sine wave 204, in accordance with offset errors for each element. The offset signal errors are undesirable.

Full operation of the CVH sensing element 12 of FIG. 1 and generation of the signal 202 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662.

Groups of contacts of each vertical Hall element can be used in a chopped arrangement (also referred to herein as current spinning) to generate chopped output signals from each vertical Hall element. Thereafter, a new group of adjacent vertical Hall element contacts can be selected (i.e., a new vertical Hall element), which can be offset by one element from the prior group. The new group can be used in the chopped arrangement to generate another chopped output signal from the next group, and so on.

Each step of the signal 202 is representative of an unchopped output signal, i.e., from one respective group of vertical Hall element contacts, i.e., from one respective vertical Hall element. Thus, for a CVH sensing element having 32 vertical Hall elements taken sequentially, there are thirty-two steps in the signal 202 when current spinning is not used. However, for embodiments in which current spinning is used, each step of the signal 202 can be comprised of several sub-steps (not shown, e.g., four sub-steps), each sub-step indicative of a current spinning "phase."

It will be understood that a phase of the signal 202 is related to an angle of the magnetic field 16 of FIG. 1 relative to position zero of the CVH sensing element 12. It will also be understood that a peak amplitude of the signal 202 is generally representative of a strength of the magnetic field 16. Using electronic circuit techniques described above in PCT Patent Application No. PCT/EP2008/056517, or using other techniques described below, a phase of the signal 202 (e.g., a phase of the signal 204) can be found and can be used to identify the pointing direction of the magnetic field 16 of FIG. 1 relative to the CVH sensing element 12.

Figure 3:
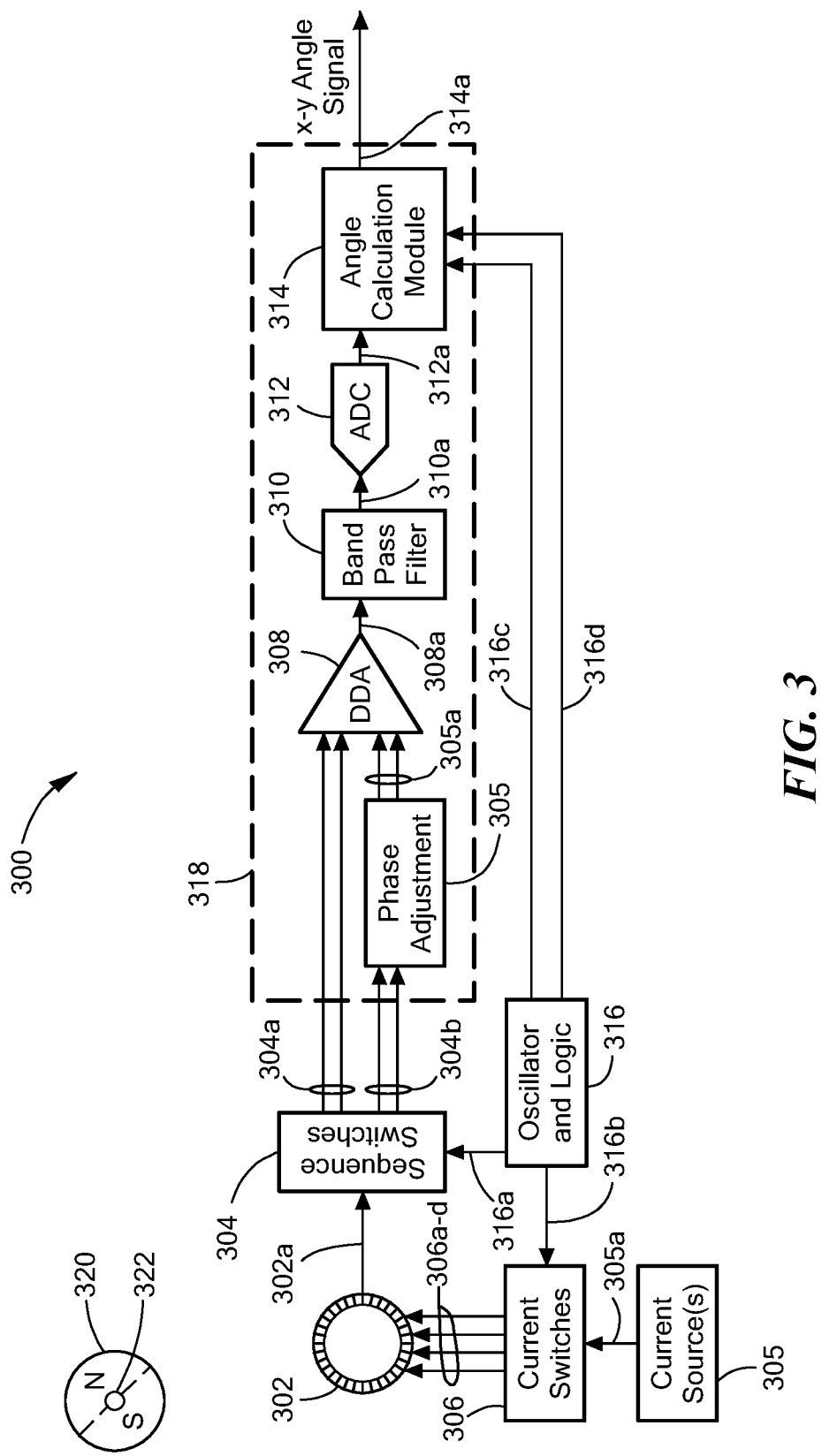
FIG. 3 is a block diagram of an exemplary magnetic field sensor having a CVH sensing element.

Referring now to FIG. 3, a magnetic field sensor 300 includes a CVH sensing element 302 having a plurality of vertical Hall elements, each vertical Hall element comprising a group of vertical Hall element contacts (e.g., five vertical Hall element contacts). In some embodiments, the CVH sensing element 302 can be the same as or similar to the CVH sensing element 12 described above in conjunction with FIG. 1, and can be disposed proximate to a two pole magnet 320 coupled to a target object 322, which magnet 320 can be the same as or similar to the magnet 14 of FIG. 1. However, in some embodiments, the CVH sensing element 302 can be replaced by a group of magnetic field sensing elements the same as or similar to those described above in conjunction with FIG. 1A.

The magnetic field sensor 300 can include a current switches circuit 306 to provide current signals 306a-306d to the CVH sensing element 302. While four current signals 306a-306d are shown, in other embodiments, there can be more than or fewer than four current signals. Essentially, the current switches circuit 306 has access to and can provide current in any combination to any or all of the vertical Hall elements within the CVH sensing element 302.

The magnetic field sensor 300 can also include sequence switches circuit 304. The sequence switches circuit 304 is coupled to receive signals 302a from the CVH sensing element 302. In some embodiments, the signals 302a are representative of signal coupling paths to all vertical Hall elements within the CVH sensing and 302.

From discussion above in conjunction with FIG. 1, it will be appreciated that, in operation, the sequence switches circuit 304 and the current switches circuit 306 can be configured to switch sequentially around the CVH sensing element 302 providing the current signals 306a-306d to different sequential combinations of vertical Hall elements within the CVH sensing element 302, and receiving different sequential combinations of the signals 302a from the CVH sensing element 302. In some embodiments, the sequencing can include current spinning for each selected one or more of the vertical Hall elements within the CVH sensing element 302.

From the sequence switches circuit 304 is provided one or more differential output signals, here shown as two differential signals 304a, 304b. It should be understood to both the differential signals 304a, 304b can be sampled analog signals similar to the signal 202 of FIG. 2.

A phase adjustment module 305 can be coupled to either signal path, but is here shown to receive the differential signal 304b and to provide a phase adjusted differential signal 305a. A differential amplifier 308 can be coupled to receive the differential signal 304a and the phase adjusted differential signal 305a and configured to generate an amplified signal 308a.

A bandpass filter 310 coupled to receive the amplified signal 308a and configured to generate a filtered signal 300a. It should be understood that the filtered signal 310a can be a sinusoid similar to the signal 204 of FIG. 2.

An analog-to-digital converter (ADC) 312 can be coupled to receive the filtered signal 310a and configured to generate a digital converted signal 312a. An angle calculation module 314 is coupled to receive the converted digital signal 312a and configured to generate an x-y angle signal 314a. As the magnet 320 rotates, values of the x-y angle signal 314a change according to an angle of the magnetic field generated by the magnet 320 in the plane of the CVH sensing element 302.

The angle calculation module 314 is also coupled to receive clock signals 316c, 316d from an oscillator and logic module 316. The clock signals 316c, 316d are used as references by the angle calculation module 314 in order to identify a phase of the converted digital signal 312a, i.e., a phase of the filtered signal 310a. For example, one of the clock signals 316c, 316d can be a clock signal having a frequency the same as the frequency of the filtered signal 310a, i.e., a frequency of the signal 204 of FIG. 2. In operation, phases of the clock signal and of the converted signal 312a can be compared to generate the x-y angle signal 314a, which is indicative of an angle of a magnetic field generated by the magnet 320.

The oscillator and logic module 360 can also provide clock control signals 316a, 316b to the sequence switches circuit 304 and to the current switches circuit 306, respectively. The clocks 316a, 316b result in the sequence switches circuit 304 and the current switches circuit 306 stepping around the CVH sensing element 302, sequentially selected different ones of the vertical Hall elements within the CVH sensing element 302, with or without chopping or current spinning.

Though not shown in FIG. 3 certain ones of the vertical Hall elements within the CVH sensing element 302 can be combined by the sequence switches circuit 304 in ways described more fully below in conjunction with FIGS. 11-26. In some arrangements, the phase adjustment module 305 can be omitted.

While the magnetic field sensor 300 has a CVH sensing element 302, it should be recognized that the same circuitry can be applied to any combination of separate vertical Hall elements (e.g., separately isolated N-well regions) arranged in a circle. See, e.g., FIG. 1A.

Figure 4:
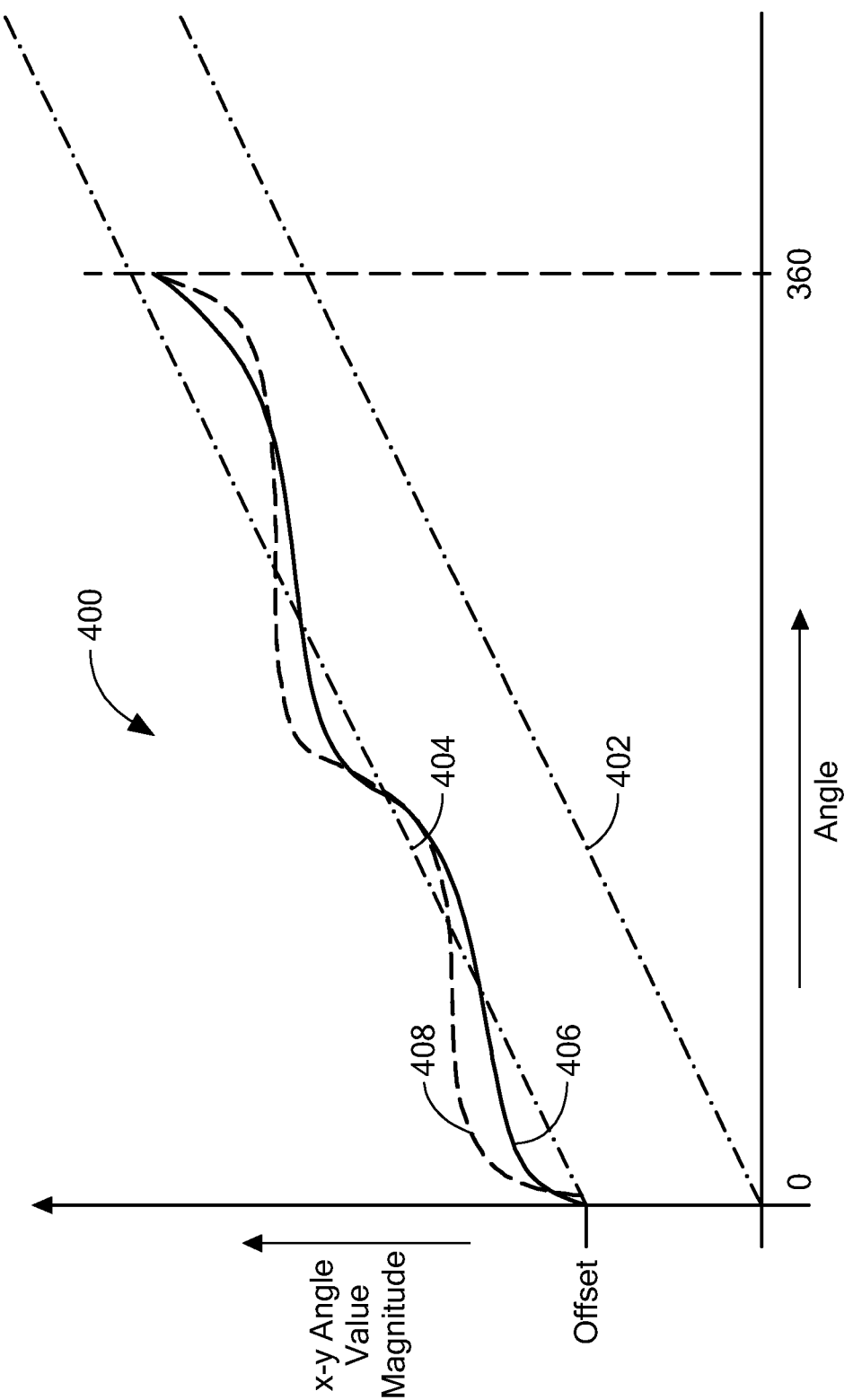
FIG. 4 is a graph showing ideal and non-ideal angle sensing operation of the magnetic field sensor of FIG. 3.

Referring now to FIG. 4, a graph 400 has a horizontal axis with a scale in units of angular degrees and a vertical axis with a scale in units of value of an x-y angle value magnitude, for example, a magnitude of the x-y angle value 314a of FIG. 3.

A line 402 is representative of an x-y angle value that has no angle error. When the x-y angle value has no angle error, the x-y angle value is perfectly straight-line linear with respect to actual angle, i.e., the x-y angle value is a perfect and true representation of the angle of the magnetic field generated by the magnet 320 of FIG. 3, and the line 402 passes through zero.

A line 404 is representative of an x-y angle value that has only an average or DC angle error, such that all angles represented by the x-y angle value are offset by a fixed number of degrees. The line 404 does not pass through zero.

A curve 406 is representative of an x-y angle value that has errors in representation of the true angle of the magnetic field generated by the magnet 320, average or DC errors and also an error that has a sinusoidal appearance.

A curve 408 is representative of an x-y angle value that has other errors in representation of the true angle of the magnetic field generated by the magnet 320.

A variety of circuit characteristics of the magnetic field sensor 300 contribute to the errors, i.e., to both the DC (or average) angle error represented by the curves 406, 408, and to the sinusoidal shapes of the curves 406, 408. One factor that contributes to the errors is switching noise generated by the sequence switches circuit 304 and/or by the current switches circuit 306 of FIG. 3. Another factor is different offset voltages among the vertical Hall elements within the CVH sensing element 302, for example, different offset voltages described above in conjunction with the signal 202 of FIG. 2. Another factor is different sensitivities of the various vertical Hall elements.

First, regarding the sequence switches circuit 304, it will be understood that charge injection or switching spikes (together referred to as noise) generated by the sequence switches circuit 304 are not necessarily exactly the same as each sequential vertical Hall element is selected in the CVH sensing element 302. When the noise generated by the sequence switches circuit 304 is not the same as each vertical Hall element is selected, a DC (or average) angle error is generated and also a sinusoidal type error such as that represented by the curves 406, 408. The sinusoidal error characteristic can be, in part, a result of the noise generated by the sequence switches being repetitive for each cycle around the CVH sensing element 302, and thus, the noise will have an angle error frequency component at a frequency of the signal 202 of FIG. 2, and will add to the signal 402 (304a of FIG. 3). The angle error frequency component is essentially fixed in phase relative the signals 304a, 304b and therefore, the addition of the angle error causes different phase shift errors in the summed signal depending on the phase of the signals 304a, 304b. Higher harmonics can also result from the noise.

Next, regarding the current switches circuit 306, it will be understood that charge injection or switching spikes (together referred to as noise) generated by the current switches circuit 306 are not necessarily exactly the same as each sequential vertical Hall element is selected in the CVH sensing element 302. When the noise generated by the current switches circuit 306 is not the same as each vertical Hall element is selected, a DC (or average) angle error is generated and also a sinusoidal type error such as that represented by the curves 406, 408. The sinusoidal error characteristic can, in part, result from the noise generated by the current switches circuit 306 being repetitive for each cycle around the CVH sensing element.

Other circuit characteristics can also contribute to the angle errors, i.e., to both the DC (or average) angle error represented by the error curves 406, 408, and to the sinusoidal shapes of the error curves 406, 408. Namely, a speed with which the dual differential amplifier 308 of FIG. 3, and also other circuit elements of FIG. 3, are unable to settle to final values as the sequence switches circuit 304 switches among the vertical Hall elements of the CVH sensing element 302, and also as the current switches circuit 306 switch among the various current spinning phases, contribute to the errors.

The above-described circuit characteristics, including, but not limited to, different offset voltages of the various vertical Hall elements within the CVH sensing element 302 of FIG. 3 (including or not including offset mismatches at different current spinning phases), differences of sensitivities of the various vertical Hall elements, and switching noise and lack of circuit elements settling to final values, tend to be influenced by (i.e., changed by) a variety factors including, but not limited to, temperature of the magnetic field sensor 300 of FIG. 3, a rate of sequencing around the CVH sensing element 302, peak magnitude of the magnetic field experience by the CVH sensing element 302 as the magnet 320 rotates, and selected current spinning sequence(s) among the various vertical Hall elements.

Differences between the curves 406, 408 can be attributed to changes in the same factors, namely, changes in the temperature, changes in or differences in peak amplitude of the magnetic field experience by the CVH sensing element 302 as the magnet 320 rotates, changes in offset voltages of the vertical Hall elements within the CVH sensing element 302, changes of sensitivities of the various vertical Hall elements, changes in or differences in rates of sequencing around the CVH sensing element 302, and changes in or differences in selected current spinning sequence(s) among the various vertical Hall elements within the CVH sensing element 302. Among these factors, it will be understood that the changes in the temperature can occur at any time. The changes in the peak amplitude of the magnetic field can be influenced by positional changes, i.e., air gap changes, between the magnet 320 and the CVH sensing element 302 of FIG. 3. The changes in the peak amplitude of the magnetic field can also be influenced by mechanical considerations, for example, wear of a bearing or a shaft upon which the magnet 320 rotates. However, the changes in sequencing rates and the changes in current spinning sequences can be fixed, and changed only for different applications of the magnetic field sensor 300. The changes in offset voltages and changes in sensitivity of the vertical Hall elements tend to be influenced by changes in temperature.

In general, it has been determined that the dominant angle error frequency components occur at first and second harmonics of the frequency of the signal 202 (i.e., 304a, 304b). The curves 406, 408 are representative of angle error functions dominated by first and second harmonics of the frequency of the signal 202 (304a, 304b).

The error curves 406, 408 can be mathematically described in the following way.

Mathematically, the angle error represented by the curves 406, 408 can be represented as:

$$\alpha_{err} = \text{OFF} + DC(T) + \sum_{n=1}^{\infty} H_{nA}(T) \cdot \sin(n\alpha + H_{nP}(T)) \quad (1)$$

where:
α=measured angle with error;
n=a variable indicative of an nth harmonic;
T=temperature of magnetic field sensor 300;
OFF=a magnetic target positioning error, i.e., a mechanical misalignment of the CVH sensing element 302 in relation to the magnet 320 of FIG. 3, which is usually independent of the temperature, T;
DC (T)=an average of DC angle error, which is a function of the temperature, T;
$H_{nA}(T)$=an amplitude of an nth-harmonic component of the error, which is a function of the temperature, T; and $H_{nP}(T)$=a phase of the nth-harmonic component, which is a function of the temperature, T.

Other factors described above, other than temperature, which affect the angle error, are not taken into account in equation 1. Namely, the rate of sequencing around the CVH sensing element 302 is not taken into account, the peak amplitude of the magnetic field experienced by the CVH sensing element 302 and generated by the magnet 320 is not taken into account, and the current spinning phase sequence generated by the current spinning sequence selection module 119 is not taken into account in the above expression.

An estimated and quantized angle error (rather than non-quantized error of equation (1)) can be mathematically expressed as:

$$\alpha'_{err} = \text{OFF} + DC_q(T) + \sum_{n=1}^{\infty} H_{nA\_q}(T) \cdot \sin(n\alpha + H_{nP\_q}(T)) \qquad (2)$$

where:

q stands for quantized values.

Yet another way to consider the undesirable offset voltage is given in an equation below:

$$V_1 = \frac{\sqrt{2}\pi}{N^{3/2}} \sigma_V \qquad (3)$$

where:

$\sigma_v$=standard deviation (i.e., variation) of offset voltages for sequentially selected vertical Hall elements, whether taken alone or in combinations by techniques described below;

N=number of vertical Hall elements, whether taken alone or in combinations, sampled in a sequence around a plurality of vertical Hall elements; and $V_1$=magnitude of first harmonic of offset error vector in the signals 308a or 310a of FIG. 3.

From equation (3) it should be apparent that making a variation of offset voltages smaller among a plurality of vertical Hall elements sampled in sequence by techniques described below, tends to make a magnitude of a resulting first harmonic offset error vector smaller. The first harmonic of the offset error vector still adds to the desired magnetic field direction measurement, but results in less error in the magnetic field direction measurement.

Figure 5:
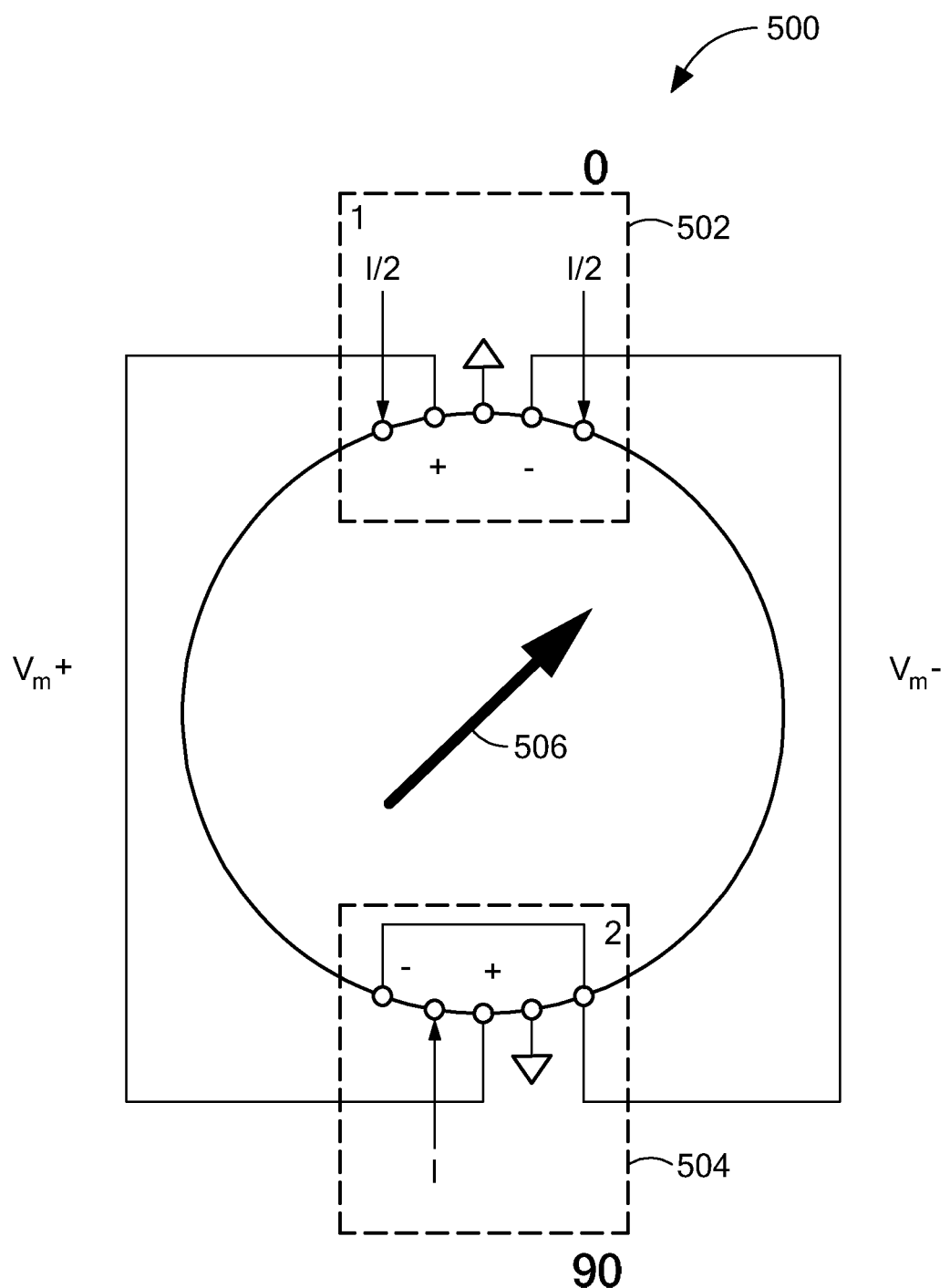
FIG. 5 is a block diagram showing an exemplary prior art coupling of two vertical Hall elements arranged in a circle.

Referring now to FIG. 5, a prior art coupling arrangement 500 of two vertical Hall elements 502, 504 is shown, for which each of the vertical Hall elements 502, 504 has five electrical contacts. This prior art arrangement is described in U.S. Pat. No. 9,547,048, issued Jan. 17, 2017, which is assigned to the assignee of the present invention, and which is incorporated herein in its entirety.

As described in conjunction with the above issued patent, and which will be generally understood, a vertical Hall element with five electrical contacts can be coupled in at least four different ways to a power supply and to an amplifier that follows the vertical Hall element. These different coupling arrangements can be referred to as phases, i.e., phases zero, ninety, one hundred eighty, and two hundred seventy.

A first vertical Hall element 502 is arranged in a zero degree phase arrangement, and a second vertical Hall element 504 is arranged in a ninety degree phase arrangement. Output electrical contacts of the first and second vertical Hall elements are coupled together constructively.

The terms "constructively" and "destructively" are used herein to refer to addition or subtraction, respectively of magnetic field signals.

In some embodiments, the two vertical Hall elements 502, 504, are vertical Hall elements within a CVH sensing element, for example, within the CVH sensing element 12 of FIG. 1 or the CVH sensing element 302 of FIG. 3. In other embodiments, the two vertical Hall element 502, 504 are separately isolated vertical Hall elements, as may be represented by the arrangement of FIG. 1A.

Signs (+, −) used herein are representative of polarities of magnetic field components of output signals, here from the two vertical Hall elements 502, 504 in response to a magnetic field pointed in a direction of an arrow 506. It will be understood that the output signal from an individual vertical Hall element can be a differential signal, wherein one output contact is plus and the other output contact is minus according to the above convention. For a magnetic field in a direction opposite from the arrow 506, the signs of each vertical Hall element reverse.

In response to an exemplary static, i.e., not moving, magnetic field, e.g., 506, output signals from the two vertical Hall elements 502, 504 are DC signals. In response to a moving or rotating magnetic field, output signals from the two vertical Hall elements 502, 504 are changing signals that having a changing AC component. In either case, output signals from the two vertical Hall element 502, 504 each include two components, a desirable external magnetic field component (e.g., Vext, either DC or AC) responsive to the external magnetic field (static or rotating) and an offset component (e.g., Voff), which is always a DC component. The offset voltage DC component changes sign depending upon the connection phase of the vertical Hall element.

In response to the exemplary static magnetic field 506, a differential output signal (across + and − contacts) from the first vertical Hall element 502 is a combination of a first external magnetic field component and a first offset component, Vext1+Voff1. A differential output signal (across + and − contacts) from the second vertical Hall element 504 is a combination of a second external magnetic field component and a second offset component, Vext2−Voff2. Combining the two output signals from the two vertical Hall elements 502, 504 by coupling them together constructively as shown results in a combined differential signal:

$Vm+, Vm- = [(Vext1+Voff1)+(Vext2-Voff2)]/2$ $= (Vext1+Vext2)/2+(Voff1-Voff2)/2.$ Assuming that Voff1 approximately equals Voff2, and assuming that Vext1 approximately equals Vext2, the resulting external magnetic field component of the combined differential signal Vm+, Vm− is approximately Vext, and the offset voltage in the combined signal is approximately canceled to zero. However, because Voff1 does not exactly equal Voff2, a residual small offset, Voffresa, remains.

Factors of two in the above equations are the result of each one of the two vertical Hall elements behaving like a respective voltage source in series with a resistance. When coupled together, two vertical Hall elements tend to provide an output signal that is an average of the two output signals.

Thus, the two vertical Hall element 502, 504 can be coupled as shown, with the connection phases zero and ninety as shown, such that the external magnetic field components add constructively, and such that the offset components approximately cancel.

From FIGS. 2 and 5, it will be appreciated that a lower DC offset voltage for each sequentially selected vertical Hall element ultimately results in a more accurate x-y angle signal generated by a magnetic field sensor, e.g., a more accurate x-y angle signal 314a generated by the magnetic field sensor 300 of FIG. 3.

The couplings shown among the two vertical Hall elements can be accomplished, for example, by way of the sequence switches circuit 304 of FIG. 3 and the current switched circuit 305 of FIG. 3.

In some embodiments, the two vertical Hall elements 502, 504 are current spun as described below. Then, the sequence can repeat for another two groups of five vertical Hall elements, e.g., groups that are shifted by one electrical contact from those shown.

In other embodiments, there is no current spinning and any one of the above four coupling phase combinations can remain static as different groups of five electrical contacts are selected.

While the vertical Hall element 502, 504 are shown to be statically coupled in a particular arrangement, for embodiments in which current spinning is employed, the two vertical Hall elements 502, 504 need only remain ninety degrees apart in the coupling phases as the current spinning progresses. The degree names given to the coupling arrangements are somewhat arbitrary for a vertical Hall element, and are derived from coupling arrangements of a planar Hall element. Thus, the coupling shown in FIG. 5 can be representative of a first current spinning arrangement in four phase current spinning. For a second current spinning arrangement, the vertical Hall element 502 can be arranged in a ninety degree coupling arrangement, and the vertical Hall element 504 can be arranged in a one hundred eighty degree coupling arrangement. For a third current spinning arrangement, the vertical Hall element 502 can be arranged in a one hundred eighty degree coupling arrangement, and the vertical Hall element 504 can be arranged in a two hundred seventy degree coupling arrangement. For a fourth current spinning arrangement of vertical Hall element 502 can be arranged in a two hundred seventy degree coupling arrangement, and the vertical Hall element 504 can be arranged in a zero degree coupling arrangement. For all of the current spinning arrangements, signal output contacts of the vertical Hall elements 502, 504 are coupled together such that a magnetic field components of signals on the signal output contacts add constructively, and offset components of the signals on the signal output contacts cancel each other.

The above current spinning can be achieved, for example, by way of the sequence switches circuit 304 and the current switches circuit 305 of FIG. 3.

For embodiments in which there is no current spinning, once an output sample is achieved by the arrangement shown in FIG. 5, the sequence switches circuit 304 and the current switches circuit 305 can be stepped to a next vertical Hall element, which can be a rotation to the right or a rotation to the left in FIG. 5. For embodiments in which the two vertical Hall element 502, 504 are members of a set of vertical Hall elements within a CVH sensing element, the shift to the right or the left can be by one or more contacts of the CVH sensing element.

The first and second vertical Hall element 502, 504 each employ a respective five electrical contacts. Current flow and equivalent resistances of the five electrical contact vertical Hall elements 502, 504 are described in conjunction with U.S. Pat. No. 9,547,048, issued on Jan. 17, 2017, which is assigned to the assignee of the present invention, and which is incorporated herein by reference in its entirety. In accordance with FIGS. 6-23 below, it will become apparent that vertical Hall elements with other numbers of electrical contacts can provide even lower offset voltages than those of the coupling arrangement 500.

FIGS. 6-23 below describe various ways in which individual vertical Hall elements within a CVH sensing element, e.g., the CVH sensing element 302 of FIG. 3 (or individual elements as in FIG. 1A), can be combined to result in lower offset voltage from any one of the combinations of vertical Hall elements and also a lower offset voltage variation as the CVH sensing element is sequenced to different vertical Hall elements, e.g., a lower variation of the signal 202 of FIG. 2. In other words, offset variation as the magnetic field sensor 300 sequences around the CVH sensing element 302 is reduced, resulting in a higher accuracy indication of a true direction of a magnetic field as reported in the x-y angle signal 314a of FIG. 3.

Current spinning is described in conjunction with FIGS. 6-23, but it will be understood that each one of the arrangements shown in figures below can be used without current spinning, maintaining but one of the indicated phases of current spinning for each step in the CVH element sampling sequence.

Figure 6:
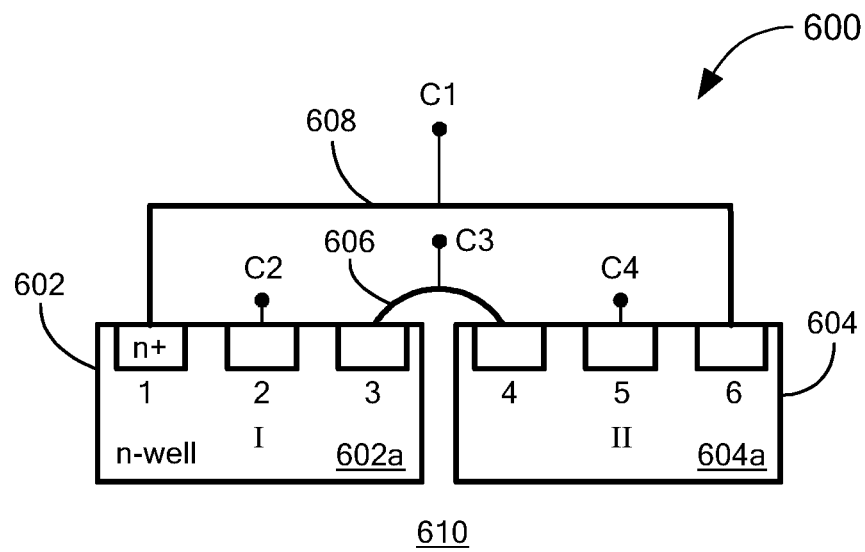
FIG. 6 is a block diagram showing two groups of three electrical contacts of a CVH sensing element as in FIG. 1 or otherwise a plurality of separate elements as in FIG. 1A.

Referring now to FIG. 6, a coupling arrangement 600 can include a first group 602 of electrical contacts having a respective three and only three proximate electrical contacts 1,2,3 and a second group 604 of electrical contacts having a respective three and only three proximate electrical contacts 4, 5, 6. The first and second groups of electrical contacts, 602, 604, having separate N-well regions 602a, 604a, can be arranged in a circle as in FIG. 1A. Each one of the first and second groups of electrical contacts 602, 604 has a respective two outer electrical contacts 1, 3, 4, 6 and a respective center electrical contact 2, 5, resulting in first and second center electrical contacts C2, C4. Together, the first and second groups of electrical contacts 602, 604 provide a plurality of electrical contacts. 1, 2, 3, 4, 5, 6.

The first and second groups of electrical contacts 602, 604 can be coupled together so as to provide four electrical contacts C1, C2, C3, C4 to other electronic elements, e.g., the magnetic field sensor 300 of FIG. 3.

The three electrical contacts 1, 2, 3 of the first group of electrical contacts 602 can be disposed over a first n-type epitaxial region 602a and the three electrical contacts 4, 5, 6 the second group of electrical contacts 604 can be disposed over a second n-type epitaxial region 604a, all disposed over a semiconductor substrate 610.

As indicated by FIG. 1A, in some embodiments, the first and second epitaxial regions 602a, 604a can be separate (e.g., separately isolated). However, as indicated by FIG. 1, in some other embodiments, the first and second epitaxial regions 602a, 604a can be comprised of one contiguous and common n-type epitaxial implant and diffusion region formed as a circular region of a CVH sensing element (see, e.g., 18 of FIG. 1).

The sequence switches circuit 304 and/or the current switches circuit 306 can be operable to select the first group of electrical contacts 602 and the second group of electrical contacts 604, the selected first and second groups of electrical contacts 602, 604 each having three and only three proximate electrical contacts, respectively. The sequence switches circuit and/or the current switches circuit can be operable to couple one of the outer electrical contact of the first group of electrical contacts 602 to one and only one of the outer electrical contacts of the second group of electrical contacts 604, resulting in a first coupled pair 606 of outer electrical contacts 606.

In some embodiments, the sequence switches circuit and/or the current switches circuit can be operable to couple another one of the outer electrical contact of the first group of electrical contacts 602 to another one and only one of the outer electrical contacts of the second group of electrical contacts 604, resulting in a second coupled pair 608 of outer electrical contacts 608.

Figure 7:
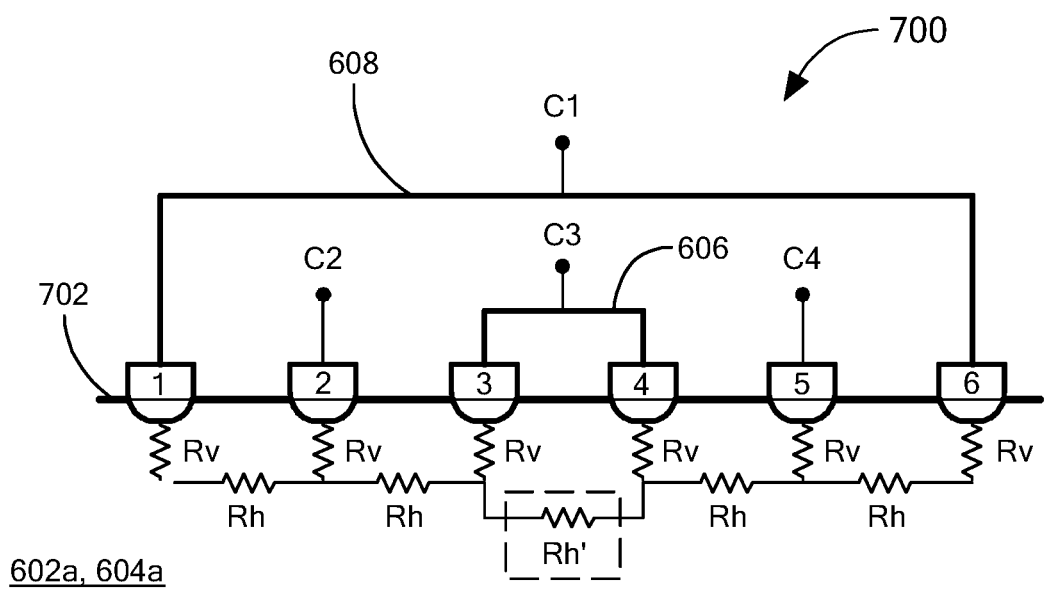
FIG. 7 is a block diagram showing equivalent resistances of the two groups three of electrical contacts of FIG. 6, either as separately isolated elements or within a common implant region of a CVH sensing element.

Referring now to FIG. 7, in which like elements of FIG. 6 are shown having like reference designations, for embodiments having the separate N-well regions 602a, 604a of FIG. 6, a cross section 700 shows the six electrical contacts 1, 2, 3, 4, 5, 6, which can have vertical resistances Rv and horizontal resistances Rh within the epitaxial regions 602a, 604a and between adjacent electrical contacts. It will be appreciated that an electrical current can be imposed between two of the four electrical contacts, e.g., C1, C3, and the other two of the four electrical contacts, e.g., C2, C4, can generate a differential voltage signal related to an amplitude and an angle of an external magnetic field.

For embodiments having instead the one contiguous N-well region of a CVH sensing element as in FIG. 1 instead of the separate N-well regions, e.g., 602a, 604a indicative of the separate element arrangement of FIG. 1A, another horizontal resistance Rh' is shown.

Switches associated with the sequence switches circuit 304 and with the current switches circuit 306 are not shown in the cross section 700, but are shown in conjunction with FIG. 8 below.

Figure 8:
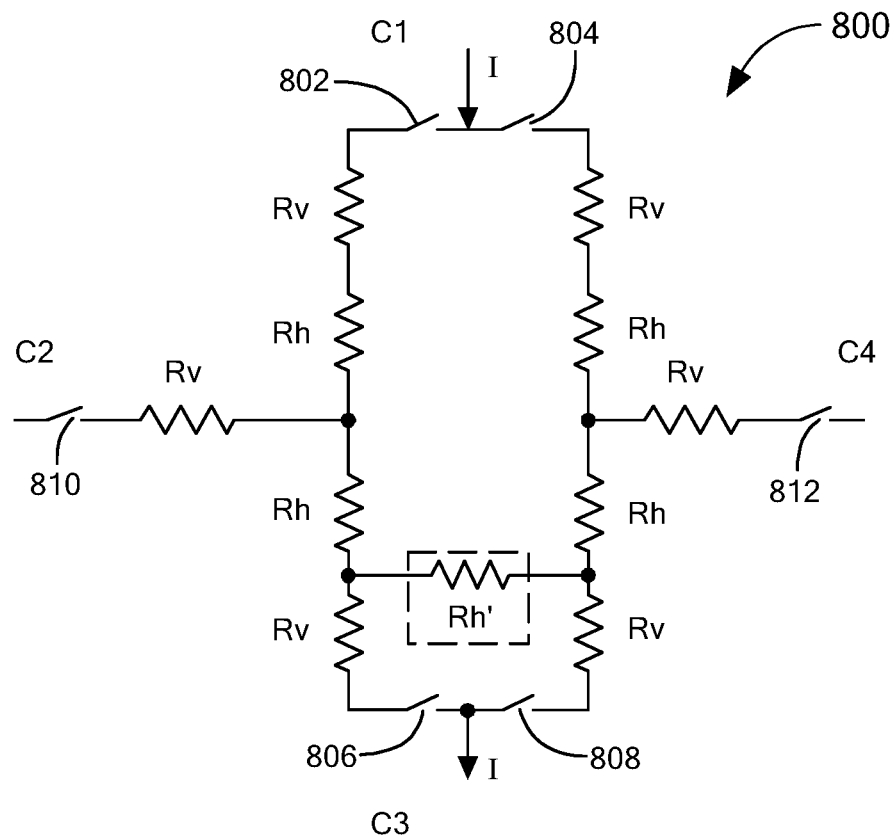
FIG. 8 is a schematic diagram showing an equivalent circuit modelling the two groups of three of electrical contacts of FIG. 6, either as separately isolated elements or within a common implant region of a CVH sensing element.

Referring now to FIG. 8, in which like elements of FIG. 7 are shown having like reference designations, an equivalent circuit 800 can be compared with the cross section 700. Switches 802, 804, 806, 808 can be associated with the current switches circuit 306 of FIG. 3. Switches 810, 812 can be associated with the sequence switches circuit 304 of FIG. 3.

A current I can flow between two electrical contacts, e.g., C1 and C3. A differential voltage signal between two electrical contacts, e.g., C2 and C4, can be generated that is responsive to an external magnetic field.

As described above in conjunction with FIG. 7, for embodiments having instead the one contiguous N-well region of a CVH sensing element as in FIG. 1, the horizontal resistance Rh' is shown.

Arrangements shown in figures below can apply equally well to separate magnetic field sensing elements, or to one or more CVH sensing elements, each having a contiguous N-well region through which current flows. However, arrangements and circuits shown below in FIGS. 9 and 10 have separate N-well regions and do not show extra horizontal resistances such as the horizontal resistance Rh' of FIGS. 7 and 8. Nevertheless, other arrangements comparable to FIGS. 9 and 10 but having one contiguous N-well region as in a CVH sensing element will be understood.

For separate N-well regions as in FIG. 6, which do not have the horizontal resistance Rh', the equivalent circuit 800 is entirely symmetrical, which can result in a particularly low offset voltage. For a contiguous N-well region, as in a CVH sensing element, which has the horizontal resistance Rh', the equivalent circuit is nearly symmetrical and can also result in a low offset voltage.

Arrangements shown and described herein, like the arrangement of FIGS. 6 and 7, are based upon three element vertical Hall element building blocks, e.g., three element or six element vertical Hall element arrangements. In contrast, arrangements described in conjunction with earlier U.S. Pat. No. 9,547,048 are based upon five element vertical Hall element building blocks. It will be recognized that earlier U.S. Pat. No. 9,547,048, e.g., in earlier FIG. 13, did not show "head resistances" comparable the vertical resistances Rv shown herein. Taking head resistances into account, the five contact vertical Hall arrangements of earlier U.S. Pat. No. 9,547,048 can be shown to be less symmetrical than arrangements shown herein, and thus, generally result in a higher offset voltages than embodiments described herein.

Figure 9:
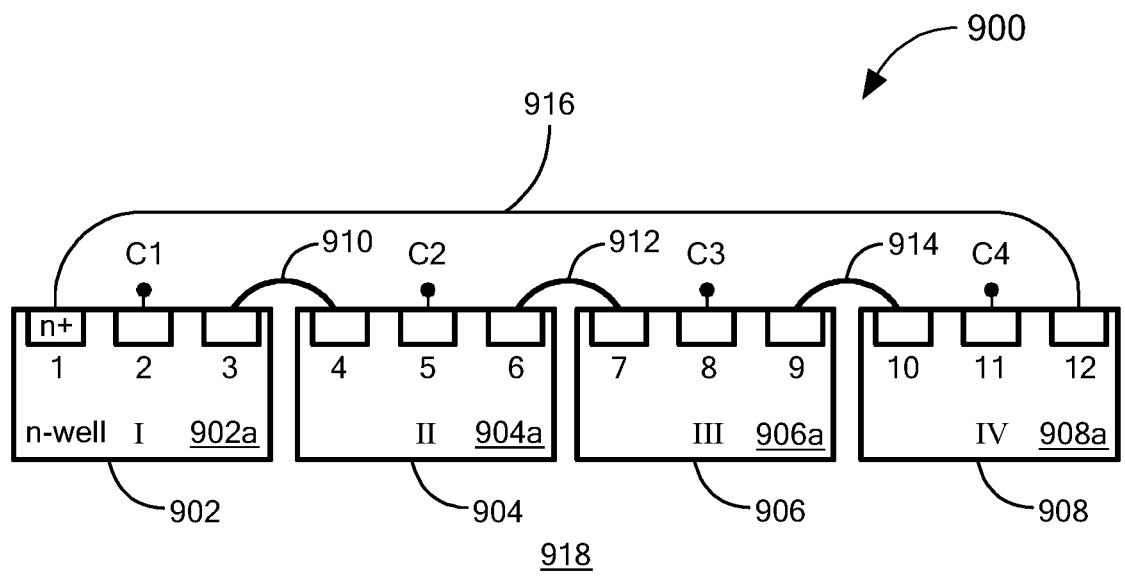
FIG. 9 is a block diagram showing four groups of three electrical (or two groups of six) contacts of a CVH sensing element as in FIG. 1 or otherwise a plurality of separate elements as in FIG. 1A.

Referring now to FIG. 9, a coupling arrangement 900 can include a first group 902 of electrical contacts having a respective three and only three proximate electrical contacts 1, 2, 3 and a second group 904 of electrical contacts having a respective three and only three proximate electrical contacts 4, 5, 6. The first and second groups of electrical contacts 902, 904 are also identified as groups I and II. The first and second groups of electrical contacts, 602, 604 can be arranged in a circle as in FIG. 1 or 1A. Each one of the first and second groups of electrical contacts 902, 904 has a respective two outer electrical contacts 1, 3, 4, 6 and a respective center electrical contact 2, 5, resulting in first and second center electrical contacts C1, C2. Together, the first and second groups of electrical contacts provide a plurality of electrical contacts 1, 2, 3, 4, 5, 6.

The coupling arrangement 900 can also include a third group 906 of electrical contacts having a respective three and only three proximate electrical contacts 7, 8, 9 and a fourth group 908 of electrical contacts having a respective three and only three proximate electrical contacts 10, 11, 12. The third and fourth groups of electrical contacts 906, 908 are also identified as groups III and IV. The third and fourth groups of electrical contacts, 906, 908 can be arranged in the circle as in FIG. 1 or 1A along with the first and second groups of electrical contacts, 902, 904. Each one of the third and fourth groups of electrical contacts 906, 908 has a respective two outer electrical contacts 7, 9, 10, 12 and a respective center electrical contact 8, 11, resulting in third and fourth center electrical contacts C3, C4. Together, the first, second, third, and fourth groups of electrical contacts 902, 904, 906, 908 provide a plurality of electrical contacts 1-12.

The first, second, third and fourth groups of electrical contacts 902, 904, 906, 908 can be coupled together so as to provide four electrical contacts C1, C2, C3, C4 to other electronic elements, e.g., the magnetic field sensor 300 of FIG. 3.

The three electrical contacts 1, 2, 3 of the first group 902 of electrical contacts can be disposed over a first n-type epitaxial region 902a, the three electrical contacts 4, 5, 6 of the second group 904 of electrical contacts can be disposed over a second n-type epitaxial region 904a, the three electrical contacts 7, 8, 9 of the third group of electrical contacts 906 can be disposed over a third n-type epitaxial region 906a, the three electrical contacts 10, 11, 12 of the fourth group of electrical contacts 908 can be disposed over a fourth n-type epitaxial region 908a, all disposed over a semiconductor substrate 918.

As indicated by FIG. 1A, in some embodiments, the first, second, third, and fourth epitaxial regions 902a, 904a, 906a, 908a can be separate (e.g., separately isolated). However, as indicated by FIG. 1, in some embodiments, the first, second, third, and fourth epitaxial regions 902a, 904a, 906a, 908a can be comprised of one contiguous and common n-type epitaxial implant and diffusion region formed as a circular region of a CVH sensing element (see, e.g., 18 of FIG. 1).

Referring briefly to FIG. 3, the sequence switches circuit 304 can be electrically coupled to the plurality of electrical contacts (of the first, second, third, and fourth groups of electrical contacts 902, 904, 906, 908) and disposed over the semiconductor substrate 918. The current switches circuit 306 can be electrically coupled to the plurality of electrical contacts (of the first, second, third, and fourth groups of electrical contacts 902, 904, 906, 908) and disposed over the semiconductor substrate 918.

The sequence switches circuit 304 and/or the current switches circuit 306 can be operable to select the first, second, third, and fourth groups of electrical contacts 902, 904, 906, 908, the selected first, second, third, and fourth groups of electrical contacts 902, 904, 906, 908 each having three and only three proximate electrical contacts, respectively. The sequence switches circuit 304 and/or the current switches circuit 306 can be operable to couple one of the outer electrical contact of the first group of electrical contacts 902 to one and only one of the outer electrical contacts of the second group of electrical contacts 904, resulting in a first coupled pair (e.g., 3, 4) of outer electrical contacts 910.

The sequence switches circuit 304 and/or the current switches circuit 306 are further operable to select third and fourth groups of electrical contacts 906, 908. The selected third and fourth groups of electrical contacts 906, 908 each have three and only three proximate electrical contacts 7, 8, 9, and 10, 11, 12, respectively. The three proximate electrical contacts of the third and fourth groups of electrical contacts 906, 908 can have respective outer electrical contacts 7, 9, 10, 12 and a respective center electrical contact 8, 11 between the outer electrical contacts, resulting in third and fourth center electrical contacts C3, C4. The sequence switches circuit 304 and/or the current switches circuit 306 is operable to couple one of the outer electrical contacts (e.g., 9) of the third group of electrical contacts 906 to one and only one of the outer electrical contacts (e.g., 10) of the fourth group of electrical contacts 908, operable to couple another one of the electrical contacts (e.g., 1) of the first group of electrical contacts 902 to another one of the one and only one of the outer contacts (e.g., 12) of the fourth group of electrical contacts 908, and operable to couple another one of the outer electrical contacts (e.g., 6) of the second group of electrical contacts 904 to another one and only one of the outer electrical contacts (e.g., 7) of the third group of electrical contacts 906, resulting in second, third, and fourth coupled pairs (e.g., 9, 10 and 1, 12 and 6, 7) of outer electrical contacts 914, 916, 912.

Figure 10:
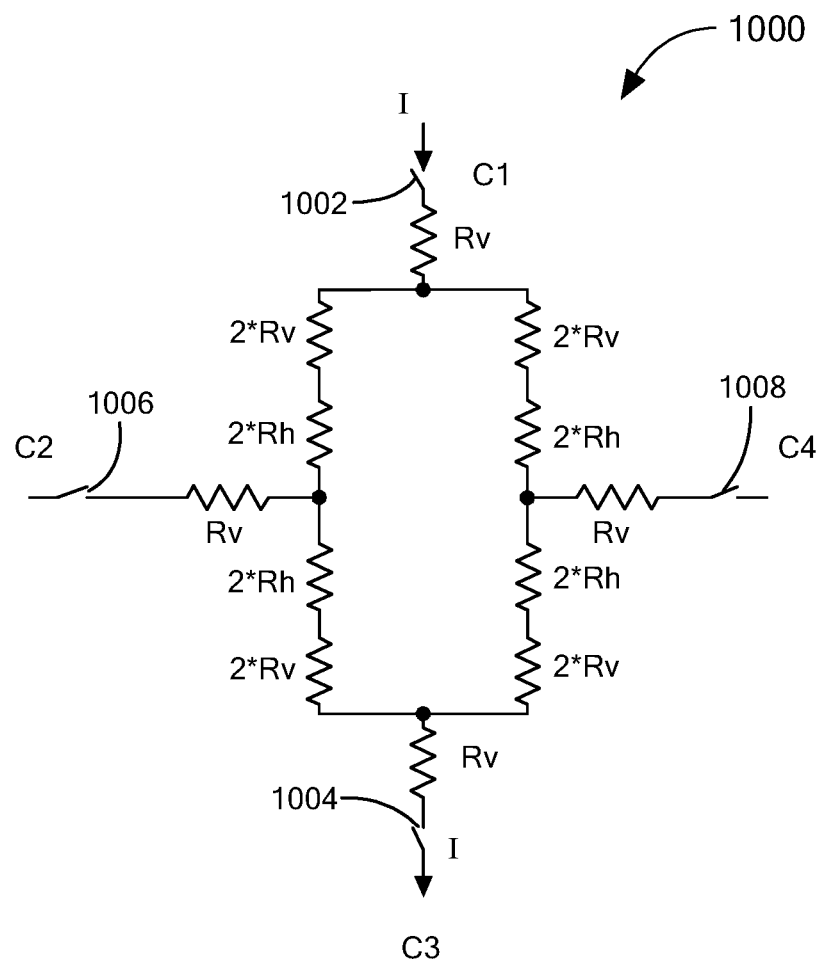
FIG. 10 is a schematic diagram showing an equivalent circuit modelling the four groups of three (or two groups of six) electrical contacts of FIGS. 6 and 7.

Referring now to FIG. 10, in which like elements of FIG. 9 are shown having like reference designations, an equivalent circuit 1000 can be compared with the equivalent circuit 600. Switches 1002, 1004 can be associated with the current switches circuit 306 of FIG. 3.

Switches 1006, 1008 can be associated with the sequence switches circuit 304 of FIG. 3.

A current I can flow between two electrical contacts, e.g., C1 and C3. A differential voltage signal between two electrical contacts, e.g., C2 and C4, can be generated that is responsive to an external magnetic field.

The equivalent circuit 1000 is entirely symmetrical, which can result in a particularly low offset voltage.

Figure 11:
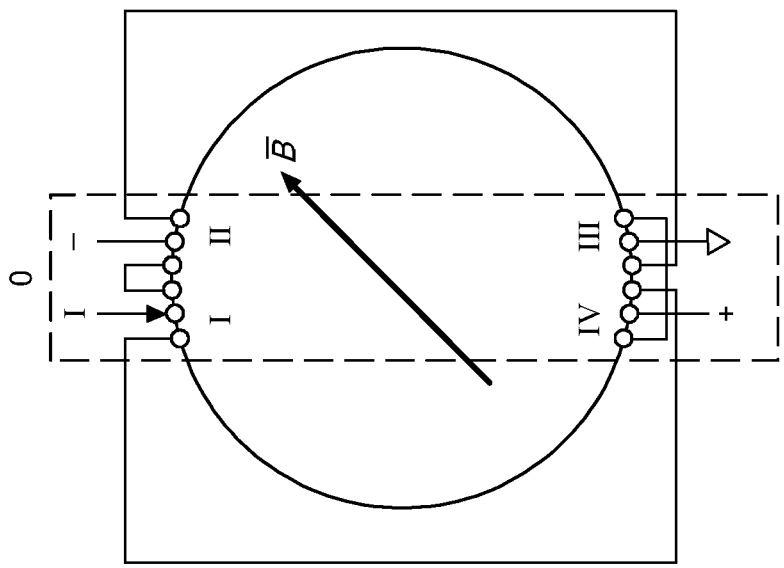
FIGS. 11-11C show four coupling arrangements (phases) of a CVH sensing element as in FIG. 1 (or otherwise separate elements as in FIG. 1A) having four groups of three (or two groups of six) electrical contacts similar to the arrangement of FIG. 9.
Figure 11A:
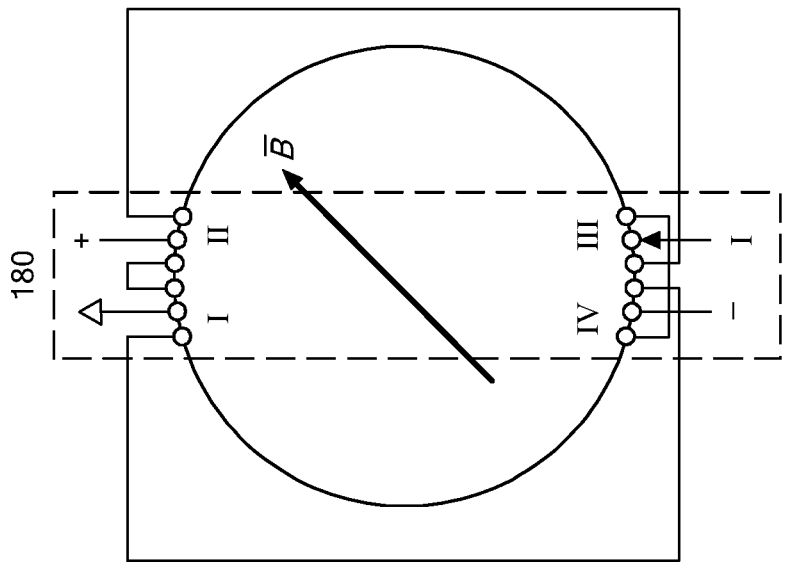
Figure 11C:
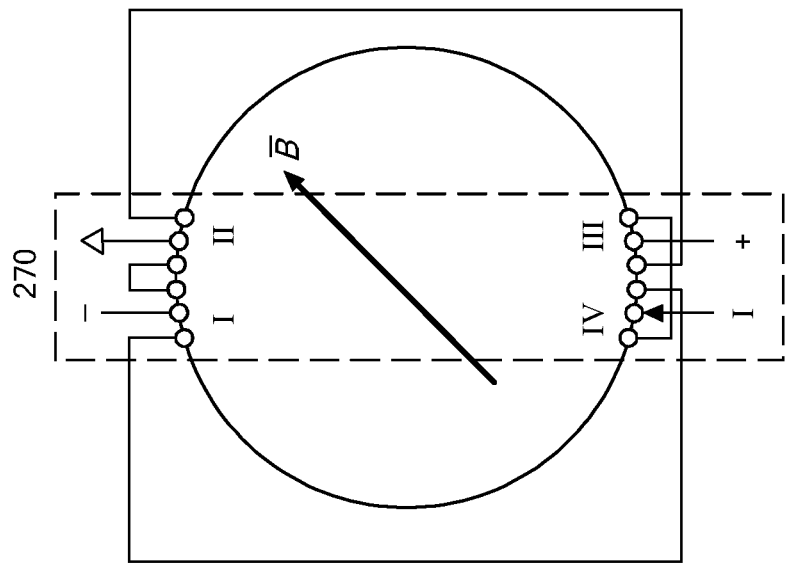
Figure 11B:
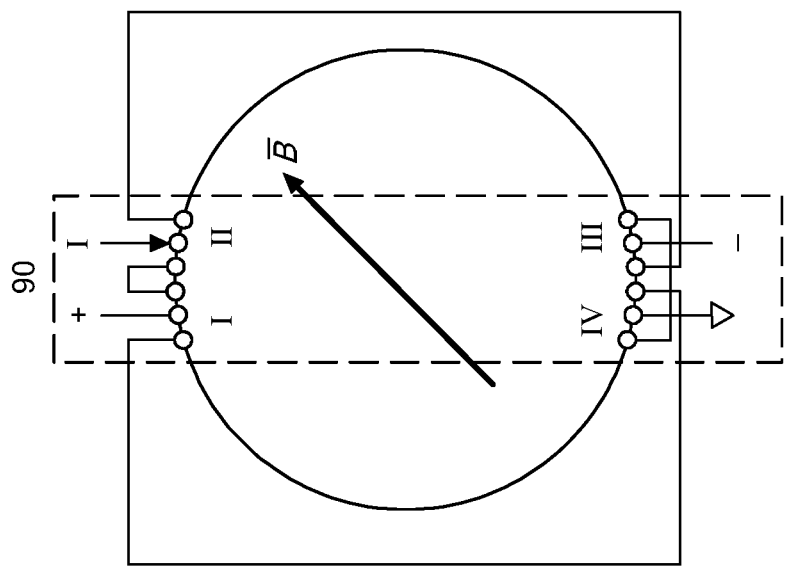

Referring now to FIGS. 11-11C, four groups of electrical contacts I, II, III, and IV are shown in four different coupling arrangements of a CVH sensing element labeled as 0, 90, 180, and 270. Each one of the four couplings 0, 90, 180, and 270 can be described in the same way as the description above in conjunction with FIG. 9, here arranged in a circle. Each coupling remains electrically symmetrical resulting in the substantially the same offset voltage, and element sensitivity of each coupling is substantially the same.

A differential signal, responsive to an external magnetic field, can be generated between electrical contacts labeled + and −. A driving current can be input to the CVH sensing element at an electrical contact labeled I and the current can flow out of the electrical contact terminating with a ground symbol.

Here, center contacts of the first and second groups I, II can be within a first quadrant of a circle and center contacts of the third and fourth groups III, IV can be within a second quadrant of the circle different than the first quadrant.

The first and second groups of electrical contacts I, II can be disposed proximate to each other. The third and fourth groups of electrical contacts III, IV can be disposed proximate to each other. The first and second groups of electrical contacts I, II can be disposed one hundred eighty degrees around the circle from the third and fourth groups of electrical contacts III, IV.

In some embodiments, the four selected groups I, II, III, and IV are selected by the sequence switches circuit 304 and by the current switches circuit 306. During a current spinning operation, couplings to the four selected groups I, II, III, IV are changed sequentially to achieve the four current spinning phases (coupling arrangements), 0, 90, 180, and 270, in any phase sequence. Thereafter, a different four groups of electrical contacts can be selected and the four current spinning phases can be sequentially chosen for each selected four groups of electrical contacts.

In other embodiments, current spinning is not used and any one of the phases, 0, 90, 180, and 270, can remain static as different four groups of electrical contacts are selected.

Current spinning can provide lower average offset voltage than only one selected phase, even though each phase already has a high degree of electrical symmetry and an associated low offset voltage.

Figure 12A:
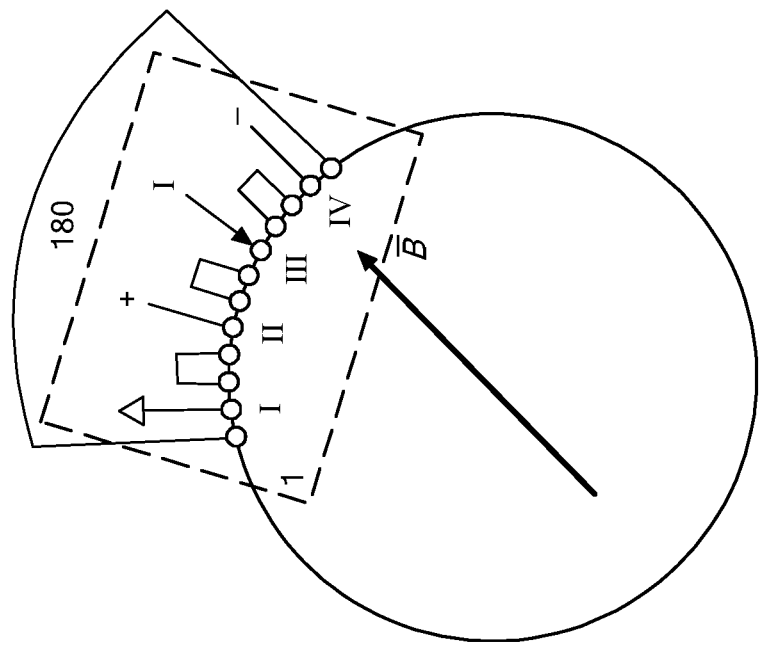
FIGS. 12-12C show another four coupling arrangements (phases) of a CVH sensing element as in FIG. 1 (or otherwise separate elements as in FIG. 1A) having four groups of three (or two groups of six) electrical contacts similar to the arrangement of FIG. 9.
Figure 12:
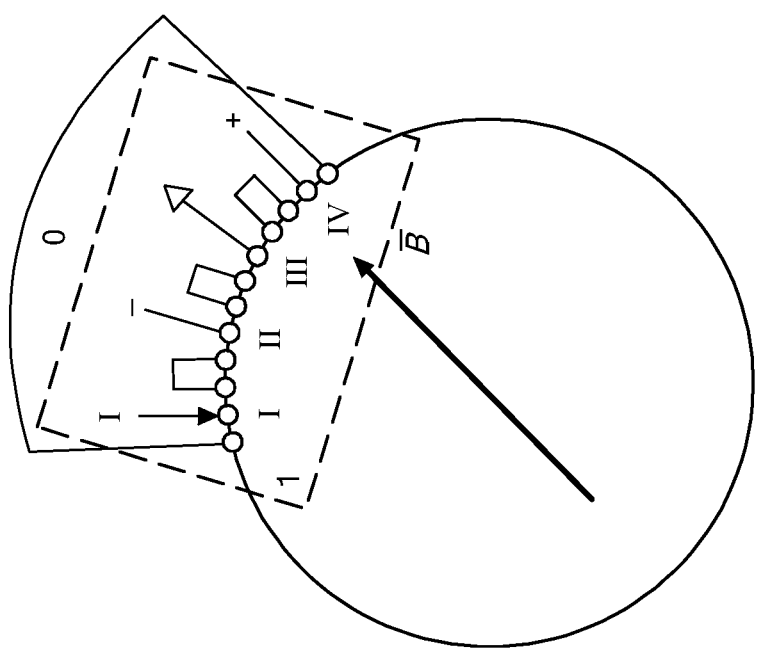
Figure 12C:
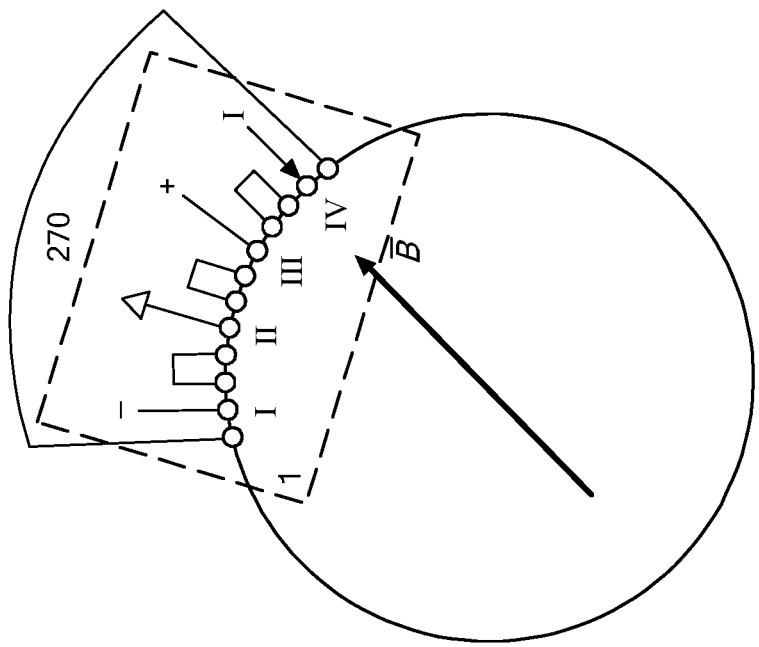
Figure 12B:
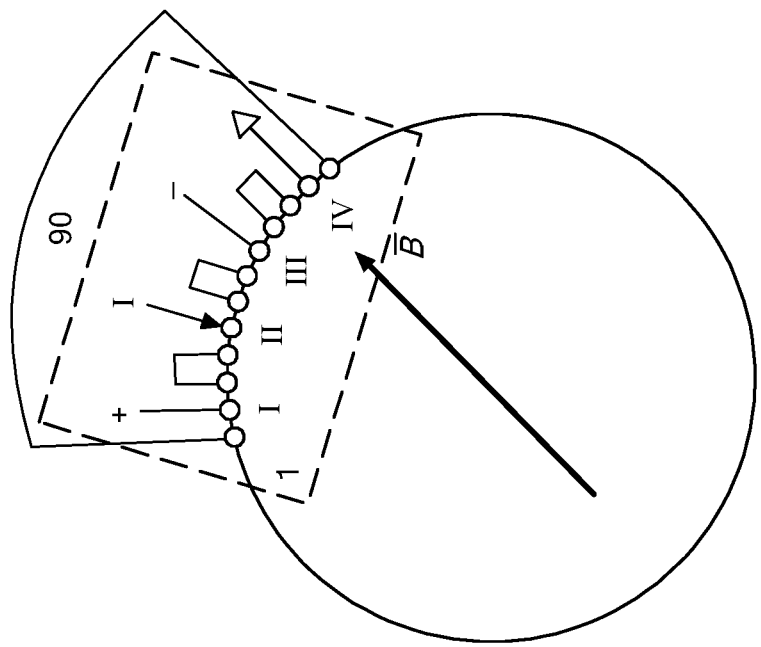

Referring now to FIGS. 12-12C, four groups of electrical contacts I, II, III, and IV are shown in four different coupling arrangements of a CVH sensing element labeled as 0, 90, 180, and 270. Each one of the four groups of electrical contacts I, II, III, and IV can be described in the same way as the description above in conjunction with FIG. 9.

A differential signal, responsive to an external magnetic field, can be generated between electrical contacts labeled + and −. A driving current can be input to the CVH sensing element at an electrical contact labeled I and the current can flow out of the electrical contact terminating with a ground symbol.

Here, center contacts of the first and second groups I, II can be within a first quadrant of a circle and center contacts of the third and fourth groups III, IV can be within the first quadrant.

The first, second, third, and fourth groups of electrical contacts I, II, III, IV can be disposed proximate to each other.

In some embodiments, the four selected groups I, II, III, and IV are selected by the sequence switches circuit 304 and by the current switches circuit 306. During a current spinning operation, couplings to the four selected groups I, II, III, IV are changed sequentially to achieve the four current spinning phases 0, 90, 180, and 270, in any phase sequence. Thereafter, a different four groups of electrical contacts can be selected and the four current spinning phases can be sequentially chosen for each selected four groups of electrical contacts.

In other embodiments, current spinning is not used and any one of the phases, 0, 90, 180, and 270, can remain static as different four groups of electrical contacts are selected.

Current spinning can provide lower average offset voltage than only one selected phase, even though each phase already has a high degree of electrical symmetry and an associated low offset voltage.

Figure 13A:
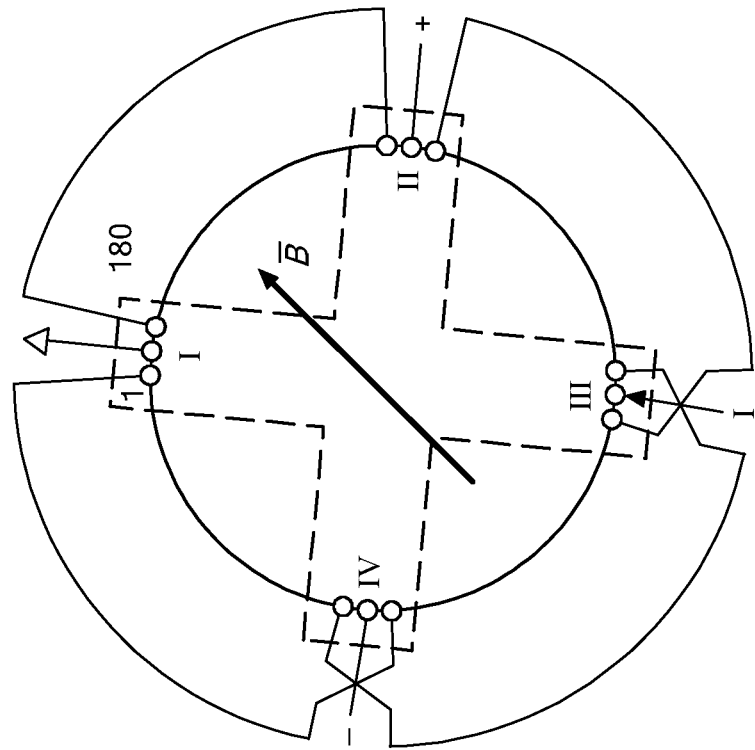
FIGS. 13-13C show another four coupling arrangements (phases) of a CVH sensing element as in FIG. 1 (or otherwise separate elements as in FIG. 1A) having four groups of three (or two groups of six) electrical contacts similar to the arrangement of FIG. 9.
Figure 13:
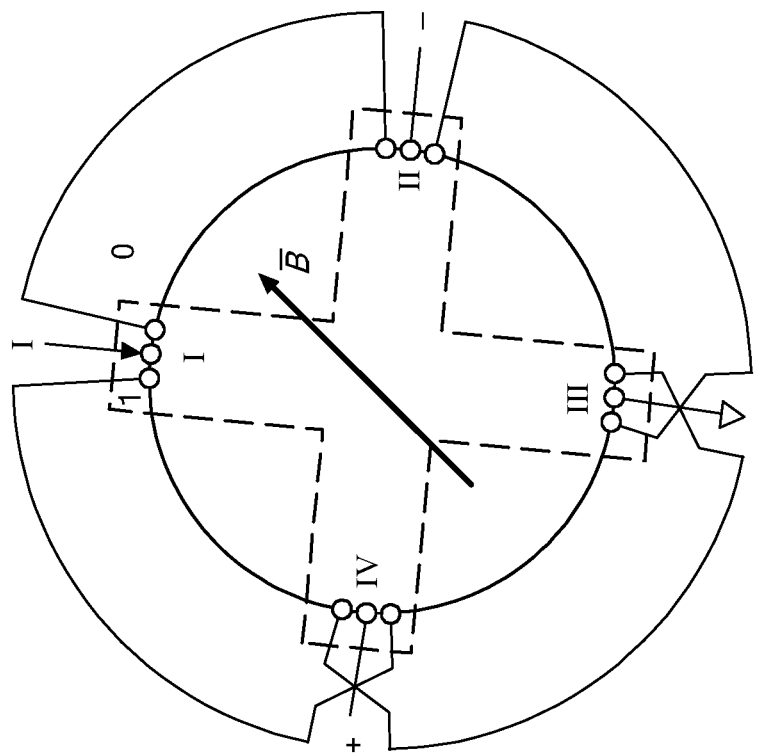
Figure 13C:
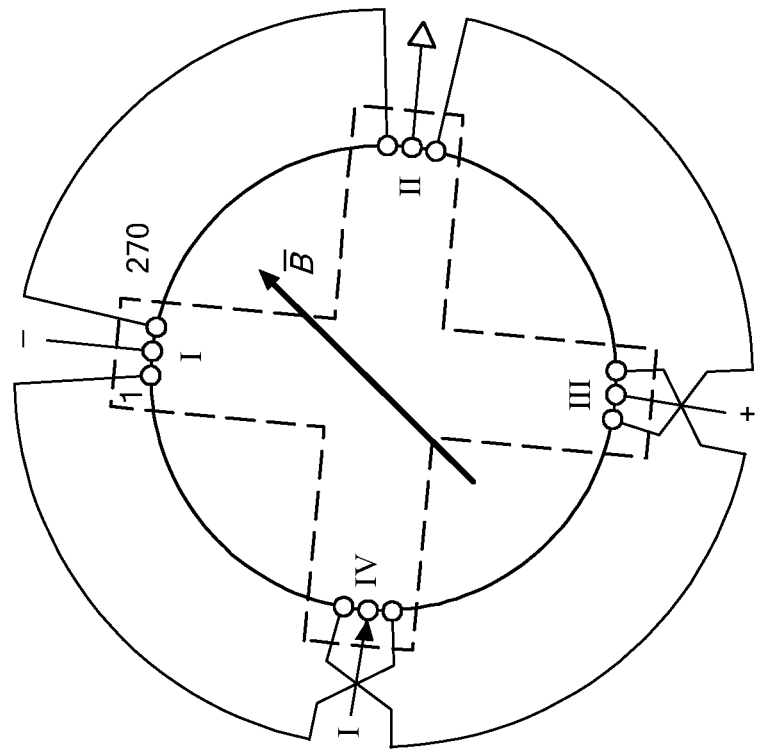
Figure 13B:
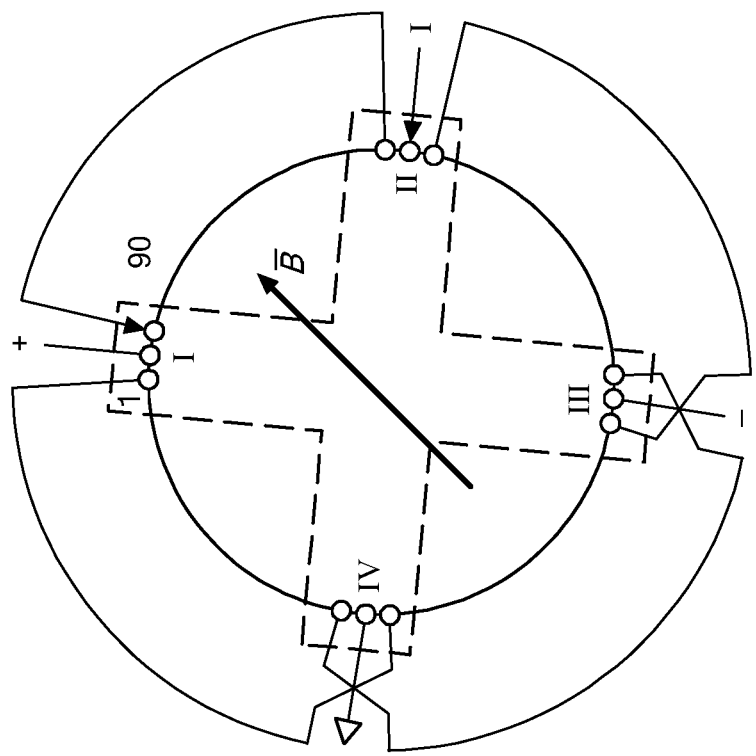

Referring now to FIGS. 13-13C, four groups of electrical contacts I, II, III, IV are shown in four different coupling arrangements of a CVH sensing element labeled as 0, 90, 180, and 270. Each one of the four coupling arrangements 0, 90, 180, 270 can be described in the same way as the description above in conjunction with FIG. 9.

A differential signal, responsive to an external magnetic field, can be generated between electrical contacts labeled + and −. A driving current can be input to the CVH sensing element at an electrical contact labeled I and the current can flow out of the electrical contact terminating with a ground symbol.

Here, center contacts of the first and second groups I, II can be within first and second quadrants of a circle, respectively, and center contacts of the third and fourth groups III, IV can be within the third and fourth quadrants, respectively, each quadrant different than the other quadrants.

First, second, third, and fourth center electrical contacts of the first, second, third, and fourth groups of electrical contacts I, II, III, IV can be disposed in respective ninety degree relationships around the circle.

In some embodiments, the four selected groups I, II, III, and IV are selected by the sequence switches circuit 304 and by the current switches circuit 306. During a current spinning operation, couplings to the four selected groups I, II, III, IV are changed sequentially to achieve the four current spinning phases, 0, 90, 180, 270, in any phase sequence. Thereafter, a different four groups of electrical contacts can be selected and the four current spinning phases can be sequentially chosen for each selected four groups of electrical contacts.

In other embodiments, current spinning is not used and any one of the phases, zero, ninety, one hundred eighty, and two hundred seventy, can remain static as different four groups of electrical contacts are selected.

Current spinning can provide lower average offset voltage than only one selected phase, even though each phase already has a high degree of electrical symmetry and an associated low offset voltage.

Figure 14A:
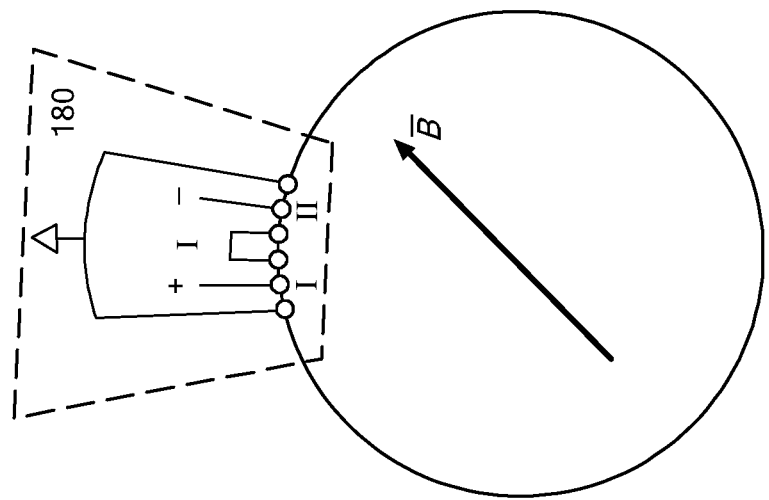
FIGS. 14-14C show four coupling arrangements (phases) of a CVH sensing element as in FIG. 1 (or otherwise separate elements as in FIG. 1A) having two groups of three (or one group of six) electrical contacts similar to the arrangement of FIG. 6.
Figure 14:
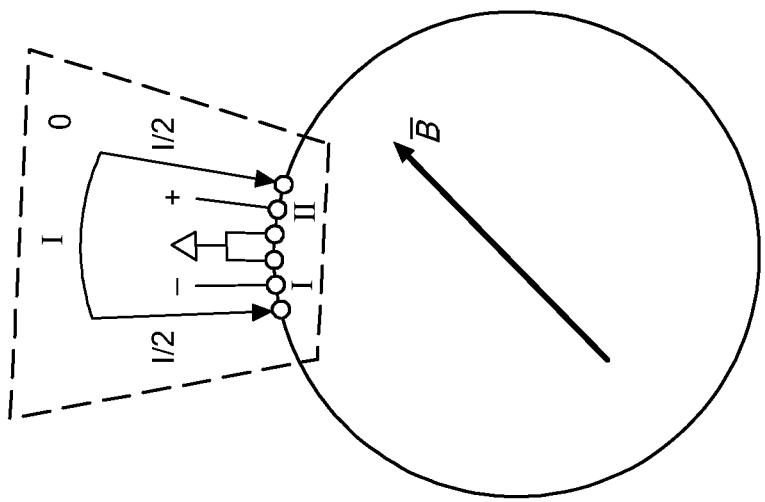
Figure 14C:
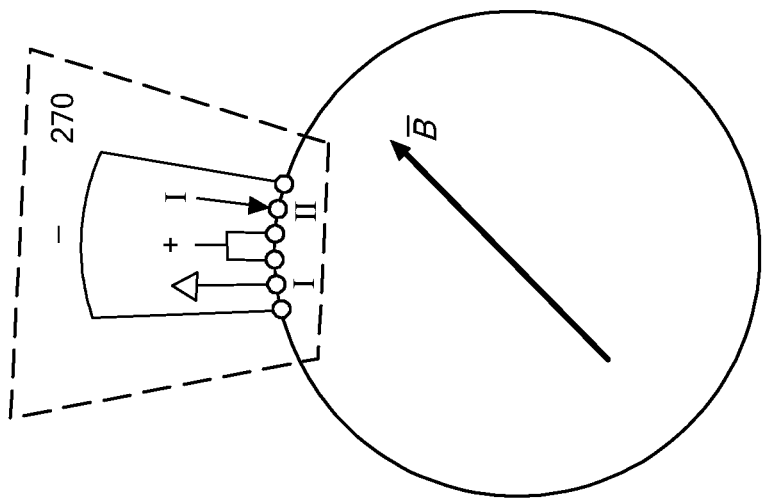
Figure 14B:
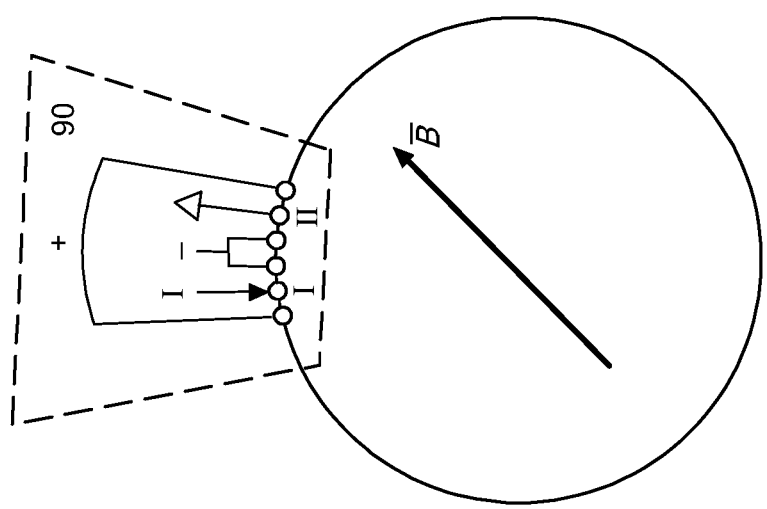

Referring now to FIGS. 14-14C, two groups of electrical contacts I, II are shown in four different coupling arrangements of a CVH sensing element labeled as 0, 90, 180, and 270. Each one of the four coupling arrangements 0, 90, 180, 270 can be described in the same way as the description above in conjunction with FIG. 6.

A differential signal, responsive to an external magnetic field, can be generated between electrical contacts labeled + and −. A driving current can be input to the CVH sensing element at an electrical contact labeled I and the current can flow out of the electrical contact terminating with a ground symbol.

The first and second groups of electrical contacts I, II can be disposed proximate to each other around the circle.

In some embodiments, the first and second selected groups I, II are selected by the sequence switches circuit 304 and by the current switches circuit 306. During a current spinning operation, couplings to the two selected groups I, II are changed sequentially to achieve the four current spinning phases, 0, 90, 180, 270, in any phase sequence. Thereafter, a different two groups of electrical contacts can be selected and the four current spinning phases can be sequentially chosen for each selected four groups of electrical contacts.

In other embodiments, current spinning is not used and any one of the phases, 0, 90, 180, and 270, can remain static as different four groups of electrical contacts are selected.

Current spinning can provide lower average offset voltage than only one selected phase, even though each phase already has a high degree of electrical symmetry and an associated low offset voltage.

Referring now to FIGS. 15-15C, two groups of electrical contacts I, II are shown in four different coupling arrangements of a CVH sensing element labeled as 0, 90, 180, and 270. Each one of the four coupling arrangements 0, 90, 180, 270 can be described in the same way as the description above in conjunction with FIG. 6.

A differential signal, responsive to an external magnetic field, can be generated between electrical contacts labeled + and −. A driving current can be input to the CVH sensing element at an electrical contact labeled I and the current can flow out of the electrical contact terminating with a ground symbol.

The first and second groups of electrical contacts I, II can be disposed at one hundred eight relative degrees to each other around the circle.

In some embodiments, the first and second selected groups I, II are selected by the sequence switches circuit 304 and by the current switches circuit 306. During a current spinning operation, couplings to the two selected groups I, II are changed sequentially to achieve the four current spinning phases, 0, 90, 180, 270, in any phase sequence. Thereafter, a different two groups of electrical contacts can be selected and the four current spinning phases can be sequentially chosen for each selected four groups of electrical contacts.

In other embodiments, current spinning is not used and any one of the phases, 0, 90, 180, and 270, can remain static as different four groups of electrical contacts are selected.

Current spinning can provide lower average offset voltage than only one selected phase, even though each phase already has a high degree of electrical symmetry and an associated low offset voltage.

Figure 16A:
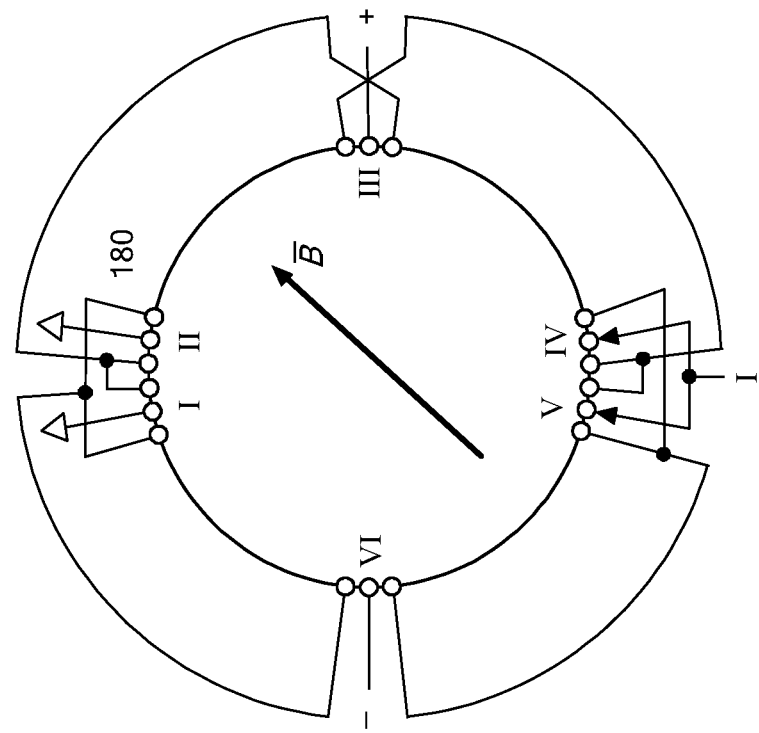
FIGS. 16-16C show four coupling arrangements (phases) of a CVH sensing element as in FIG. 1 (or otherwise separate elements as in FIG. 1A) having six groups of three (or three groups of six, or two groups of six and two groups of three) electrical contacts similar to the arrangement of FIG. 9.
Figure 16:
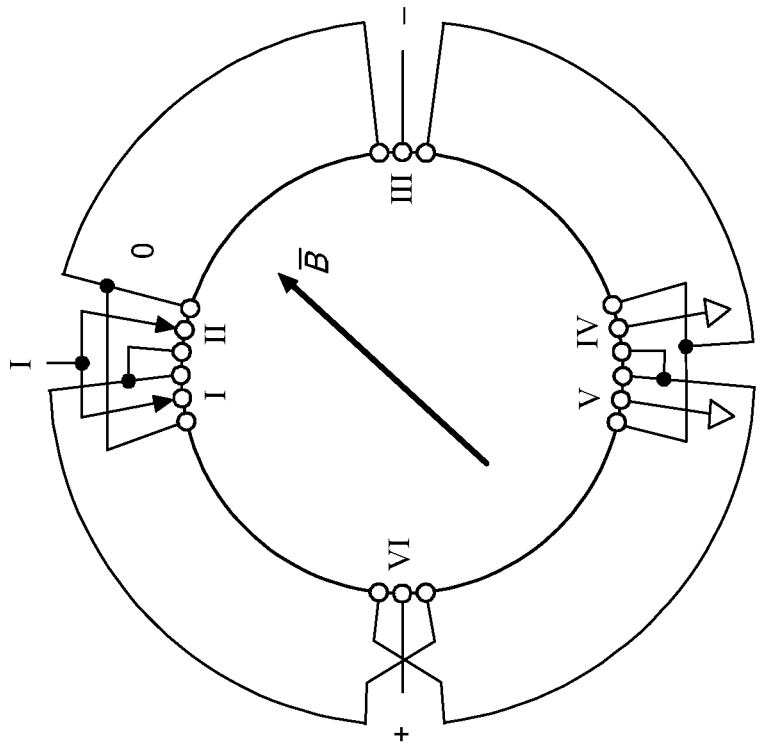
Figure 16C:
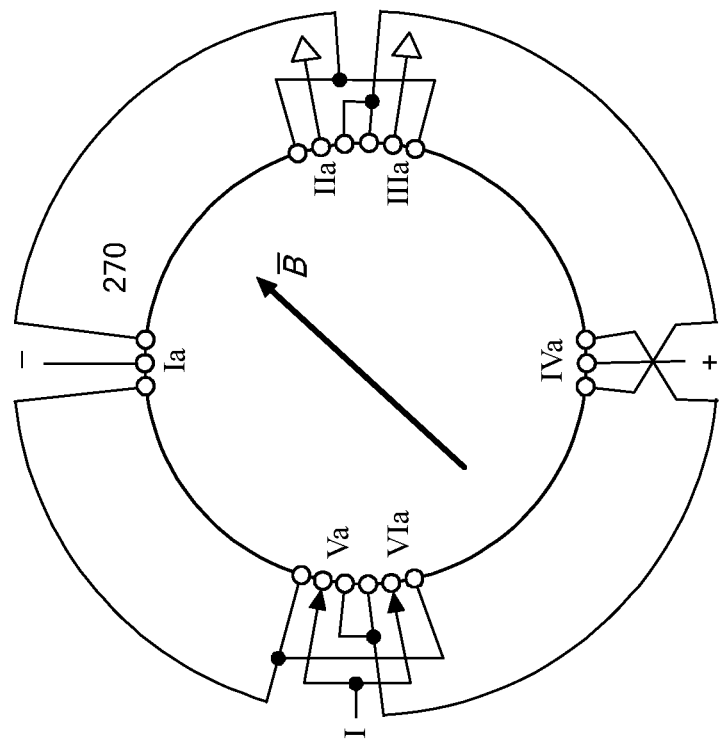
Figure 16B:
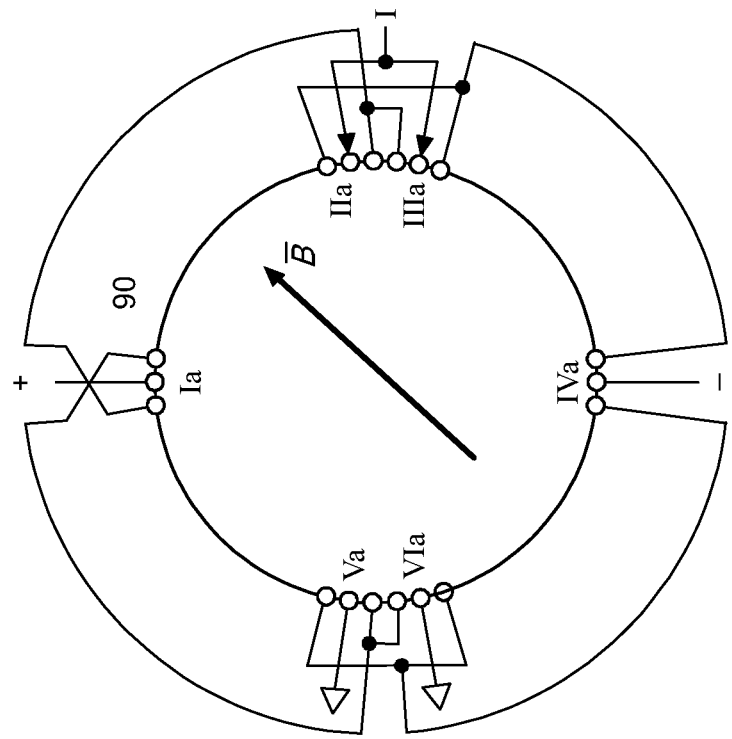

Referring now to FIGS. 16-16C, are shown in four different coupling arrangements of a CVH sensing element labeled as 0, 90, 180, and 270. Each one of the four coupling arrangements 0, 90, 180, 270 can be described in the same way as the description above in conjunction with FIG. 9. Here, multiple three contact vertical Hall elements are connected in parallel for reducing resistance.

A differential signal, responsive to an external magnetic field, can be generated between electrical contacts labeled + and −. A driving current can be input to the CVH sensing element at an electrical contact labeled I and the current can flow out of the electrical contact terminating with a ground symbol.

Four different coupling arrangements can be designated 0, 90, 180, 270. There can be six groups of electrical contacts, I, II, III, IV, V, VI, i.e., a plurality of electrical contacts.

The sequence switches circuit 304 and/or the current switches circuit 306 can be the operable to select a first, second, third, fourth, fifth, and sixth groups of electrical contacts I, II, III, IV, V, VI. The first, second, third, fourth, fifth, and sixth groups of electrical contacts I, II, III, IV, V, VI can each have three and only three proximate electrical contacts, respectively. The three proximate electrical contacts of the first, second, third, fourth, fifth, and sixth groups of electrical contacts I, II, III, IV, V, VI can each have respective outer electrical contacts and a respective center electrical contact between the outer electrical contacts resulting in first, second, third, fourth, fifth, and sixth center electrical contacts. One outer electrical contact of each of the first, second, and third groups of electrical contacts I, II, III can be coupled together. Another one outer electrical contact of each of the first and second groups of electrical contacts I, II can be coupled together and also to an outer electrical contact of the sixth group of electrical contacts IV.

In some embodiments, center contacts of the third and sixth groups of electrical contacts III, VI can be disposed at one hundred eighty degrees relative to each other around the circle. In some embodiments, the first and second groups of electrical contacts, I, II taken together can be disposed at one hundred eighty degrees relative to the fourth and fifth groups of electrical contacts IV, V taken together. In some embodiments, the first and second groups of electrical contacts I, II taken together, the third group of electrical contacts III, the fourth and fifth groups of electrical contacts IV, V taken together, and the sixth group of electrical contacts VI can be disposed ninety degrees relative to each other around the circle.

In some embodiments, the six selected groups of electrical contacts I, II, III, IV, V, VI are selected by the sequence switches circuit 304 and by the current switches circuit 306. During a current spinning operation, couplings to the six selected groups I, II, III, IV, V, VI are changed sequentially to achieve the four current spinning phases, 0, 90, 180, 270, in any phase sequence. Thereafter, a different six groups of electrical contacts can be selected and the four current spinning phases can be sequentially chosen for each selected four groups of electrical contacts.

In other embodiments, current spinning is not used and any one of the phases, 0, 90, 180, 270, can remain static as different four groups of electrical contacts are selected.

Current spinning can provide lower average offset voltage than only one selected phase, even though each phase already has a high degree of electrical symmetry and an associated low offset voltage.

FIGS. 16-16C are a representation of FIG. 9 but using a pair of three contact vertical Hall elements for current driving contacts. However, this arrangement could be extended to N number of parallel three contact vertical Hall elements for the current driving contacts.

FIGS. 17-23 described below show various combinations of the phases of the coupling arrangements of selected ones of FIGS. 11-16, the combinations all within a single CVH sensing element as in FIGS. 1 and 3 (or circle of separate vertical Hall elements as in FIGS. 1A and 3). In contrast, FIGS. 24-26 show various combinations of the phases of the coupling arrangements of selected ones of FIGS. 11-16, the combinations all within two (or more) CVH sensing elements, each as in FIGS. 1 and 3 (or each a circle of separate vertical Hall elements as in FIGS. 1A and 3).

Figure 17:
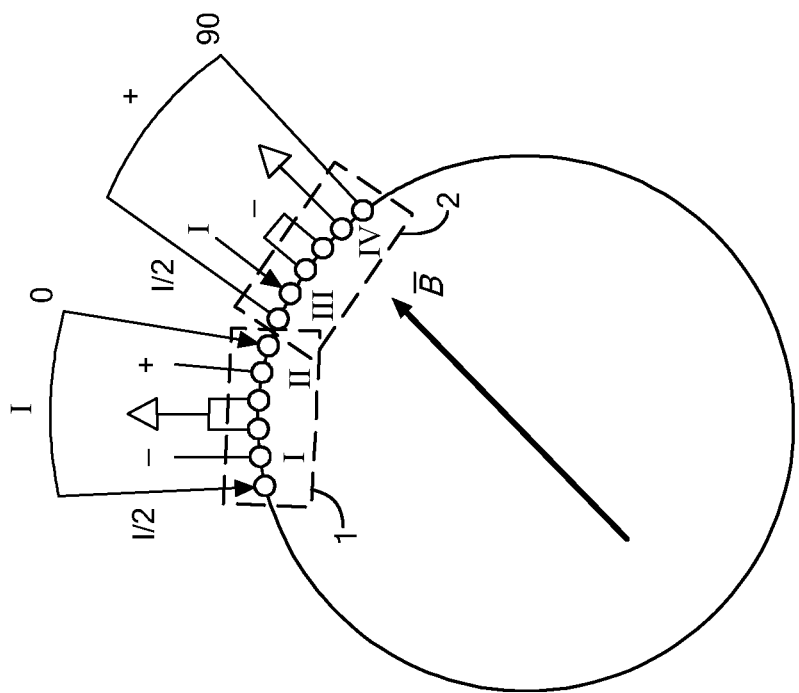
FIG. 17 shows a coupling arrangement (phase) of a CVH sensing element as in FIG. 1 (or otherwise separate elements as in FIG. 1A) having four groups of three (or two groups of six) electrical contacts similar to the arrangement of FIG. 6.

Referring now to FIG. 17, a coupling arrangement of a CVH sensing element can include first, second, third, and fourth groups of electrical contacts I, II, III, IV, each having three electrical contacts comprising a respective two outer contacts and a respective two center contacts, resulting in first, second, third, and fourth center contacts. This arrangement is like two of the arrangements of FIG. 6, but with different current driving arrangements. This arrangement is also like two of the phases, here 0 and 90 degrees, of the arrangements of FIGS. 14-14C. Various combinations of the phase pairs of FIGS. 14-14C are also possible, for example, phase pairs 0, 90, or 90, 180, or 180, 270, or 270, 0.

As with the arrangement of FIGS. 14-14C, the first and second groups of electrical contacts I, II can be disposed proximate to each other around the circle. In some embodiments, the first, second, third, and fourth groups of electrical contacts I, II, III, IV can be disposed proximate to each other around the circle.

Two differential signals, responsive to an external magnetic field, can be generated between two pairs of electrical contacts labeled + and −. The two differential signals can be combined in series or in parallel, depending upon the application, resulting in one combined differential signal.

Regarding the third and fourth groups of electrical contacts III, IV, a driving current can be input to the CVH sensing element at an electrical contact labeled I and the current can flow out of a corresponding electrical contact terminating with a ground symbol. Regarding the first and second groups of electrical contacts I, II, another driving current can be input to the CVH sensing element at two electrical contacts labeled 112, for a total current of I, and the current I can flow out of a coupled pair of corresponding electrical contacts terminating with a ground symbol.

Four phases like the arrangement shown can provide current spinning. Using the phases of FIGS. 14-14C:
phase A: 0 and 90 phases of FIGS. 14-14C as shown
phase B: 90 and 180 phases
phase C: 180 and 270 phases
phase D: 270 and 0 phase In some embodiments, the four selected groups of electrical contacts I, II, III, IV are selected by the sequence switches circuit 304 and by the current switches circuit 306. During a current spinning operation, couplings to the four selected groups I, II, III, IV are changed sequentially to achieve the above four current spinning phases, A, B, C, D, in any phase sequence. Thereafter, a different four groups of electrical contacts can be selected and the four current spinning phases can be sequentially chosen for each selected four groups of electrical contacts.

In other embodiments, current spinning is not used and any one of the phases A, B, C, or D can remain static as different four groups of electrical contacts are selected.

Current spinning can provide lower average offset voltage than only one selected phase, even though each phase already has a high degree of electrical symmetry and an associated low offset voltage.

Figure 18:
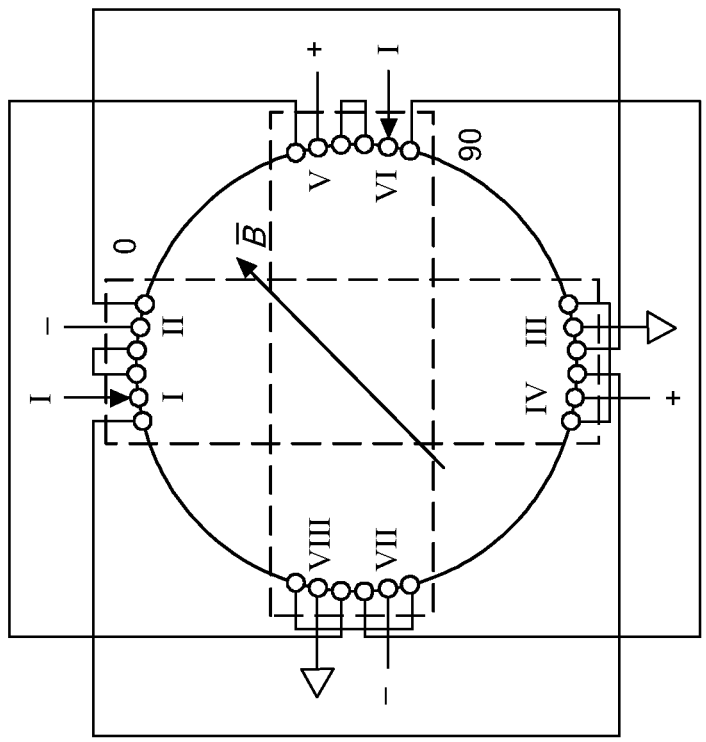
FIG. 18 shows a coupling arrangement (phase) of a CVH sensing element as in FIG. 1 (or otherwise separate elements as in FIG. 1A) having eight groups of three (or four groups of six) electrical contacts similar to the arrangement of FIG. 9.

Referring now to FIG. 18, a coupling arrangement of a CVH sensing element can include eight groups of electrical contacts I, II, III, IV, V, VI, VII, and VIII, each having three electrical contacts comprising a respective two outer contacts and a respective two center contacts, resulting in first, second, third, fourth, fifth, sixth, seventh, and eighth center contacts. This arrangement is like two of the arrangements of FIG. 9 above. This arrangement is also like two of the phases, here 0 and 90 degrees, of the arrangements of FIGS. 11-11C.

As with the arrangement of FIGS. 11-11C, the first and second groups of electrical contacts I, II can be disposed proximate to each other. The third and fourth groups of electrical contacts III, IV can be disposed proximate to each other. The first and second groups of electrical contacts I, II can be disposed one hundred eighty degrees around the circle from the third and fourth groups of electrical contacts III, IV.

Similarly, in some embodiments, the fifth and sixth groups of electrical contacts V, VI can be disposed proximate to each other. The seventh and eighth groups of electrical contacts VII, VIII can be disposed proximate to each other. The fifth and sixth groups of electrical contacts V, VI can be disposed one hundred eighty degrees around the circle from the seventh and eighth groups of electrical contacts VII, VIII. A ninety degree relationship between the pairs, i.e., first and second, the third and fourth, the fifth and sixth, and the seventh and eighth groups of electrical contracts can result.

Regarding the first, second, third, and fourth groups of electrical contacts I, II, III, IV, a first differential signal, responsive to an external magnetic field, can be generated between electrical contacts labeled + and −. Regarding the fifth, sixth, seventh, and eighth groups of electrical contacts V, VI, VII, VIII, a second differential signal, responsive to an external magnetic field, can be generated between electrical contacts labeled + and −. The two differential signals can be combined in series or in parallel, depending upon the application, resulting in one combined differential signal.

Regarding the first, second, third, and fourth groups of electrical contacts I, II, III, IV, a driving current I can be input to the CVH sensing element at an electrical contact labeled I and the current I can flow out of a corresponding electrical contact terminating with a ground symbol. Regarding the fifth, sixth, seventh, and eighth groups of electrical contacts V, VI, VII, VIII, another driving current I can be input to the CVH sensing element at an electrical contact labeled I and the current I can flow out of a corresponding electrical contacts terminating with a ground symbol.

Four phases like the arrangement shown can provide current spinning. Using the phases of FIGS. 11-11C:
  phase A: 0 and 90 phases of FIGS. 11-11C as shown
  phase B: 90 and 180 phases
  phase C: 180 and 270 phases
  phase D: 270 and 0 phase In some embodiments, the eight selected groups of electrical contacts I, II, III, IV, V, VI, VII, VIII are selected by the sequence switches circuit 304 and by the current switches circuit 306. During a current spinning operation, couplings to the eight selected groups contacts I, II, III, IV, V, VI, VII, VIII are changed sequentially to achieve the above four current spinning phases, A, B, C, D, in any phase sequence. Thereafter, a different eight groups of electrical contacts can be selected and the four current spinning phases can be sequentially chosen for each selected four groups of electrical contacts.

In other embodiments, current spinning is not used and any one of the phases A, B, C, or D can remain static as different four groups of electrical contacts are selected.

Current spinning can provide lower average offset voltage than only one selected phase, even though each phase already has a high degree of electrical symmetry and an associated low offset voltage.

Figure 19:
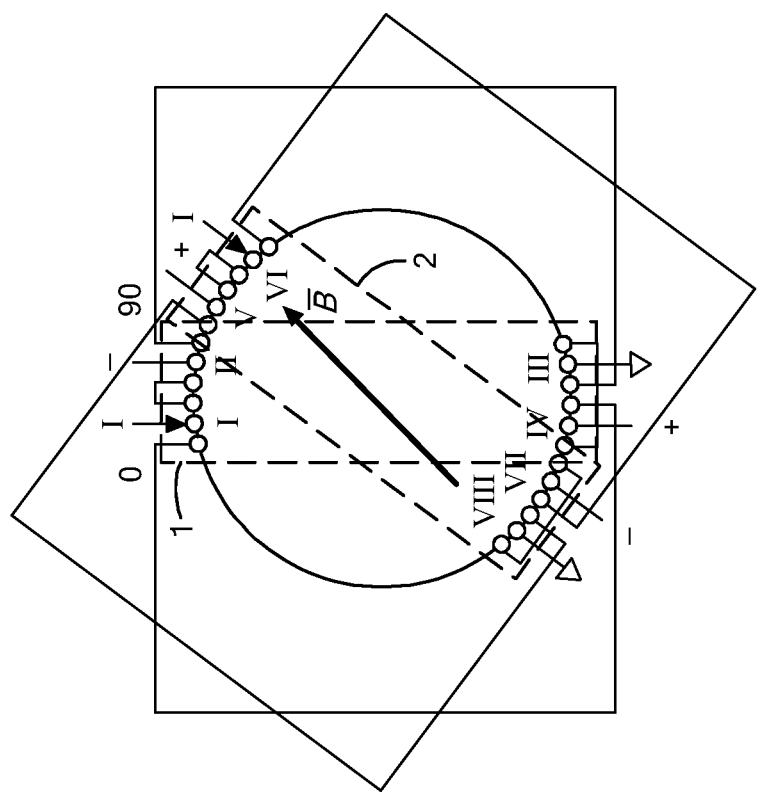
FIG. 19 shows a coupling arrangement (phase) of a CVH sensing element as in FIG. 1 (or otherwise separate elements as in FIG. 1A) having eight groups of three (or four groups of six) electrical contacts similar to the arrangement of FIG. 9.

Referring now to FIG. 19, like the coupling arrangement of FIG. 18, a coupling arrangement of a CVH sensing element can include eight groups of electrical contacts I, II, III, IV, V, VI, VII, and VIII, each having three electrical contacts comprising a respective two outer contacts and a respective two center contacts, resulting in first, second, third, fourth, fifth, sixth, seventh, and eighth center contacts. This arrangement is like four of the arrangements of FIG. 9 above. This arrangement is also like two of the phases, here 0 and 90 degrees, of the arrangements of FIGS. 11-11C.

As with the arrangement of FIGS. 11-11C, the first and second groups of electrical contacts I, II can be disposed proximate to each other. The third and fourth groups of electrical contacts III, IV can be disposed proximate to each other. The first and second groups of electrical contacts I, II can be disposed one hundred eighty degrees around the circle from the third and fourth groups of electrical contacts III, IV.

Similarly, in some embodiments, the fifth and sixth groups of electrical contacts V, VI can be disposed proximate to each other. The seventh and eighth groups of electrical contacts VII, VIII can be disposed proximate to each other. The fifth and sixth groups of electrical contacts V, VI can be disposed proximate to the seventh and eighth groups of electrical contacts VII, VIII. In some embodiments, the eight groups of electrical contacts I, II, III, IV, V, VI, VI, VII, VIII can each be disposed proximate to another one of the eight groups, respectively.

Other characteristics of the eight groups can be the same as or similar to the coupling arrangement of FIG. 18.

Figure 20:
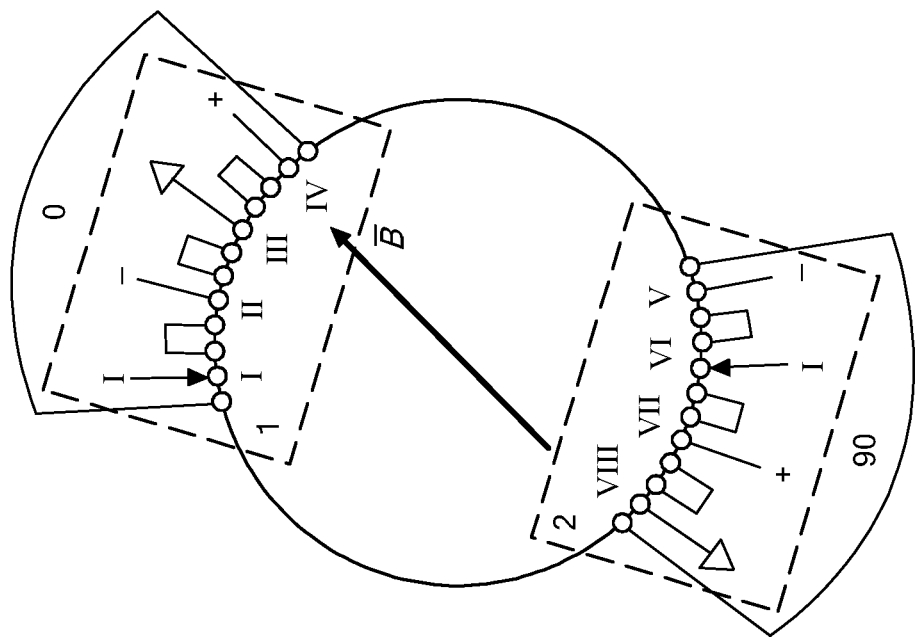
FIG. 20 shows a coupling arrangement (phase) of a CVH sensing element as in FIG. 1 (or otherwise separate elements as in FIG. 1A) having eight groups of three (or four groups of six) electrical contacts similar to the arrangement of FIG. 9.

Referring now to FIG. 20, a coupling arrangement of a CVH sensing element can include eight groups of electrical contacts I, II, III, IV, V, VI, VII, and VIII, each having three electrical contacts comprising a respective two outer contacts and a respective two center contacts, resulting in first, second, third, fourth, fifth, sixth, seventh, and eighth center contacts. This arrangement is like four of the arrangements of FIG. 9 above. This arrangement is also like two of the phases, here 0 and 90 degrees, of the arrangements of FIGS. 12-12C.

The first, second, third, and fourth groups of electrical contacts I, II, III, IV can be disposed proximate to each other. The fifth, sixth, seventh, and eighth groups of electrical contacts V, VI, VII, VIII can be disposed next to each other. In some embodiments, the first, second, third, and fourth groups of electrical contacts I, II, III, IV can be disposed in a one hundred eighty degree relationship to the fifth, sixth, seventh, and eighth groups of electrical contacts V, VI, VII, VIII.

Regarding the first, second, third, and fourth groups of electrical contacts I, II, III, IV, a first differential signal, responsive to an external magnetic field, can be generated between electrical contacts labeled + and −. Regarding the fifth, sixth, seventh, and eighth groups of electrical contacts V, VI, VII, VIII, a second differential signal, responsive to an external magnetic field, can be generated between electrical contacts labeled + and −. The two differential signals can be combined in series or in parallel, depending upon the application, resulting in on combined differential signal.

Regarding the first, second, third, and fourth groups of electrical contacts I, II, III, IV, a driving current I can be input to the CVH sensing element at an electrical contact labeled I and the current I can flow out of a corresponding electrical contact terminating with a ground symbol. Regarding the fifth, sixth, seventh, and eighth groups of electrical contacts V, VI, VII, VIII, another driving current I can be input to the CVH sensing element at an electrical contact labeled I and the current I can flow out of a corresponding electrical contacts terminating with a ground symbol.

Four phases like the arrangement shown can provide current spinning. Using the phases of FIGS. 12-12C:
  phase A: 0 and 90 phases of FIGS. 11-11C as shown
  phase B: 90 and 180 phases
  phase C: 180 and 270 phases
  phase D: 270 and 0 phase In some embodiments, the eight selected groups of electrical contacts I, II, III, IV, V, VI, VII, VIII are selected by the sequence switches circuit 304 and by the current switches circuit 306. During a current spinning operation, couplings to the eight selected groups contacts I, II, III, IV, V, VI, VII, VIII are changed sequentially to achieve the above four current spinning phases, A, B, C, D, in any phase sequence. Thereafter, a different eight groups of electrical contacts can be selected and the four current spinning phases can be sequentially chosen for each selected four groups of electrical contacts.

In other embodiments, current spinning is not used and any one of the phases A, B, C, or D can remain static as different four groups of electrical contacts are selected.

Current spinning can provide lower average offset voltage than only one selected phase, even though each phase already has a high degree of electrical symmetry and an associated low offset voltage.

Figure 21:
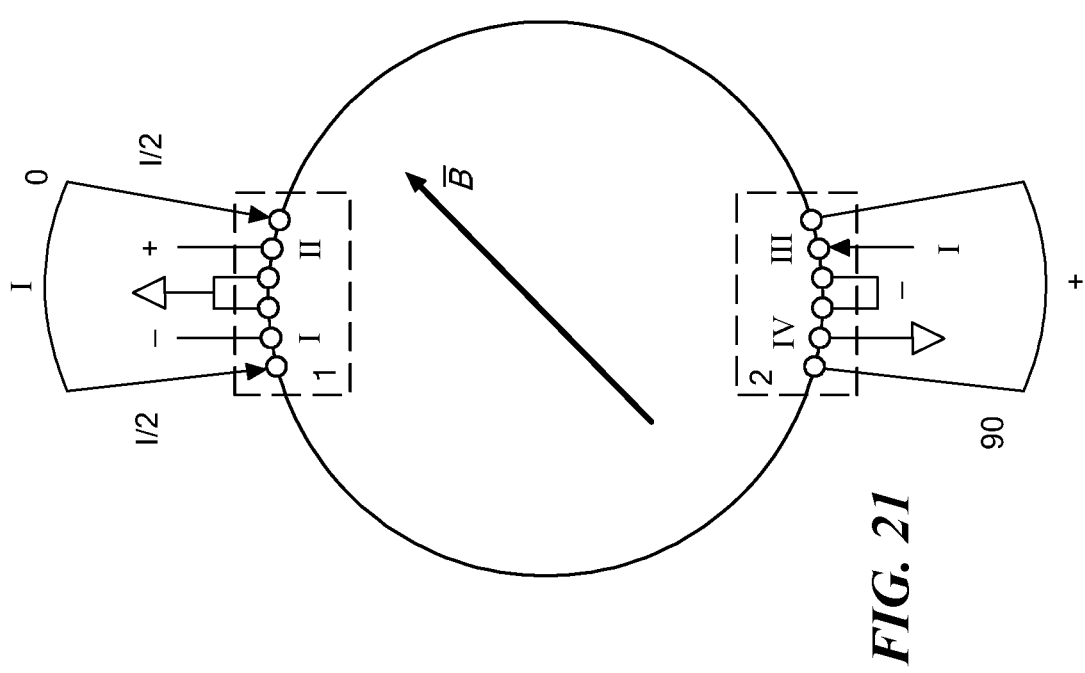
FIG. 21 shows a coupling arrangement (phase) of a CVH sensing element as in FIG. 1 (or otherwise separate elements as in FIG. 1A) having four groups of three (or two groups of six) electrical contacts similar to the arrangement of FIG. 6.

Referring now to FIG. 21, a coupling arrangement of a CVH sensing element can include first, second, third, and fourth groups of electrical contacts I, II, III, IV, each having three electrical contacts comprising a respective two outer contacts and a respective two center contacts, resulting in first, second, third, and fourth center contacts. This arrangement is like two of the arrangements of FIG. 6 above. This arrangement is also like two of the phases, here 0 and 90 degrees, of the arrangements of FIGS. 14-14C, and also similar to the coupling arrangement of FIG. 17.

As with the arrangement of FIGS. 14-14C, the first and second groups of electrical contacts I, II can be disposed proximate to each other around the circle. In some embodiments, the third, and fourth groups of electrical contacts III, IV can be disposed proximate to each other around the circle. In some embodiments, the first and second groups of electrical contacts I, II can be disposed in a one hundred eighty degree relationship to the third, and fourth groups of electrical contacts III, IV.

Two differential signals, responsive to an external magnetic field, can be generated between two pairs of electrical contacts labeled + and −. The two differential signals can be combined in series or in parallel, depending upon the application, resulting in one combined differential signal.

Regarding the third and fourth groups of electrical contacts III, IV, a driving current can be input to the CVH sensing element at an electrical contact labeled I and the current can flow out of a corresponding electrical contact terminating with a ground symbol. Regarding the first and second groups of electrical contacts I, II, another driving current can be input to the CVH sensing element at two electrical contacts labeled 112, for a total current of I, and the current I can flow out of a coupled pair of corresponding electrical contacts terminating with a ground symbol.

Four phases like the arrangement shown can provide current spinning. Using the phases of FIGS. 14-14C:
phase A: 0 and 90 phases of FIGS. 14-14C as shown
phase B: 90 and 180 phases
phase C: 180 and 270 phases
phase D: 270 and 0 phase In some embodiments, the four selected groups of electrical contacts I, II, III, IV are selected by the sequence switches circuit 304 and by the current switches circuit 306. During a current spinning operation, couplings to the four selected groups I, II, III, IV are changed sequentially to achieve the above four current spinning phases, A, B, C, D, in any phase sequence. Thereafter, a different four groups of electrical contacts can be selected and the four current spinning phases can be sequentially chosen for each selected four groups of electrical contacts.

In other embodiments, current spinning is not used and any one of the phases A, B, C, or D can remain static as different four groups of electrical contacts are selected.

Current spinning can provide lower average offset voltage than only one selected phase, even though each phase already has a high degree of electrical symmetry and an associated low offset voltage.

Figure 22:
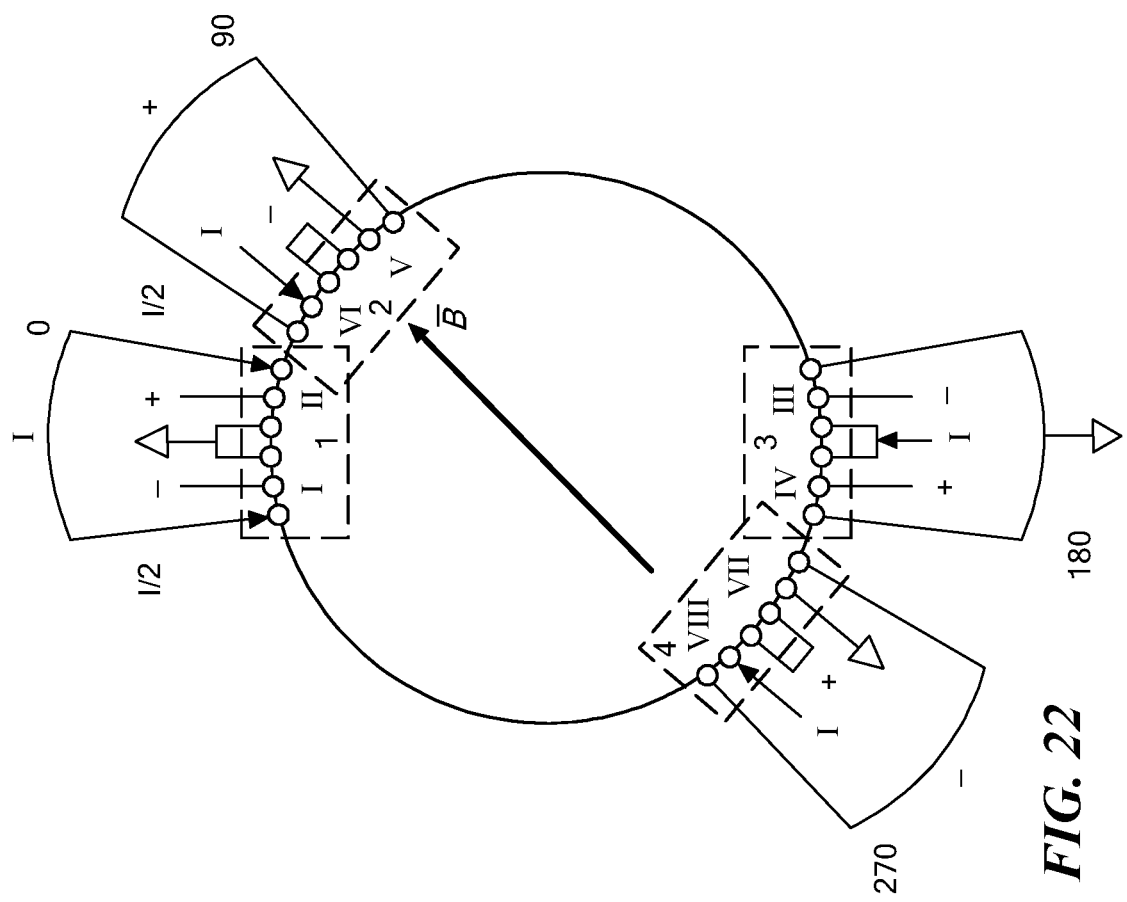
FIG. 22 shows a coupling arrangement (phase) of a CVH sensing element as in FIG. 1 (or otherwise separate elements as in FIG. 1A) having eight groups of three (or four groups of six) electrical contacts similar to the arrangement of FIG. 6.

Referring now to FIG. 22, a coupling arrangement of a CVH sensing element can include eight groups of electrical contacts I, II, III, IV, V, VI, VII, and VIII, each having three electrical contacts comprising a respective two outer contacts and a respective two center contacts, resulting in first, second, third, fourth, fifth, sixth, seventh, and eighth center contacts. This arrangement is like four of the arrangements of FIG. 6 above. This arrangement is also like all four of the phases, here 0, 90, 180, 270 degrees, of the arrangements of FIGS. 14-14C.

As with the arrangements of FIGS. 14-14C, the first and second groups of electrical contacts I, II can be disposed proximate to each other. The third and fourth groups of electrical contacts III, IV can be disposed proximate to each other. The first and second groups of electrical contacts I, II can be disposed one hundred eighty degrees around the circle from the third and fourth groups of electrical contacts III, IV.

Similarly, in some embodiments, the fifth and sixth groups of electrical contacts V, VI can be disposed proximate to each other. The seventh and eighth groups of electrical contacts VII, VIII can be disposed proximate to each other. The fifth and sixth groups of electrical contacts V, VI can be disposed one hundred eighty degrees around the circle from the seventh and eighth groups of electrical contacts VII, VIII. The first, second, fifth and sixth groups of electrical contacts, I, II, V, VI can be disposed proximate to each other. The third, fourth, seventh, and eighth groups of electrical contacts III, IV, VII, VIII can be disposed proximate to each other.

Regarding the first, second, third, and fourth groups of electrical contacts I, II, III, IV, a first differential signal, responsive to an external magnetic field, can be generated between electrical contacts labeled + and −. Regarding the fifth, sixth, seventh, and eighth groups of electrical contacts V, VI, VII, VIII, a second differential signal, responsive to an external magnetic field, can be generated between electrical contacts labeled + and −. The two differential signals can be combined in series or in parallel, depending upon the application, resulting in one combined differential signal.

Regarding the first, second, third, and fourth groups of electrical contacts I, II, III, IV, a driving current I can be input to the CVH sensing element at an electrical contact labeled I and the current I can flow out of a corresponding electrical contact terminating with a ground symbol. Regarding the fifth, sixth, seventh, and eighth groups of electrical contacts V, VI, VII, VIII, another driving current I can be input to the CVH sensing element at an electrical contact labeled I and the current I can flow out of a corresponding electrical contacts terminating with a ground symbol.

Four phases like the arrangement shown can provide current spinning. Using the phases of FIGS. 14-14C:
phase A: 0 and 90 phases of FIGS. 14-14C as shown
phase B: 90 and 180 phases
phase C: 180 and 270 phases
phase D: 270 and 0 phase In some embodiments, the eight selected groups of electrical contacts I, II, III, IV, V, VI, VII, VIII are selected by the sequence switches circuit 304 and by the current switches circuit 306. During a current spinning operation, couplings to the eight selected groups contacts I, II, III, IV, V, VI, VII, VIII are changed sequentially to achieve the above four current spinning phases, A, B, C, D, in any phase sequence. Thereafter, a different eight groups of electrical contacts can be selected and the four current spinning phases can be sequentially chosen for each selected four groups of electrical contacts.

In other embodiments, current spinning is not used and any one of the phases A, B, C, or D can remain static as different four groups of electrical contacts are selected.

Current spinning can provide lower average offset voltage than only one selected phase, even though each phase already has a high degree of electrical symmetry and an associated low offset voltage.

Figure 23:
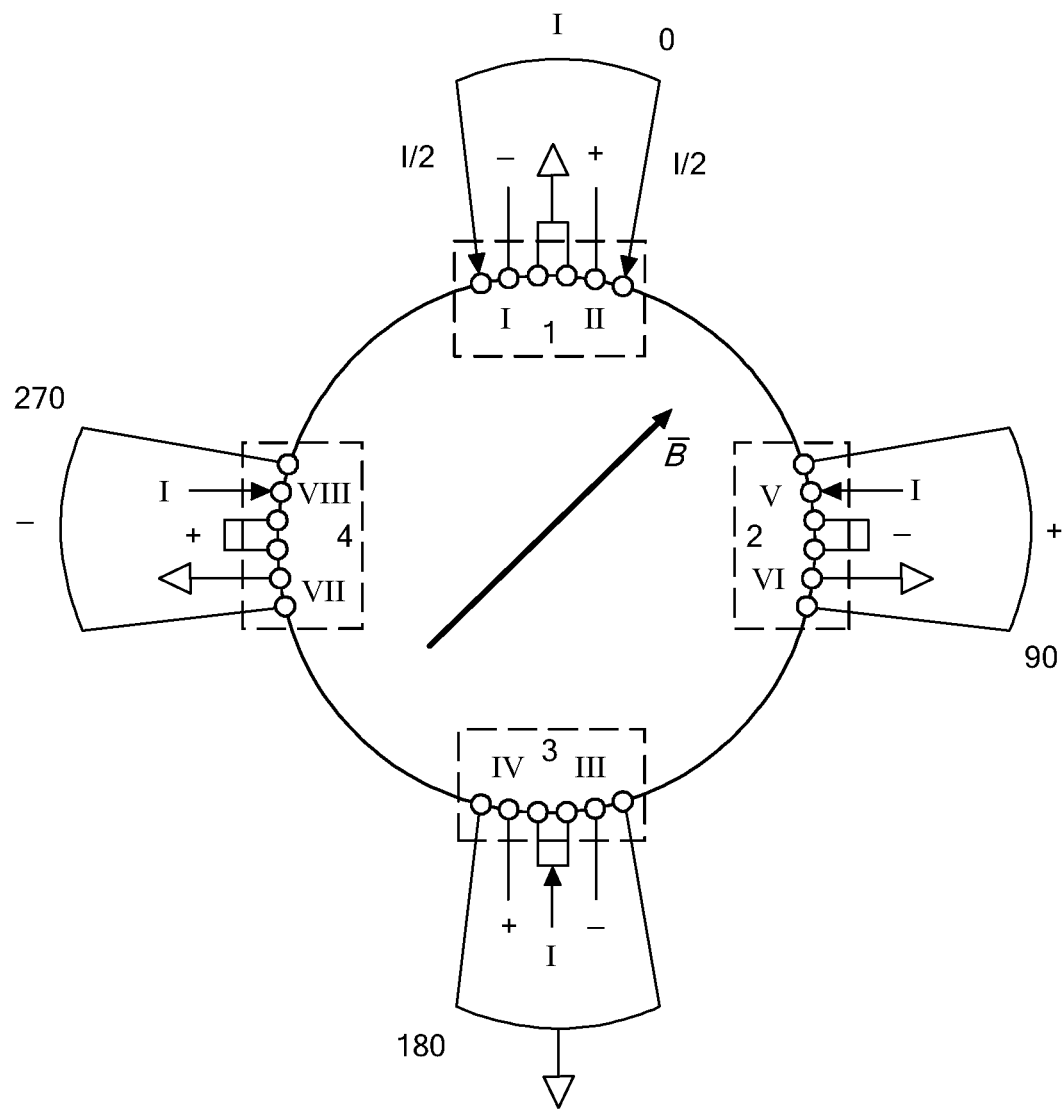
FIG. 23 shows a coupling arrangement (phase) of a CVH sensing element as in FIG. 1 (or otherwise separate elements as in FIG. 1A) having eight groups of three (or four groups of six) electrical contacts similar to the arrangement of FIG. 6.
Figure 24:
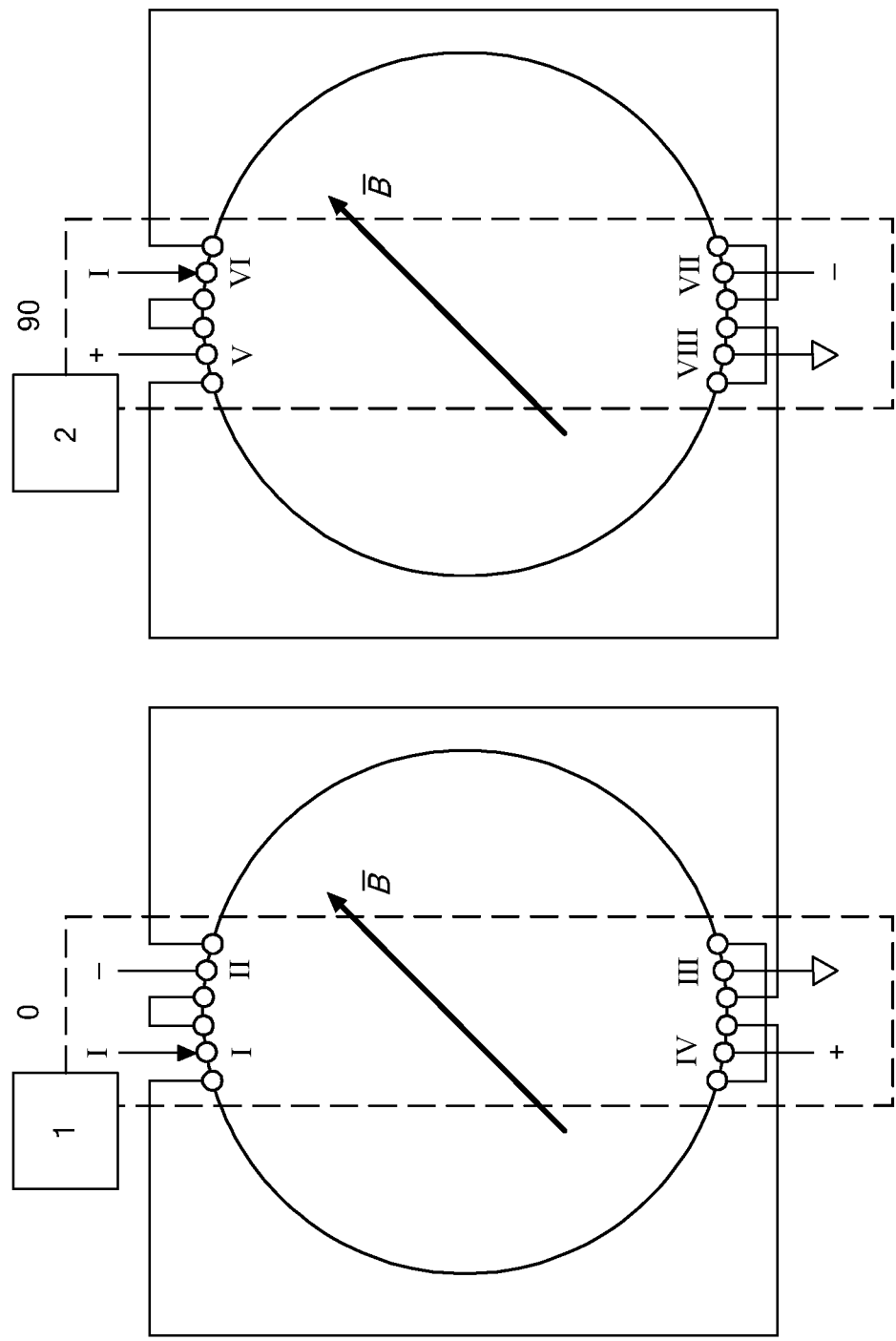
FIG. 24 shows a coupling arrangement (phase) of two CVH sensing elements as in FIG. 1 (or otherwise separate elements as in FIG. 1A), each having eight groups of three (or four groups of six) electrical contacts similar to the arrangement of FIG. 9.

Referring now to FIG. 23, a coupling arrangement is similar to the coupling arrangement of FIG. 22, again having all four of the coupling arrangements of FIGS. 14-14C. However, unlike the coupling arrangement of FIG. 22, the first, second, third, and fourth groups of electrical contacts I, II, III, IV can be disposed in ninety degree relationships to each other around the circle. Other aspects of the coupling arrangement of FIG. 22 apply to the coupling arrangement of FIG. 23.

Referring now to FIG. 24, a coupling arrangement of two CVH sensing elements can include a first and second CVH sensing elements having phases 0 and 90, respectively, of FIGS. 11-11C. This coupling arrangement is similar to the coupling arrangement of FIG. 18, which has the combination of phases within only one CVH sensing element.

A coupling arrangement of a first CVH sensing element can include a first four groups of electrical contacts I, II, III, IV. A coupling arrangement of a second CVH sensing element can include another four groups of electrical contacts V, VI, VII, and VIII. Each group of electrical contacts can have three electrical contacts comprising a respective two outer contacts and a respective two center contacts, resulting in first, second, third, fourth, fifth, sixth, seventh, and eighth center contacts. This arrangement is like two of the arrangements of FIG. 9 above, here disposed in two separate independent circles (e.g., separate CVH elements). This arrangement is also like two of the phases, here 0 and 90 degrees, of the arrangements of FIGS. 11-11C.

As with the arrangement of FIGS. 11-11C, on the first CVH sensing element, the first and second groups of electrical contacts I, II can be disposed proximate to each other. The third and fourth groups of electrical contacts III, IV can be disposed proximate to each other. The first and second groups of electrical contacts I, II can be disposed one hundred eighty degrees around the circle from the third and fourth groups of electrical contacts III, IV.

Similarly, in some embodiments, on the second CVH sensing element, the fifth and sixth groups of electrical contacts V, VI can be disposed proximate to each other. The seventh and eighth groups of electrical contacts VII, VIII can be disposed proximate to each other. The fifth and sixth groups of electrical contacts V, VI can be disposed one hundred eighty degrees around the circle from the seventh and eighth groups of electrical contacts VII, VIII.

Regarding the first, second, third, and fourth groups of electrical contacts I, II, III, IV, a first differential signal, responsive to an external magnetic field, can be generated between electrical contacts labeled + and −. Regarding the fifth, sixth, seventh, and eighth groups of electrical contacts V, VI, VII, VIII, a second differential signal, responsive to an external magnetic field, can be generated between electrical contacts labeled + and −. The two differential signals can be combined in series or in parallel, depending upon the application resulting in one combined differential signal.

Regarding the first, second, third, and fourth groups of electrical contacts I, II, III, IV, a driving current I can be input to the CVH sensing element at an electrical contact labeled I and the current I can flow out of a corresponding electrical contact terminating with a ground symbol. Regarding the fifth, sixth, seventh, and eighth groups of electrical contacts V, VI, VII, VIII, another driving current I can be input to the CVH sensing element at an electrical contact labeled I and the current I can flow out of a corresponding electrical contacts terminating with a ground symbol.

Four phases like the arrangement shown can provide current spinning. Using the phases of FIGS. 11-11C:
  phase A: 0 and 90 phases of FIGS. 11-11C as shown
  phase B: 90 and 180 phases
  phase C: 180 and 270 phases
  phase D: 270 and 0 phase In some embodiments, the eight selected groups of electrical contacts I, II, III, IV, V, VI, VII, VIII are selected by the sequence switches circuit 304 and by the current switches circuit 306. During a current spinning operation, couplings to the eight selected groups contacts I, II, III, IV, V, VI, VII, VIII are changed sequentially to achieve the above four current spinning phases, A, B, C, D, in any phase sequence. Thereafter, a different eight groups of electrical contacts can be selected and the four current spinning phases can be sequentially chosen for each selected four groups of electrical contacts.

In other embodiments, current spinning is not used and any one of the phases A, B, C, or D can remain static as different four groups of electrical contacts are selected.

Current spinning can provide lower average offset voltage than only one selected phase, even though each phase already has a high degree of electrical symmetry and an associated low offset voltage.

Referring now to FIG. 25, a coupling arrangement of two CVH sensing elements can include a first and second CVH sensing elements having phases 0 and 90, respectively, of FIGS. 13-13C.

A coupling arrangement of a first CVH sensing element can include a first four groups of electrical contacts I, II, III, IV. A coupling arrangement of a second CVH sensing element can include another four groups of electrical contacts V, VI, VII, and VIII. Each group of electrical contacts can have three electrical contacts comprising a respective two outer contacts and a respective two center contacts, resulting in first, second, third, fourth, fifth, sixth, seventh, and eighth center contacts. This arrangement is like two of the arrangements of FIG. 9 above, here disposed in two separate independent circles (e.g., separate CVH elements). This arrangement is also like two of the phases, here 0 and 90 degrees, of the arrangements of FIGS. 13-13C.

As with the arrangement of FIGS. 13-13C, on the first CVH sensing element, the first and second groups of electrical contacts I, II can be disposed proximate to each other. The third and fourth groups of electrical contacts III, IV can be disposed proximate to each other. The first and second groups of electrical contacts I, II can be disposed one hundred eighty degrees around the circle from the third and fourth groups of electrical contacts III, IV.

Similarly, in some embodiments, on the second CVH sensing element, the fifth and sixth groups of electrical contacts V, VI can be disposed proximate to each other. The seventh and eighth groups of electrical contacts VII, VIII can be disposed proximate to each other. The fifth and sixth groups of electrical contacts V, VI can be disposed one hundred eighty degrees around the circle from the seventh and eighth groups of electrical contacts VII, VIII.

First, second, third, and fourth center electrical contacts of the first, second, third, and fourth groups of electrical contacts I, II, III, IV can be disposed in respective ninety degree relationships around the first CVH sensing element. Fifth, sixth, seventh, and eighth center electrical contacts of the fifth, sixth, seventh, and eighth groups of electrical V, VI, VII, and VIII can be disposed in respective ninety degree relationships around the second CVH sensing element.

Regarding the first, second, third, and fourth groups of electrical contacts I, II, III, IV, a first differential signal, responsive to an external magnetic field, can be generated between electrical contacts labeled + and −. Regarding the fifth, sixth, seventh, and eighth groups of electrical contacts V, VI, VII, VIII, a second differential signal, responsive to an external magnetic field, can be generated between electrical contacts labeled + and −. The two differential signals can be combined in series or in parallel, depending upon the application, resulting in one combined differential signal.

Regarding the first, second, third, and fourth groups of electrical contacts I, II, III, IV, a driving current I can be input to the CVH sensing element at an electrical contact labeled I and the current I can flow out of a corresponding electrical contact terminating with a ground symbol. Regarding the fifth, sixth, seventh, and eighth groups of electrical contacts V, VI, VII, VIII, another driving current I can be input to the CVH sensing element at an electrical contact labeled I and the current I can flow out of a corresponding electrical contacts terminating with a ground symbol.

Four phases like the arrangement shown can provide current spinning. Using the phases of FIGS. 13-13C:
phase A: 0 and 90 phases of FIGS. 13-13C as shown
phase B: 90 and 180 phases
phase C: 180 and 270 phases
phase D: 270 and 0 phase In some embodiments, the eight selected groups of electrical contacts I, II, III, IV, V, VI, VII, VIII are selected by the sequence switches circuit 304 and by the current switches circuit 306. During a current spinning operation, couplings to the eight selected groups contacts I, II, III, IV, V, VI, VII, VIII are changed sequentially to achieve the above four current spinning phases, A, B, C, D, in any phase sequence. Thereafter, a different eight groups of electrical contacts can be selected and the four current spinning phases can be sequentially chosen for each selected four groups of electrical contacts.

In other embodiments, current spinning is not used and any one of the phases A, B, C, or D can remain static as different four groups of electrical contacts are selected.

Current spinning can provide lower average offset voltage than only one selected phase, even though each phase already has a high degree of electrical symmetry and an associated low offset voltage.

Referring now to FIG. 26, a coupling arrangement of two CVH sensing elements can include a first and second CVH sensing elements having phases 0 and 90, respectively, of FIGS. 16-16C.

A coupling arrangement of a first CVH sensing element can include a first five groups of electrical contacts I, II, III, IV, V. A coupling arrangement of a second CVH sensing element can include another five groups of electrical contacts Ia, IIa, IIIa, IVa, Va. Each coupling of three electrical contacts comprising a respective two outer contacts and a respective two center contacts, resulting in first, second, third, fourth, fifth, sixth, seventh, and eighth center contacts. This arrangement is like two of the arrangements of FIG. 9 above, but with a plurality of three contact vertical Hall elements in parallel, and here disposed in two separate independent circles (e.g., separate CVH elements). This arrangement is also like two of the phases, here 0 and 90 degrees, of the arrangements of FIGS. 16-16C.

Four phases like the arrangement shown can provide current spinning. Using the phases of FIGS. 16-16C:
phase A: 0 and 90 phases of FIGS. 16-16C as shown
phase B: 90 and 180 phases
phase C: 180 and 270 phases
phase D: 270 and 0 phase In some embodiments, the ten selected groups of electrical contacts I, II, III, IV, V, Ia, IIa, IIIa, IVa, Va are selected by the sequence switches circuit 304 and by the current switches circuit 306. During a current spinning operation, couplings to the ten selected groups of contacts I, II, III, IV, V, Ia, IIa, IIIa, IVa, Va are changed sequentially to achieve the above four current spinning phases, A, B, C, D, in any phase sequence. Thereafter, a different ten groups of electrical contacts can be selected and the four current spinning phases can be sequentially chosen for each selected four groups of electrical contacts.

In other embodiments, current spinning is not used and any one of the phases A, B, C, or D can remain static as different four groups of electrical contacts are selected.

Current spinning can provide lower average offset voltage than only one selected phase, even though each phase already has a high degree of electrical symmetry and an associated low offset voltage.

In FIGS. 24-26, groups of electrical contacts are equally spaced between first and second CVH sensing elements (or circular arrangements of separate vertical hall elements as in FIG. 1A). In other embodiments, the spit is not equal. In still other embodiments, more CVH sensing elements can provide the two phases indicated or more than the two phases indicated. In some embodiments, four CVH sensing elements provide all four of the phases 0, 90, 180, 270.

CVH sensing elements are describe in conjunction with figures above. In embodiments, the CVH sensing elements can be replaced with separate vertical Hall elements as in FIG. 1A.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims. Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:
1. A magnetic field sensor, comprising:
a semiconductor substrate;
a plurality of electrical contacts arranged upon a circle over the semiconductor substrate,
a sequence switches circuit electrically coupled to the plurality of electrical contacts and disposed over the semiconductor substrate; and
a current switches circuit electrically coupled to the plurality of electrical contacts and disposed over the semiconductor substrate, wherein the sequence switches circuit and/or the current switches circuit are operable to select a first group of electrical contacts and a second group of electrical contacts, the selected first and second groups of electrical contacts each having three and only three proximate electrical contacts, respectively, wherein the three proximate electrical contacts of the first and second groups of electrical contacts each have respective outer electrical contacts and a respective center electrical contact between the outer electrical contacts resulting in first and second center electrical contacts, wherein the first and second center electrical contacts are within a first quadrant of the circle, wherein the sequence switches circuit or the current switches circuit is operable to couple one of the outer electrical contact of the first group of electrical contacts to one and only one of the outer electrical contacts of the second group of electrical contacts, resulting in a first coupled pair of outer electrical contacts, wherein the first and second groups of electrical contacts are disposed proximate to each other around the circle so that no other electrical contacts than the first and second groups of electrical contacts are disposed around the circle between the first and second groups of electrical contacts.

2. The magnetic field sensor of claim 1, wherein the plurality of electrical contacts is arranged over a common circular implant and diffusion region in the semiconductor substrate with no electrical boundaries between the plurality of electrical contacts, therefore forming a circular vertical Hall sensing element.

3. The magnetic field sensor of claim 1, wherein:
at a first time, in a first phase arrangement, the first center electrical contact of the first group of electrical contacts generates a first part of a differential signal and the second center electrical contact of the second group of electrical contacts generates a second part of the differential signal.

4. The magnetic field sensor of claim 3, wherein, at fifth, sixth, seventh, and eighth times different from each other and different from the first, second, third, and fourth times, the sequence switches circuit and the current switches circuit select other ones of the plurality of electrical contacts to select other contacts for the first, second, third, and fourth groups of electrical contacts.

5. A magnetic field sensor, comprising:
a semiconductor substrate;
a plurality of electrical contacts arranged upon a circle over the semiconductor substrate,
a sequence switches circuit electrically coupled to the plurality of electrical contacts and disposed over the semiconductor substrate; and
a current switches circuit electrically coupled to the plurality of electrical contacts and disposed over the semiconductor substrate,
wherein the sequence switches circuit and/or the current switches circuit are operable to select a first group of electrical contacts and a second group of electrical contacts, the selected first and second groups of electrical contacts each having three and only three proximate electrical contacts, respectively, wherein the three proximate electrical contacts of the first and second groups of electrical contacts each have respective outer electrical contacts and a respective center electrical contact between the outer electrical contacts resulting in first and second center electrical contacts, wherein the first and second center electrical contacts are within a first quadrant of the circle, wherein the sequence switches circuit or the current switches circuit is operable to couple one of the outer electrical contact of the first group of electrical contacts to one and only one of the outer electrical contacts of the second group of electrical contacts, resulting in a first coupled pair of outer electrical contacts, wherein the sequence switches circuit is operable to select the first center electrical contact of the first group of electrical contacts, wherein the current switches circuit is operable to select the second center electrical contact of the second group of electrical contacts, wherein the first center electrical contact is operable to generate a first part of a differential signal responsive to an external magnetic field, and wherein the second center electrical contact is coupled to a current signal.

6. The magnetic field sensor of claim 5, wherein the first and second groups of electrical contacts are disposed proximate to each other around the circle.

7. The magnetic field sensor of claim 6, wherein the plurality of electrical contacts is arranged over a common circular implant and diffusion region in the semiconductor substrate with no electrical boundaries between the plurality of electrical contacts, therefore forming a circular vertical Hall sensing element.

8. The magnetic field sensor of claim 6, wherein:
at a first time, in a first phase arrangement, the first center electrical contact of the first group of electrical contacts generates a first part of a differential signal and the second center electrical contact of the second group of electrical contacts generates a second part of the differential signal.

9. The magnetic field sensor of claim 8, wherein, at fifth, sixth, seventh, and eighth times different from each other and different from the first, second, third, and fourth times, the sequence switches circuit and the current switches circuit select other ones of the plurality of electrical contacts to select other contacts for the first, second, third, and fourth groups of electrical contacts.

10. A magnetic field sensor, comprising:
a semiconductor substrate;
a plurality of electrical contacts arranged upon a circle over the semiconductor substrate,
a sequence switches circuit electrically coupled to the plurality of electrical contacts and disposed over the semiconductor substrate; and
a current switches circuit electrically coupled to the plurality of electrical contacts and disposed over the semiconductor substrate,
wherein the sequence switches circuit and/or the current switches circuit are operable to select a first group of electrical contacts and a second group of electrical contacts, the selected first and second groups of electrical contacts each having three and only three proximate electrical contacts, respectively, wherein the three proximate electrical contacts of the first and second groups of electrical contacts each have respective outer electrical contacts and a respective center electrical contact between the outer electrical contacts resulting in first and second center electrical contacts, wherein the first and second center electrical contacts are within a first quadrant of the circle, wherein the sequence switches circuit or the current switches circuit is operable to couple one of the outer electrical contact of the first group of electrical contacts to one and only one of the outer electrical contacts of the second group of electrical contacts, resulting in a first coupled pair of outer electrical contacts, wherein the sequence switches circuit and/or the current switches circuit are further operable to select third and fourth groups of electrical contacts, wherein the selected third and fourth groups of electrical contacts each have three and only three proximate electrical contacts, respectively, the three proximate electrical contacts of the third and fourth groups of electrical contacts having respective outer electrical contacts and a respective center electrical contact between the outer electrical contacts resulting in third and fourth center electrical contacts, wherein the sequence switches circuit and/or the current switches circuit is operable to couple one of the outer electrical contact of the third group of electrical contacts to one and only one of the outer electrical contacts of the fourth group of electrical contacts, operable to couple another one of the electrical contacts of the first group of electrical contacts to another one of the one and only one of the outer contacts of the fourth group of electrical contacts, and operable to couple another one of the outer electrical contacts of the second group of electrical contact to another one of the one and only one of the outer electrical contacts of the third group of electrical contacts, resulting in a second, third, and fourth coupled pairs of outer electrical contacts.

11. The magnetic field sensor of claim 10, wherein a differential signal responsive to an external magnetic field is generated between a selected two of the center electrical contacts of the first, second, third, or fourth groups of electrical contacts, and wherein a current signal is coupled between a different selected two of the center electrical contacts of the first, second, third, or fourth groups of electrical contacts.

12. The magnetic field sensor of claim 10, wherein the first and second groups of electrical contacts are disposed proximate to each other, and wherein the third and fourth groups of electrical contacts are disposed proximate to each other, wherein the first and second groups of electrical contacts are disposed one hundred eighty degrees around the circle from the third and fourth groups of electrical contacts.

13. The magnetic field sensor of claim 10, wherein the plurality of electrical contacts is arranged over a common circular implant and diffusion region in the semiconductor substrate with no electrical boundaries between the plurality of electrical contacts, therefore forming a circular vertical Hall sensing element.

14. The magnetic field sensor of claim 10, wherein:
at a first time, in a first phase arrangement, the first center electrical contact of the first group of electrical contacts is coupled to the current signal from the current switches circuit, the second center electrical contact of the second group of electrical contacts generates a first part of a differential signal, the third center electrical contact of the third group of electrical contacts is coupled to a reference voltage, and the fourth center electrical contact of the fourth group of electrical contacts generates a second part of the differential signal.

15. The magnetic field sensor of claim 14, wherein at second, third and fourth times, each different than the first time and different from each other, electrical connections to and signals generated by the first, second, third, and fourth center electrical contacts of the first, second, third and fourth groups of electrical contacts change in respective second, third and fourth phase arrangements.

16. The magnetic field sensor of claim 15, wherein, at fifth, sixth, seventh, and eighth times different from each other and different from the first, second, third, and fourth times, the sequence switches circuit and the current switches circuit select other ones of the plurality of electrical contacts for the first, second, third, and fourth groups of electrical contacts.

17. The magnetic field sensor of claim 10, wherein the first, second, third, and fourth groups of electrical contacts are disposed proximate to each other.

18. The magnetic field sensor of claim 17, wherein the plurality of electrical contacts is arranged over a common circular implant and diffusion region in the semiconductor substrate with no electrical boundaries between the plurality of electrical contacts, therefore forming a circular vertical Hall sensing element.

19. The magnetic field sensor of claim 17, wherein:
at a first time, in a first phase arrangement, the first center electrical contact of the first group of electrical contacts is coupled to receive the current from the current switches circuit, the second center electrical contact of the second group of electrical contacts generates a first part of a differential signal responsive to an external magnetic field, the third center contact of the third group of electrical contacts is coupled a reference voltage, and the fourth center electrical contact of the fourth group of electrical contacts generates a second part of the differential signal responsive to the external magnetic field.

20. The magnetic field sensor of claim 19, wherein at second, third and fourth times, each different than the first time and different from each other, electrical connections to and signals generated by the first, second, third, and fourth center electrical contacts of the first, second, third and fourth groups of electrical contacts change in respective second, third and fourth phase arrangements.

21. The magnetic field sensor of claim 20, wherein, at fifth, sixth, seventh, and eighth times different from each other and different from the first, second, third, and fourth times, the sequence switches circuit and the current switches circuit select other ones of the plurality of electrical contacts for the first, second, third, and fourth groups of electrical contacts.

22. The magnetic field sensor of claim 10, wherein the first, second, third, and fourth center electrical contacts of the first, second, third, and fourth groups of electrical contacts are disposed in respective ninety-degree relationships around the circle.

23. The magnetic field sensor of claim 22, wherein the plurality of electrical contacts is arranged over a common circular implant and diffusion region in the semiconductor substrate with no electrical boundaries between the plurality of electrical contacts, therefore forming a circular vertical Hall sensing element.

24. The magnetic field sensor of claim 22, wherein:
at a first time, in a first phase arrangement, the first center electrical contact of the first group of electrical contacts is coupled to receive the current from the current switches circuit, the second center electrical contact of the second group of electrical contacts generates a first part of a differential signal responsive to an external magnetic field, the third center electrical contact of the third group of electrical contacts is coupled to a reference voltage, and the fourth center electrical contact of the fourth group of electrical contacts generates a second part of the differential signal responsive to the external magnetic field.

25. The magnetic field sensor of claim 24, wherein at second, third and fourth times, each different than the first time and different from each other, electrical connections to and signals generated by the first, second, third, and fourth center electrical contacts of the first, second, third and fourth groups of electrical contacts change in respective second, third and fourth phase arrangements.

26. The magnetic field sensor of claim 25, wherein, at fifth, sixth, seventh, and eighth times different from each other and different from the first, second, third, and fourth times, the sequence switches circuit and the current switches circuit select other ones of the plurality of electrical contacts for the first, second, third, and fourth groups of electrical contacts.

27. A magnetic field sensor, comprising:
a semiconductor substrate;
a plurality of electrical contacts arranged upon a circle over the semiconductor substrate,
a sequence switches circuit electrically coupled to the plurality of electrical contacts and disposed over the semiconductor substrate; and
a current switches circuit electrically coupled to the plurality of electrical contacts and disposed over the semiconductor substrate,
wherein the sequence switches circuit and/or the current switches circuit are operable to select a first, second, third, fourth, fifth, and sixth groups of electrical contacts, the first, second, third, fourth, fifth, and sixth groups of electrical contacts each having three and only three proximate electrical contacts, respectively, wherein the three proximate electrical contacts of the first, second, third, fourth, fifth, and sixth groups of electrical contacts each have respective outer electrical contacts and a respective center electrical contact between the outer electrical contacts resulting in first, second, third, fourth, fifth, and sixth center electrical contacts, wherein one outer electrical contact of each of the first, second, and third groups of electrical contacts are coupled together, and wherein another one outer electrical contact of each of the first and second groups of electrical contacts are coupled together and also to an outer electrical contact of the sixth group of electrical contacts,
wherein the first and second groups of electrical contacts are disposed proximate to each other around the circle so that no other electrical contacts than the first and second groups of electrical contacts are disposed around the circle between the first and second groups of electrical contacts.

28. The magnetic field sensor of claim 27, wherein the fourth and fifth groups of electrical contacts are proximate to each other, wherein the third and sixth center electrical contacts of the third and sixth groups of electrical contacts are disposed in a one-hundred-eighty-degree relationship to each other.

29. The magnetic field sensor of claim 27, wherein the plurality of electrical contacts is arranged over a common circular implant and diffusion region in the semiconductor substrate with no electrical boundaries between the plurality of electrical contacts, therefore forming a circular vertical Hall sensing element.

30. A magnetic field sensor, comprising:
a semiconductor substrate;
a plurality of electrical contacts arranged upon a circle over the semiconductor substrate,
a sequence switches circuit electrically coupled to the plurality of electrical contacts and disposed over the semiconductor substrate; and
a current switches circuit electrically coupled to the plurality of electrical contacts and disposed over the semiconductor substrate,
wherein the sequence switches circuit and/or the current switches circuit are operable to select a first, second, third, fourth, fifth, and sixth groups of electrical contacts, the first, second, third, fourth, fifth, and sixth groups of electrical contacts each having three and only three proximate electrical contacts, respectively, wherein the three proximate electrical contacts of the first, second, third, fourth, fifth, and sixth groups of electrical contacts each have respective outer electrical contacts and a respective center electrical contact between the outer electrical contacts resulting in first, second, third, fourth, fifth, and sixth center electrical contacts, wherein one outer electrical contact of each of the first, second, and third groups of electrical contacts are coupled together, and wherein another one outer electrical contact of each of the first and second groups of electrical contacts are coupled together and also to an outer electrical contact of the sixth group of electrical contacts,
wherein the first and second groups of electrical contacts are proximate to each other, wherein the fourth and fifth groups of electrical contacts are proximate to each other, wherein the third and sixth center electrical contacts of the third and sixth groups of electrical contacts are disposed in a one hundred eighty degree relationship to each other, wherein the first and second center electrical contacts of the first and second groups of electrical contacts are coupled to a current signal, wherein the third center electrical contact of the third group of electrical contacts generates a first part of a differential signal responsive to an external magnetic field, wherein the fourth and fifth center electrical contacts of the fourth and fifth groups of electrical contacts are coupled to a reference voltage, wherein the sixth center electrical contact of the sixth group of electrical contacts generates a second part of the differential signal responsive to the external magnetic field.

31. A magnetic field sensor, comprising:
a semiconductor substrate;
a plurality of electrical contacts arranged upon a circle over the semiconductor substrate,
a sequence switches circuit electrically coupled to the plurality of electrical contacts and disposed over the semiconductor substrate; and
a current switches circuit electrically coupled to the plurality of electrical contacts and disposed over the semiconductor substrate,
wherein the sequence switches circuit and/or the current switches circuit are operable to select a first, second, third, fourth, fifth, and sixth groups of electrical contacts, the first, second, third, fourth, fifth, and sixth groups of electrical contacts each having three and only three proximate electrical contacts, respectively, wherein the three proximate electrical contacts of the first, second, third, fourth, fifth, and sixth groups of electrical contacts each have respective outer electrical contacts and a respective center electrical contact between the outer electrical contacts resulting in first, second, third, fourth, fifth, and sixth center electrical contacts, wherein one outer electrical contact of each of the first, second, and third groups of electrical contacts are coupled together, and wherein another one outer electrical contact of each of the first and second groups of electrical contacts are coupled together and also to an outer electrical contact of the sixth group of electrical contacts, wherein the plurality of electrical contacts is arranged over a common circular implant and diffusion region in the semiconductor substrate with no electrical boundaries between the plurality of electrical contacts, therefore forming a circular vertical Hall sensing element.

32. A magnetic field sensor, comprising:

a semiconductor substrate;

a plurality of electrical contacts arranged upon a circle over the semiconductor substrate, a sequence switches circuit electrically coupled to the plurality of electrical contacts and disposed over the semiconductor substrate; and a current switches circuit electrically coupled to the plurality of electrical contacts and disposed over the semiconductor substrate, wherein the sequence switches circuit and/or the current switches circuit are operable to select a first, second, third, fourth, fifth, and sixth groups of electrical contacts, the first, second, third, fourth, fifth, and sixth groups of electrical contacts each having three and only three proximate electrical contacts, respectively, wherein the three proximate electrical contacts of the first, second, third, fourth, fifth, and sixth groups of electrical contacts each have respective outer electrical contacts and a respective center electrical contact between the outer electrical contacts resulting in first, second, third, fourth, fifth, and sixth center electrical contacts, wherein one outer electrical contact of each of the first, second, and third groups of electrical contacts are coupled together, and wherein another one outer electrical contact of each of the first and second groups of electrical contacts are coupled together and also to an outer electrical contact of the sixth group of electrical contacts, at a first time, in a first phase arrangement, the third center electrical contact of the third group of electrical contacts generates the first part of a differential signal and the sixth center electrical contact of the sixth group of electrical contacts generates the second part of the differential signal.

33. The magnetic field sensor of claim 32, wherein at second, third and fourth times, each different than the first time and different from each other, electrical connections to and signals generated by the first, second, third, and fourth center electrical contacts of the first, second, third and fourth groups of electrical contacts change in respective second, third and fourth phase arrangements.

34. The magnetic field sensor of claim 33, wherein, at fifth, sixth, seventh, and eighth times different from each other and different from the first, second, third, and fourth times, the sequence switches circuit and the current switches circuit select other ones of the plurality of electrical contacts for the first, second, third, and fourth groups of electrical contacts.

* * * * *

UNITED STATES PATENT AND TRADEMARK OFFICE
CERTIFICATE OF CORRECTION

PATENT NO. : 11,802,922 B2
APPLICATION NO. : 17/147819
DATED : October 31, 2023
INVENTOR(S) : Bruno L. Uberti et al.

It is certified that error appears in the above-identified patent and that said Letters Patent is hereby corrected as shown below:

On the Title Page

Item (57) Abstract, Line 1 delete "can be are based" and replace with --can be based--.

In the Specification

Column 2, Line 34 delete "and angle" and replace with --an angle--.

Column 3, Line 46 delete "is pictorial" and replace with --is a pictorial--.

Column 3, Line 61 delete "groups three of" and replace with --groups of three--.

Column 3, Line 65 delete "three of electrical" and replace with --three electrical--.

Column 9, Line 50 delete "and 302." and replace with --element 302.--.

Column 9, Line 65 delete "to both" and replace with --that both--.

Column 10, Line 8 delete "filter 310 coupled" and replace with --filter 310 can be coupled--.

Column 10, Line 9 delete "300a." and replace with --310a--.

Column 10, Line 34 delete "module 360" and replace with --module 316--.

Column 10, Line 39 delete "selected" and replace with --selecting--.

Column 12, Lines 11-12 delete "experience" and replace with --experienced--.

Column 12, Line 18 delete "experience" and replace with --experienced--.

Signed and Sealed this
Third Day of September, 2024

Katherine Kelly Vidal
*Director of the United States Patent and Trademark Office*

CERTIFICATE OF CORRECTION (continued)
U.S. Pat. No. 11,802,922 B2

Column 14, Line 28 delete "having" and replace with --have--.

Column 14, Line 29 delete "element" and replace with --elements--.

Column 14, Line 63 delete "element" and replace with --elements--.

Column 15, Line 45 delete "that a magnetic" and replace with --that magnetic--.

Column 15, Line 58 delete "element" and replace with --elements--.

Column 15, Line 62 delete "element" and replace with --elements--.

Column 16, Line 48 delete "6 the" and replace with --6 of the--.

Column 18, Line 5 delete "comparable the" and replace with --comparable to the--.

Column 18, Line 19 delete "602, 604" and replace with --902, 904--.

Column 20, Line 1 delete "substantially the same" and replace with --substantially same--.

Column 22, Line 21 delete "eight" and replace with --eighty--.

Column 22, Line 40 delete ", are shown" and replace with --, two groups of electrical contacts 1, 11, are--.

Column 24, Line 16 delete "112," and replace with --1/2,--.

Column 25, Line 36 delete "groups contacts" and replace with --groups of electrical contacts--.

Column 26, Line 9 delete "V1, V1, V11," and replace with --V1, V11,--.

Column 26, Line 42 delete "in on" and replace with --in a--.

Column 27, Line 42 delete "112," and replace with --1/2,--.

Column 31, Line 4 delete "electrical V," and replace with --electrical contacts V,--.

Column 32, Line 30 delete "spit" and replace with --split--.

Column 32, Line 35 delete "describe" and replace with --described--.

In the Claims

Column 36, Line 28 delete "coupled a" and replace with --coupled to a--.